US012628690B2

(12) United States Patent
Kuesel et al.

(10) Patent No.: US 12,628,690 B2
(45) Date of Patent: May 12, 2026

(54) LAYOUTS OF DATA PADS ON A SEMICONDUCTOR DIE

(71) Applicant: Micron Technology, Inc., Boise, ID (US)

(72) Inventors: Andreas Kuesel, Munich (DE); Takamasa Suzuki, Tokyo (JP); Jens Polney, Munich (DE); Seiji Narui, Kanagawa (JP); Shiro Uchiyama, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 660 days.

(21) Appl. No.: 17/823,638

(22) Filed: Aug. 31, 2022

(65) Prior Publication Data

US 2023/0215828 A1     Jul. 6, 2023

Related U.S. Application Data

(63) Continuation-in-part of application No. 17/646,565, filed on Dec. 30, 2021, now Pat. No. 12,255,198.

(51) Int. Cl.
| | |
|---|---|
| *H01L 23/00* | (2006.01) |
| *H01L 25/00* | (2006.01) |
| *H01L 25/065* | (2023.01) |

(52) U.S. Cl.
CPC .............. *H01L 24/09* (2013.01); *H01L 24/08* (2013.01); *H01L 24/16* (2013.01); *H01L 25/0657* (2013.01); *H01L 25/50* (2013.01); *H01L 2224/08056* (2013.01); *H01L 2224/09133* (2013.01); *H01L 2224/09153* (2013.01); *H01L 2224/09179* (2013.01); *H01L 2224/09515* (2013.01); *H01L 2224/16145*

(2013.01); *H01L 2225/06513* (2013.01); *H01L 2225/06544* (2013.01); *H01L 2225/06562* (2013.01); *H01L 2225/06565* (2013.01); *H01L 2225/06593* (2013.01); *H01L 2924/1431* (2013.01);

(Continued)

(58) Field of Classification Search
CPC ....... G06F 30/392; H01L 23/66; H01L 24/08; H01L 24/09; H01L 24/16; H01L 5/0657; H01L 5/50
USPC .......................................................... 257/773
See application file for complete search history.

(56) References Cited

U.S. PATENT DOCUMENTS

| | | |
|---|---|---|
| 8,981,808 B2 | 3/2015 | Nishioka |
| 12,255,198 B2 | 3/2025 | Suzuki |

(Continued)

FOREIGN PATENT DOCUMENTS

| | | |
|---|---|---|
| CN | 113257293 A | 8/2021 |

*Primary Examiner* — Fazli Erdem
(74) *Attorney, Agent, or Firm* — TraskBritt

(57) ABSTRACT

Layouts for data pads on a semiconductor die are disclosed. An apparatus may include circuits, a first edge, a second edge perpendicular to the first edge, a third edge opposite the first edge, and a fourth edge opposite the second edge. The apparatus may also include data pads variously electrically coupled to the circuits. The data pads may include a data pad positioned a first distance from the first edge and a second distance from the second edge. The apparatus may also include dummy data pads electrically isolated from the circuits. The dummy data pads may include a dummy data pad positioned substantially the first distance from the first edge and substantially the second distance from the fourth edge. Associated systems and methods are also disclosed.

15 Claims, 22 Drawing Sheets

(52) U.S. Cl.

CPC ................. *H01L 2924/1434* (2013.01); *H01L 2924/30105* (2013.01)

(56) References Cited

U.S. PATENT DOCUMENTS

| | | |
|---|---|---|
| 2010/0271071 A1 | 10/2010 | Bartley et al. |
| 2011/0037158 A1 | 2/2011 | Youn et al. |
| 2016/0064357 A1* | 3/2016 | Choe ........................ H01L 24/06 |
| | | 438/109 |
| 2021/0066247 A1 | 3/2021 | Fujisawa et al. |

\* cited by examiner

Figure 11:
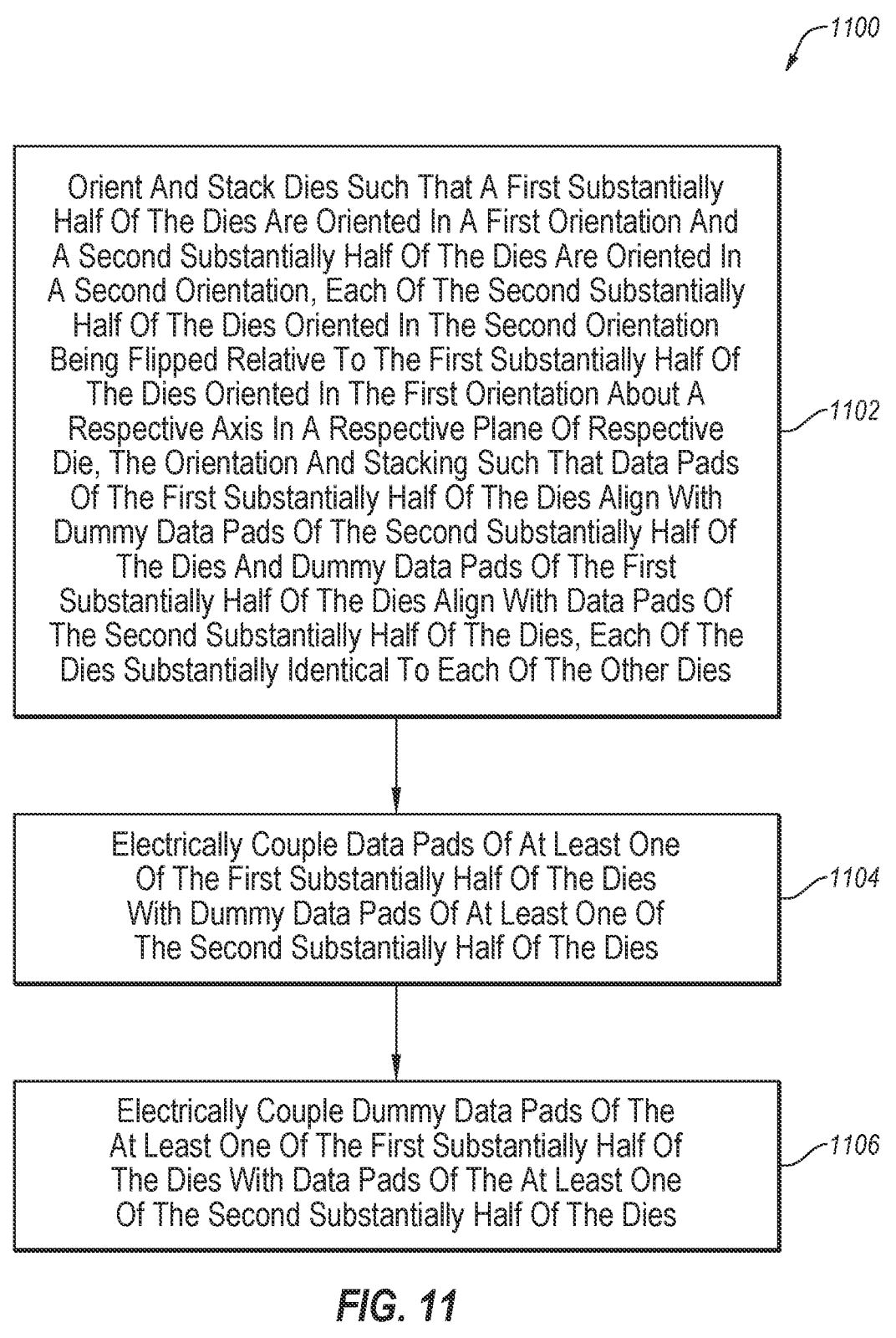

_1100

Orient And Stack Dies Such That A First Substantially Half Of The Dies Are Oriented In A First Orientation And A Second Substantially Half Of The Dies Are Oriented In A Second Orientation, Each Of The Second Substantially Half Of The Dies Oriented In The Second Orientation Being Flipped Relative To The First Substantially Half Of The Dies Oriented In The First Orientation About A Respective Axis In A Respective Plane Of Respective Die, The Orientation And Stacking Such That Data Pads Of The First Substantially Half Of The Dies Align With Dummy Data Pads Of The Second Substantially Half Of The Dies And Dummy Data Pads Of The First Substantially Half Of The Dies Align With Data Pads Of The Second Substantially Half Of The Dies, Each Of The Dies Substantially Identical To Each Of The Other Dies

_1102

Electrically Couple Data Pads Of At Least One Of The First Substantially Half Of The Dies With Dummy Data Pads Of At Least One Of The Second Substantially Half Of The Dies

_1104

Electrically Couple Dummy Data Pads Of The At Least One Of The First Substantially Half Of The Dies With Data Pads Of The At Least One Of The Second Substantially Half Of The Dies

Figure 12:
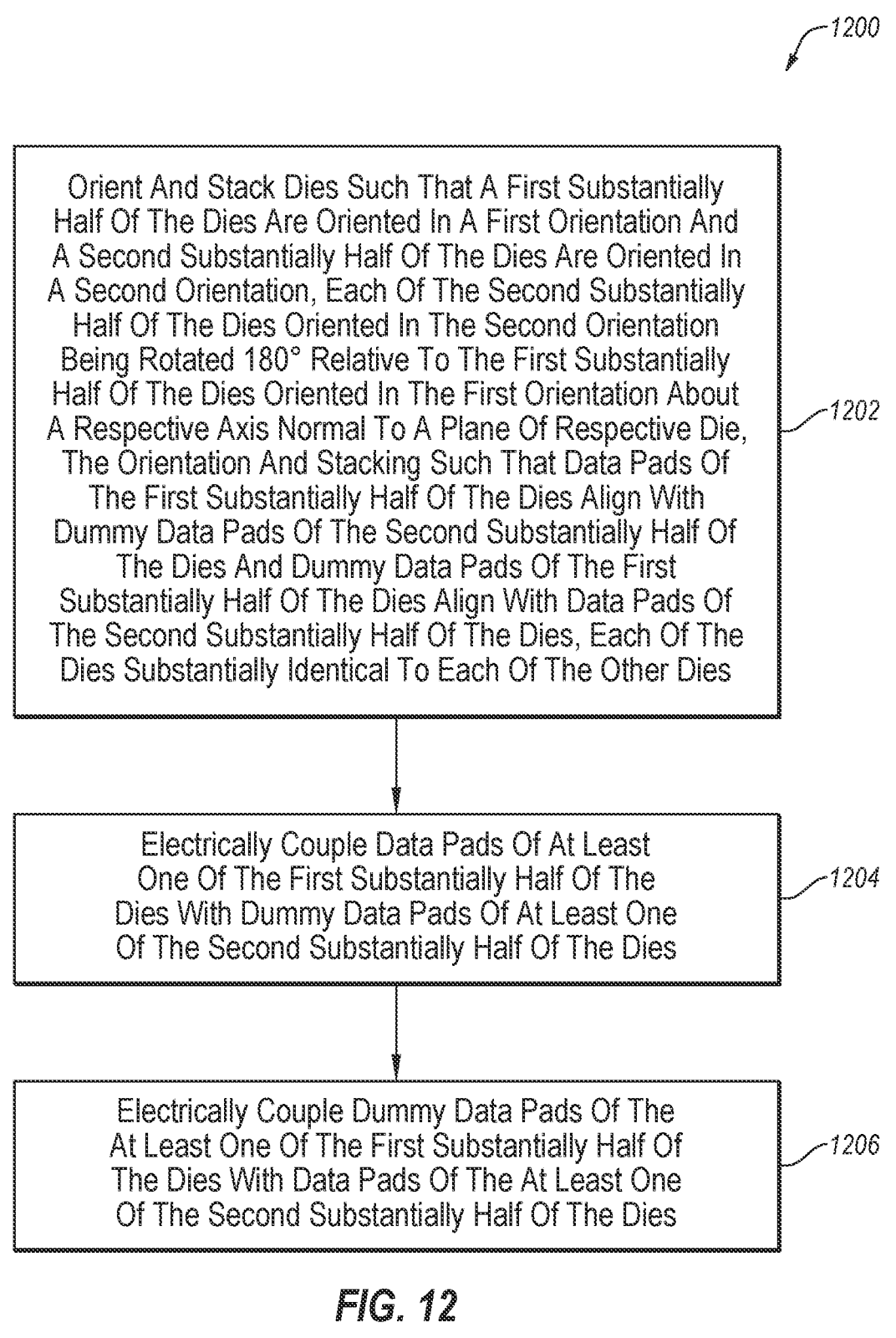

Orient And Stack Dies Such That A First Substantially Half Of The Dies Are Oriented In A First Orientation And A Second Substantially Half Of The Dies Are Oriented In A Second Orientation, Each Of The Second Substantially Half Of The Dies Oriented In The Second Orientation Being Rotated 180° Relative To The First Substantially Half Of The Dies Oriented In The First Orientation About A Respective Axis Normal To A Plane Of Respective Die, The Orientation And Stacking Such That Data Pads Of The First Substantially Half Of The Dies Align With Dummy Data Pads Of The Second Substantially Half Of The Dies And Dummy Data Pads Of The First Substantially Half Of The Dies Align With Data Pads Of The Second Substantially Half Of The Dies, Each Of The Dies Substantially Identical To Each Of The Other Dies

1202

Electrically Couple Data Pads Of At Least One Of The First Substantially Half Of The Dies With Dummy Data Pads Of At Least One Of The Second Substantially Half Of The Dies

1204

Electrically Couple Dummy Data Pads Of The At Least One Of The First Substantially Half Of The Dies With Data Pads Of The At Least One Of The Second Substantially Half Of The Dies

Figure 13:
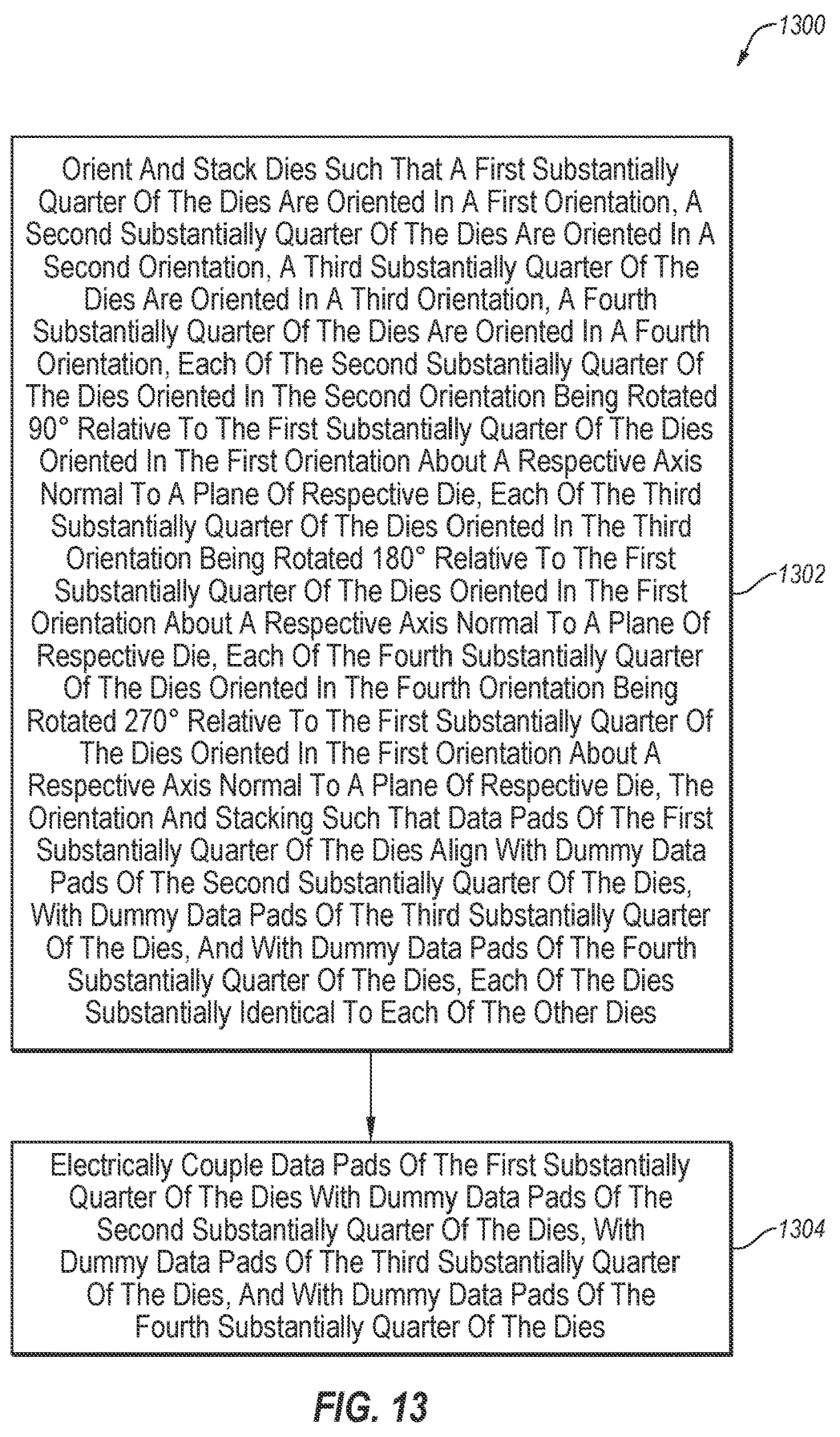

Orient And Stack Dies Such That A First Substantially Quarter Of The Dies Are Oriented In A First Orientation, A Second Substantially Quarter Of The Dies Are Oriented In A Second Orientation, A Third Substantially Quarter Of The Dies Are Oriented In A Third Orientation, A Fourth Substantially Quarter Of The Dies Are Oriented In A Fourth Orientation, Each Of The Second Substantially Quarter Of The Dies Oriented In The Second Orientation Being Rotated 90° Relative To The First Substantially Quarter Of The Dies Oriented In The First Orientation About A Respective Axis Normal To A Plane Of Respective Die, Each Of The Third Substantially Quarter Of The Dies Oriented In The Third Orientation Being Rotated 180° Relative To The First Substantially Quarter Of The Dies Oriented In The First Orientation About A Respective Axis Normal To A Plane Of Respective Die, Each Of The Fourth Substantially Quarter Of The Dies Oriented In The Fourth Orientation Being Rotated 270° Relative To The First Substantially Quarter Of The Dies Oriented In The First Orientation About A Respective Axis Normal To A Plane Of Respective Die, The Orientation And Stacking Such That Data Pads Of The First Substantially Quarter Of The Dies Align With Dummy Data Pads Of The Second Substantially Quarter Of The Dies, With Dummy Data Pads Of The Third Substantially Quarter Of The Dies, And With Dummy Data Pads Of The Fourth Substantially Quarter Of The Dies, Each Of The Dies Substantially Identical To Each Of The Other Dies

1302

Electrically Couple Data Pads Of The First Substantially Quarter Of The Dies With Dummy Data Pads Of The Second Substantially Quarter Of The Dies, With Dummy Data Pads Of The Third Substantially Quarter Of The Dies, And With Dummy Data Pads Of The Fourth Substantially Quarter Of The Dies

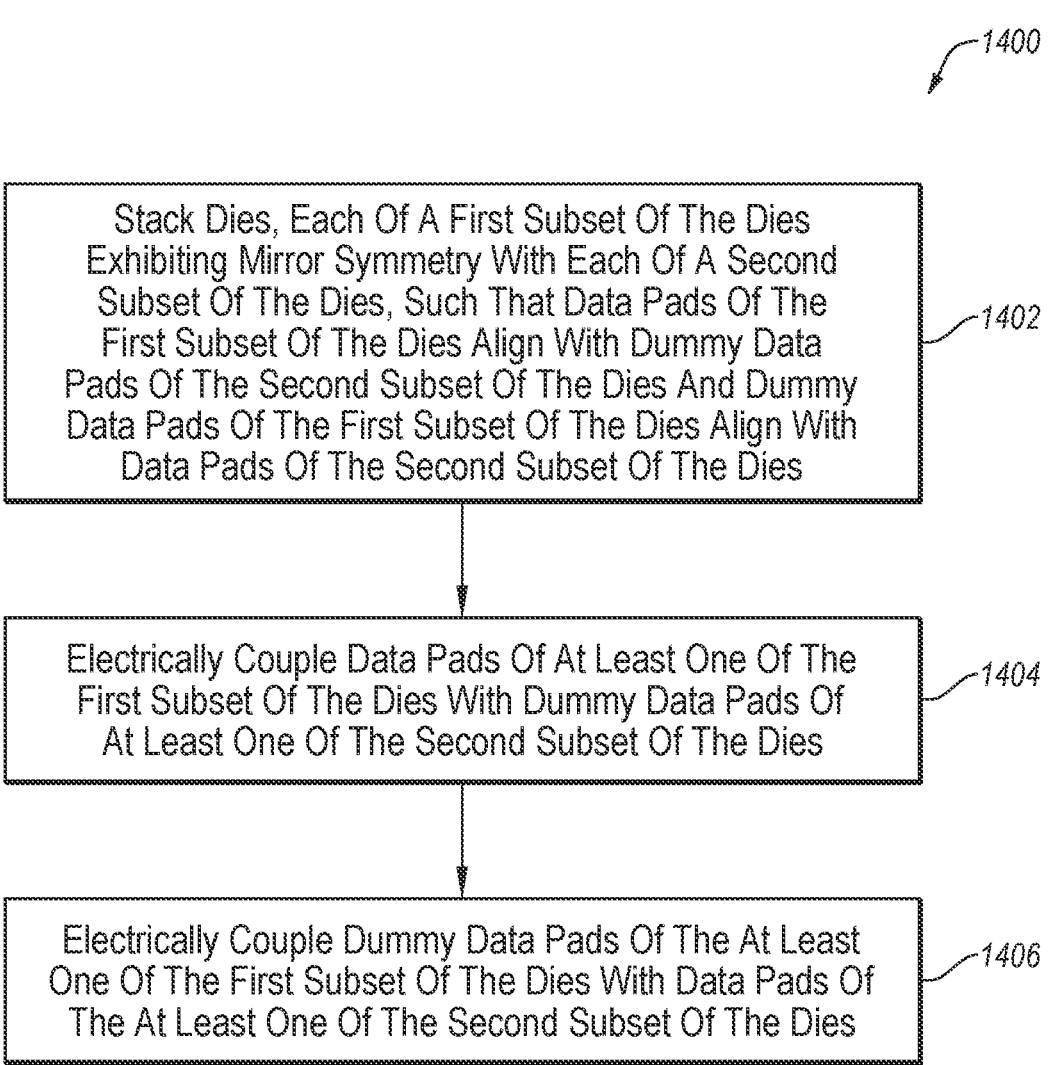

1400

Stack Dies, Each Of A First Subset Of The Dies Exhibiting Mirror Symmetry With Each Of A Second Subset Of The Dies, Such That Data Pads Of The First Subset Of The Dies Align With Dummy Data Pads Of The Second Subset Of The Dies And Dummy Data Pads Of The First Subset Of The Dies Align With Data Pads Of The Second Subset Of The Dies

1402

Electrically Couple Data Pads Of At Least One Of The First Subset Of The Dies With Dummy Data Pads Of At Least One Of The Second Subset Of The Dies

1404

Electrically Couple Dummy Data Pads Of The At Least One Of The First Subset Of The Dies With Data Pads Of The At Least One Of The Second Subset Of The Dies

Orient And Stack Dies Such That:
A First Substantially Half Of The Dies Are Oriented In
A First Orientation AndA Second Substantially Half
Of The Dies Are Oriented In A Second Orientation

1502

Electrically Couple Data Pads Of At Least One Of The First
Substantially Half Of The Dies With Dummy Data Pads Of
At Least One Of The Second Substantially Half Of The Dies

1504

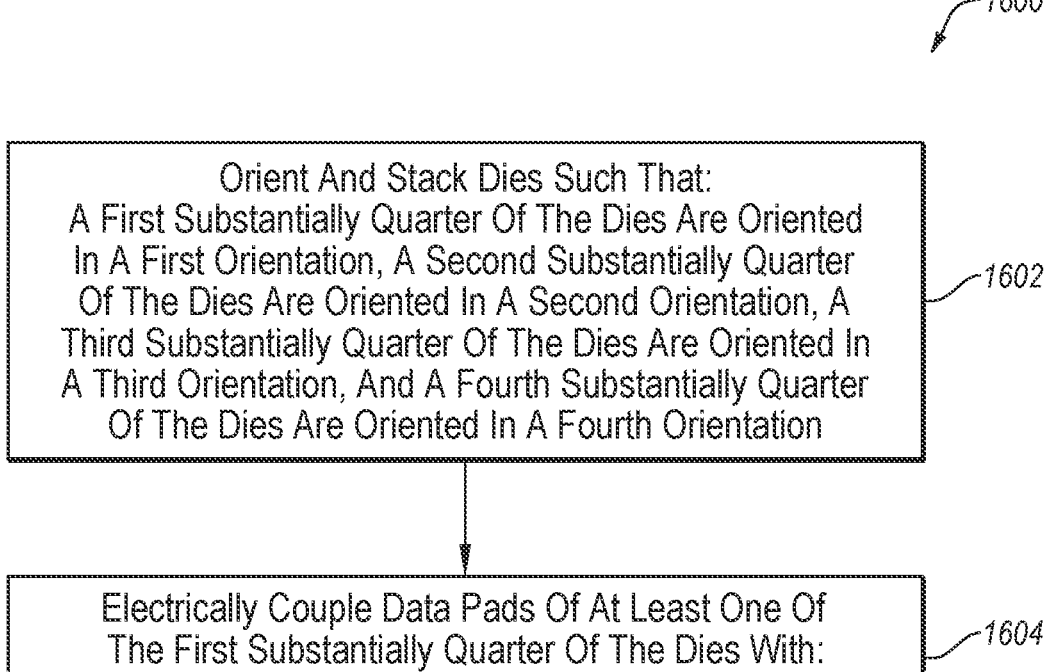

1600

Orient And Stack Dies Such That:
A First Substantially Quarter Of The Dies Are Oriented
In A First Orientation, A Second Substantially Quarter
Of The Dies Are Oriented In A Second Orientation, A
Third Substantially Quarter Of The Dies Are Oriented In
A Third Orientation, And A Fourth Substantially Quarter
Of The Dies Are Oriented In A Fourth Orientation

1602

Electrically Couple Data Pads Of At Least One Of
The First Substantially Quarter Of The Dies With:
Dummy Data Pads Of At Least One Of The Second
Substantially Quarter Of The Dies; Dummy Data Pads
Of At Least One Of The Third Substantially Quarter
Of The Dies; And Dummy Data Pads Of At Least One
Of The Fourth Substantially Quarter Of The Dies

LAYOUTS OF DATA PADS ON A SEMICONDUCTOR DIE

CROSS-REFERENCE TO RELATED APPLICATIONS

This application is a continuation-in-part of U.S. patent application Ser. No. 17/646,565, filed Dec. 30, 2021. U.S. Patent Application Ser. No. 17/823,638 is being filed on even date herewith, the disclosure of each of which is hereby incorporated herein in its entirety by this reference.

TECHNICAL FIELD

Embodiments of the disclosure relate to semiconductor-die layouts, and more specifically to layouts of data pads on a semiconductor die. Yet more specifically, various embodiments relate to layouts of data pads, dummy data pads, and common data pads on a die to allow for stacking of a number of dies. Other embodiments related to stacks of dies and methods of stacking dies. Additionally, embodiments include related methods, devices, and systems.

BACKGROUND

Memory devices are typically provided as semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data-rate memory (DDR), low-power double-data-rate memory (LPDDR), phase-change memory (PCM), high-bandwidth memory (HBM) and Flash memory.

Some memory devices include two or more dies (also commonly referred to as "dice") stacked one above another. In the present disclosure, the terms "die" and "dies" may refer to a semiconducting material on and/or in which one or more circuits (including, e.g., memory arrays) are or may be fabricated.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 11 is a flowchart illustrating an example method in accordance with at least one embodiment of the disclosure.

FIG. 12 is a flowchart illustrating another example method in accordance with at least one embodiment of the disclosure.

FIG. 13 is a flowchart illustrating yet another example method in accordance with at least one embodiment of the disclosure.

FIG. 14 is a flowchart illustrating yet another example method in accordance with at least one embodiment of the disclosure.

FIG. 16 is a flowchart illustrating yet another example method in accordance with at least one embodiment of the disclosure.

DETAILED DESCRIPTION

Figure 1:
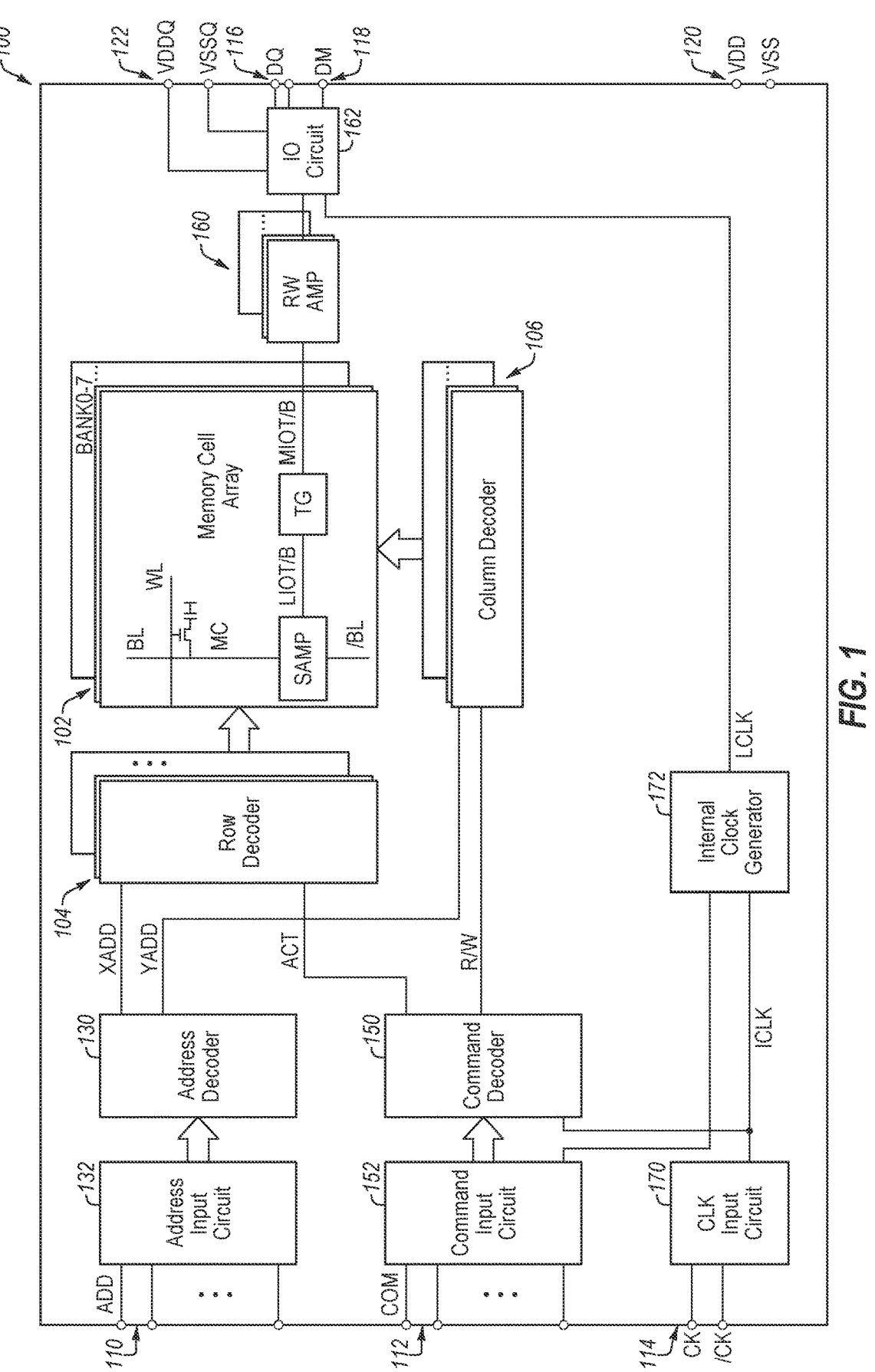
FIG. 1 is a functional block diagram illustrating an example memory device, in accordance with at least one embodiment of the disclosure.

In the detailed description of the present disclosure, section headings are included for descriptive purposes. The section headings are not limiting. Concepts discussed under one section heading may apply under other section headings. Some concepts that apply under multiple section headings has not been repeated under multiple section headings.

Some devices and/or systems, e.g., memory devices and/or memory systems, may include two or more dies one stacked above another. A device may provide one or more independent communication channels for each of the dies. For example, a memory device may include two or more dies with one or more memory arrays on each of the dies. To enable the various memory arrays to be used independently (e.g., to enable each of the memory arrays to store and retrieve data independent of the other memory arrays), the memory device may include one or more independent data channels for each of the memory arrays. The data channels may allow data to be written to and to be read from the memory arrays. Data channels may traverse, among other things, inter-die connections, data pads, and dummy data pads. In the present disclosure the terms "data pad" and "dummy data pad" each refer to a node for electrical connection that is present on both a front side and a back side of a die. Data pads and dummy data pads may include upper metal-layer pads, silicon-bulk-side pads, and through-silicon vias. The through-silicon vias may electrically couple the upper metal-layer data pads to the silicon-bulk-side pads.

A data pad may be configured for a particular data channel or common data channel based on which circuits of the die the data pad is electrically coupled to on the die. For example, a data pad electrically coupled to an input/output circuit of a memory array may be a data pad for a data channel. Another data pad electrically coupled to an address input circuit of a memory array may be a data pad for receiving address information.

On the other hand, a dummy data pad may be defined by its lack of electrical coupling to circuits on the die. For example, in some embodiments, dummy data pads of a die may be electrically isolated from circuits on the die. Thus, an inter-die connection may electrically couple to a dummy data pad of a first die and to a data pad of a second die without electrical signaling on the first die interfering with a signal carried to, or from, the data pad of the second die.

Some embodiments of the present disclosure include a layout (e.g., an arrangement) of data pads and dummy data pads for a die that allow substantially identical copies of the die to be stacked while providing independent data channels for memory arrays on the dies.

Flipping

For example, a first die may include a first data pad in its top left corner and a first dummy data pad in its top right corner. (In the present disclosure, the term "top" may refer to a portion of a die, when the die is viewed in plan view, e.g., a top portion or top edge of a die. Likewise, the term "bottom" may refer to a portion of a die when the die is viewed in plan view, e.g., a portion opposite the top. In the present disclosure, the term "top" may alternatively refer to a portion of a stack of dies, e.g., a top half or top quarter of a stack of dies. Likewise, the term "bottom" may alternatively refer to a portion of a stack of dies, e.g., a portion opposite the top.) The first data pad may be electrically coupled to a first circuit of the first die and the first dummy data pad may not be electrically coupled to the first circuit (in some embodiments, the first dummy data pad may be electrically isolated). A second die, which is a substantially identical copy of the first die, may include a second data pad in its top left corner and a second dummy data pad in its top right corner. The second data pad may be electrically coupled to a second circuit of the second die and the second dummy data pad may not be electrically coupled to the second circuit (in some embodiments, the second dummy data pad may be electrically isolated). The second die may be flipped substantially 180° about an axis in a plane of the second die (e.g., an axis between the left edge and the right edge of the second die, the axis may be parallel to one or both of the right edge and the left edge) and stacked above the first die.

In the present disclosure, the terms "flip," "flipped," "flipping," and like terms, with reference to a die, may refer to a substantially 180° rotation of the die about an axis in a plane of the die. The axis may be parallel to one of the edges of the die. For example, prior to a flip, a first major surface of a die, may be oriented in a first direction, e.g., upward, and a second major surface of the die may be oriented in a second direction opposite the first direction, e.g., downward. After a flip, the first major surface may be oriented in the second direction, e.g., downward, and the second major surface may be oriented in the first direction, e.g., upward.

In the present disclosure, the term "identical" may be that one thing, e.g., a die, is the same, in at least one respect to another thing. For example, a first die may be identical to a second die if both die have the same layout of data pads, dummy data pads, and common data pads. Additionally, identical dies may have the same dimensions. In some cases, identical dies may be formed using the same processes.

The stacking of the second die above the first die may be such that the second dummy data pad of the second die is above the first data pad of the first die and the second data pad of the second die is above the first dummy data pad of the first die. A first inter-die connection may electrically couple a first input/output of the stack of dies (e.g., a first input/output of an accessing device) to the second dummy data pad of the second die and to the first data pad of the first die. A second inter-die connection may electrically couple a second input/output of the stack of dies to the first dummy data pad of the first die and to the second data pad of the second die. Because the second dummy data pad is not electrically coupled to the second circuit (and/or is electrically isolated relative to the second die), the first input/output may provide a first independent data channel for the first circuit (e.g., of a first memory array) of the first die. Further, because the first dummy data pad is not electrically coupled to the first circuit (and/or is electrically isolated relative to the first die), the second input/output may provide a second independent data channel for the second circuit (e.g., of a second memory array) of the second die.

The example layout described above may be expanded to include several data pads and several corresponding dummy data pads allowing for several dies to be stacked and providing an independent data channel for each memory array of each of the several dies. In some embodiments, an inter-die connection may be electrically coupled to multiple data pads of multiple dies. In such cases, addressing may be applied to individually access circuits (e.g., circuits of memory arrays) of the multiple dies. For example, four dies may be stacked in two different orientations (e.g., one of the orientations flipped substantially 180° relative to the other). Each of the four dies may include two data pads and two dummy data pads. Four inter-die connections may be electrically coupled to the data pads of the four dies. For example, at a first die (e.g., a bottom die) the inter-die connections may be electrically coupled to each of the two data pads and to the two dummy data pads. At a second die, above the first die, the inter-die connections electrically coupled to the data pads of the first die may be electrically coupled to dummy data pads of the second die and the inter-die connections electrically coupled to the dummy data pads of the first die may be electrically coupled to data pads of the second die. At a third die, above the second die, the inter-die connections electrically coupled to the data pads of the second die may be electrically coupled to dummy data pads of the third die and the inter-die connections electrically coupled to the dummy data pads of the second die may be electrically coupled to data pads of the third die. At a fourth die, above the third die, the inter-die connections electrically coupled to the data pads of the third die may be electrically coupled to dummy data pads of the fourth die and the inter-die connections electrically coupled to the dummy data pads of the third die may be electrically coupled to data pads of the fourth die.

In such an example, a device (e.g., an "accessing device"), such as a logic die, a controller, and/or a host, may be configured to provide inputs to and/or to receive outputs from one or more memory arrays of one or more of the four dies through unique inter-die connections as part of a data channel for each of the dies. For example, the accessing device may use a first inter-die connection electrically coupled to a data pad of the first die, a dummy data pad of the second die, a data pad of the third die, and a dummy data pad of the fourth die to provide inputs to and/or to receive outputs from a memory array of the first die. In addition, the accessing device may use a second inter-die connection that is also electrically coupled to a data pad of the first die, a dummy data pad of the second die, a data pad of the third die, and a dummy data pad of the fourth die to provide inputs to and/or to receive outputs from a memory array of the third die.

Flipping and Rotating

As another example, a first die may include a first data pad in its top left corner, a first dummy data pad in its top right corner, a second dummy data pad in its bottom right corner, and a third dummy data pad in its bottom left corner. In this example, three additional die, each identical to the first, may be stacked above the first die. Each of the four die may be oriented in an orientation that is unique from the orientation of others. For example a first die may be oriented in a first orientation, e.g., with the data pad of the first die in the top left corner of the first die. A second die may be flipped 180° about an axis in the plane of the second die such that the data pad of the second die is in the top right corner of the second die. The third die may be rotated 180° about a vertical axis normal to a plane of the third die such that the data pad of the third die is in the bottom right corner of the third die. The fourth die may be rotated 180° about a vertical axis normal to a plane of the fourth die and flipped 180° about an axis in the plane of the fourth die such that the data pad of the fourth die is in the bottom left corner of the fourth die. This may allow four identical die to be stacked while providing four independent data channels through four inter-die connections. The example layout suitable for substantially stacking in four orientations may be expanded using more than one data pad and more than three dummy data pads per die to allow more than four dies to be stacked while providing individual data channels in similar fashion to what was described in the previous example.

In the present disclosure, references to "rotation" of a die about a vertical axis, or "rotation" of a die about an axis normal to a plane of the die, as compared with references to "flipping," may refer to a rotation of the die about an axis normal to a plane of the die. For example, prior to a rotation, a first edge of a die, may be oriented in a first direction, e.g., to the right, and a second edge of the die may be oriented in a second direction opposite the first direction, e.g., to the left. After a 180° rotation, the first edge may be oriented in the second direction, e.g., to the left, and the second edge may be oriented in the first direction, e.g., to the right.

In the present disclosure, references to "flipping and rotating," and similar recitations, may refer to flipping a die about a first axis (e.g., an axis about which another die has been flipped) and rotating the die about a second axis normal to a plane of the die. Alternatively, references to "flipping and rotating" may refer to flipping the die about a third axis, i.e., an axis perpendicular to the first axis and the second axis. As an example, a stack of four dies may include a die that is in a default orientation. The stack may include a die that is flipped about a first axis, the first axis parallel to a short edge of the die. The die may include a die that is rotated about an axis normal to the plane of the die. And the stack may include a die that is flipped about a third axis, the third axis parallel to a long edge of the die.

Additionally, in the present disclosure, references to "rotating" by 180° and similar recitations, may refer to rotating the die by 180° about an axis normal to the plane of the die. Alternatively, references to "rotating" by 180° and similar recitations, may refer to flipping a die about two axes in the plane of the die. For example, a stack of two dies may include a die in a default orientation. The stack may include a die that is flipped about a first axis, the first axis parallel to a short edge of the die, the die may also be flipped about a second axis, the second axis parallel to a long edge of the die.

Mirroring

Some embodiments of the present disclosure include a layout (e.g., an arrangement) of data pads and dummy data pads for a die that allow mirrored-symmetric copies of the die to be stacked while providing independent data channels for memory arrays on the dies.

In the present disclosure, references to "mirrored symmetry," and like terms, may refer to symmetry about an axis. For example, a first die may include first data pads and first dummy data pads arranged a first distance from a first edge, e.g., a left edge, of the first die and a second distance from a second edge, e.g., a top edge of the first die. A second die may exhibit mirrored symmetry to the first die by including second data pads and second dummy data pads arranged the first distance from a third edge, e.g., a right edge, of the second die and the second distance from a fourth edge, e.g., a top edge, of the second die.

For example, a first die may include a first data pad in its top left corner and a first dummy data pad in its top right corner. The first data pad may be electrically coupled to a first circuit of the first die and the first dummy data pad may not be electrically coupled to the first circuit (in some embodiments, the first dummy data pad may be electrically isolated). A second die, which exhibits mirrored symmetry with respect to the first die, may include a second data pad in its top right corner and a second dummy data pad in its top left corner. The second data pad may be electrically coupled to a second circuit of the second die and the second dummy data pad may not be electrically coupled to the second circuit (in some embodiments, the second dummy data pad may be electrically isolated). The second die may be stacked above the first die such that the second dummy data pad of the second die is above the first data pad of the first die and the second data pad of the second die is above the first dummy data pad of the first die.

Production of mirror-symmetric dies may include creating a mask set including layouts for the dies and layouts for the mirror-symmetric dies. For example, after a layout of a die has been designed and/or verified, the layout may be mirrored and both the layout and the mirrored layout may be included in the same mask set. Alternatively, the layout may be included in a first mask set and the mirrored layout may be included in a second mask set.

In some cases, dies cut from a wafer may exhibit bowing. In some cases, all dies cut from a wafer may exhibit similar bowing, e.g., bowing in the same direction (e.g., upward or downward) and/or a similar degree of bowing. Stacking dies having similar bowing, some of the dies flipped by 180° relative to others of the dies may result in unequal distances between portions of dies in the stack. For example, if two die bow upward toward their respective centers, and one of the dies is flipped and stacked above the other, the centers of the dies will be either closer than the edges of the dies or farther apart (depending on the order of the stacking). In contrast, stacking dies, some of the dies exhibiting mirror symmetry with respect to the others, may result in a tighter stacking of the dies. For example, center points of the various dies may be closer together and edges of the dies may be closer together than if dissimilarly bowed dies were stacked.

Common Data Pads

Additionally or alternatively, a device may use additional data channels to provide data to all dies of a stack of dies. In the present disclosure, data channels to provide data to all dies of a stack are referred to as "common data channels." Examples of common data channels include data channels for communicating test-mode signals and reset signals. Additionally or alternatively, power and ground voltage potentials may be provided through common data channels. Likewise, inter-die connections configured to communicate through common data channels may be referred to herein as "common inter-die connections" and data pads intended to be electrically coupled to common inter-die connections may be referred to as "common data pads." A device may use several different categories of common data channels (e.g., for carrying different categories of signals) and dies of the device may include several corresponding categories of common data pads, e.g., a first category of common data pad configured for a first category of common data channel and a second common data pad configured for a second category of common data channel. The function of common data pads may depend on an orientation of the die. Additionally or alternatively, the function selection could be performed, e.g., based on die id by a mux.

Some embodiments of the present disclosure may include a layout of categories of common data pads for a die that allow substantially identical copies of the die to be flipped relative to one another and stacked. For example, a die may include a first common data pad of a first category proximate to a top left corner of the die and a second common data pad of a second category proximate to the first common data pad. The die may further include a third common data pad of the first category proximate to a top right corner of the die and a fourth common data pad of the second category proximate to the third common data pad. The position of the first common data pad relative to the top left corner may be the left-to-right reverse of the position of the third common data pad relative to the top right corner and the position of the second common data pad relative to the top left corner may be the left-to-right reverse of the position of the fourth common data pad relative to the top right corner. The relative positions of the common data pads on the die may be such that if a substantially identical copy of the die is flipped relative to the die and the substantially identical copy of the die is placed above the die, the first common data pad of the die will align with the third common data pad of the copy of the die and the second common data pad of the die will align with the fourth common data pad of the copy of the die.

Some embodiments of the present disclosure may include a layout of categories of common data pads for a die that allow mirrored symmetric copies of the die to be stacked. For example, a first die may include a first common data pad of a first category proximate to a top left corner of the die and a second common data pad of a second category proximate to the first common data pad. The first die may further include a third common data pad of the first category proximate to a top right corner of the die and a fourth common data pad of the second category proximate to the third common data pad. The position of the first common data pad relative to the top left corner may be the left-to-right reverse of the position of the third common data pad relative to the top right corner and the position of the second common data pad relative to the top left corner may be the left-to-right reverse of the position of the fourth common data pad relative to the top right corner. The relative positions of the common data pads of the first die may be such that if a second die, that exhibits mirror symmetry with respect to the first die were placed above the first die, the first common data pad of the first die will align with the third common data pad of the second die and the second common data pad of the first die will align with the fourth common data pad of the copy of the second die.

Methods and Devices

Some embodiments of the present disclosure include a method of stacking dies including flipping one or more of the dies about respective axes normal to respective planes of the respective dies. Some embodiments may, additionally or alternatively, include rotating one or more of the dies around a vertical axis that is normal to major planes of dies. Some embodiments of the present disclosure include a method of stacking dies exhibiting mirrored symmetry. Some embodiments of the present disclosure include devices including stacked dies, the stacked dies including some dies that have been flipped and/or rotated relative to other dies. Some embodiments of the present disclosure include devices including stacked dies, some of the dies exhibiting mirrored symmetry relative to others of the dies.

Ordering

Some embodiments may, additionally or alternatively, include ordering dies in the stack such that dies of a common orientation are adjacent to one another in the stack of dies. For example, in a case where some dies of a stack of dies are flipped relative to other dies of the stack, some embodiments may include ordering all the flipped dies at either a top half or a bottom half of the stack of dies and all of the unflipped dies in the other of the top half or bottom half. In other embodiments flipped and unflipped dies may alternate in the stack. Some embodiments of the present disclosure include devices including stacked dies, the stacked dies including some dies that have been flipped and/or rotated relative to other dies, the stacked dies ordered such that dies of similar orientations are stacked adjacent to one another in the stack.

Some embodiments may, additionally or alternatively, include ordering dies in the stack such that dies of a common mirror symmetry are adjacent to one another in the stack of dies. For example, in a case where a first subset of the dies are mirror symmetric to a second subset of the dies, some embodiments may include ordering all the first subset of the dies at either a top half or a bottom half of the stack of dies and all of the second subset of the dies in the other of the top half or bottom half. In other embodiments dies of the first subset and dies of the second subset may alternate in the stack. Some embodiments of the present disclosure include devices including stacked dies, the stacked dies including first dies that exhibit mirror symmetry with respect to second dies, the stacked dies ordered such that the first dies are stacked adjacent to one another in the stack.

As another example, in a case where some dies of a stack of dies are rotated (e.g., rotated 180° about an axis normal to the major plane of the respective dies, e.g., as described with regard to U.S. Utility patent application Ser. No. 17/646,565), some embodiments may include ordering all the rotated dies at either a top half or a bottom half of the stack of dies and all of the unrotated dies in the other of the top half or bottom half. In other embodiments rotated and unrotated dies may alternate in the stack.

As another example, in a case where some of the dies are flipped, some are rotated, and some are flipped and rotated, some embodiments may include stacking all of the flipped dies in one of a top quarter of the stack, a top-middle quarter of the stack, a bottom-middle quarter of the stack, or a bottom quarter of the stack. The embodiment may also include stacking all of the rotated dies in a different one of the top quarter, the top-middle quarter, the bottom-middle quarter, or the bottom quarter. The embodiment may also include stacking all of the flipped and rotated dies in a yet different one of the top quarter, the top-middle quarter, the bottom-middle quarter, or the bottom quarter. The embodiment may also include stacking all of the unflipped and unrotated dies in a yet different one of the top quarter, the top-middle quarter, the bottom-middle quarter, or the bottom quarter. In other embodiments, out of every four dies in a stack, one may be rotated, another flipped, another rotated and flipped, and another unrotated and unflipped. In some of these other embodiments, every fourth die (e.g., counting from a first die) of the stack may be flipped, every fourth die (e.g., counting from a second die) may be rotated, every fourth die (e.g., counting from a third die) may be rotated and flipped, and every fourth die (e.g., counting from a fourth die) may be unrotated and unflipped.

As another example, in a case where some dies of a stack of dies are rotated (e.g., rotated in 90° increments about an axis normal to the plane of the respective dies, e.g., as described with regard to U.S. Utility patent application Ser. No. 17/646,565), some embodiments may include stacking all of the dies rotated 90° in one of a top quarter of the stack, a top-middle quarter of the stack, a bottom-middle quarter of the stack, or a bottom quarter of the stack. The embodiment may also include stacking all of the dies rotated 180° in a different one of the top quarter, the top-middle quarter, the bottom-middle quarter, or the bottom quarter. The embodiment may also include stacking all of the dies rotated 270° in a yet different one of the top quarter, the top-middle quarter, the bottom-middle quarter, or the bottom quarter. The embodiment may also include stacking all of the dies that are unrotated (and/or rotated 360°) in a yet different one of the top quarter, the top-middle quarter, the bottom-middle quarter, or the bottom quarter. In other embodiments, out of every four dies in a stack, one may be rotated 90°, another rotated 180°, another rotated 270°, and another unrotated (or, equivalently, rotated 360°). In such other embodiments, in some cases, every fourth die (e.g., counting from a first die) of the stack may be rotated 90°, every fourth die (e.g., counting from a second die) may be rotated 180°, every fourth die (e.g., counting from a third die) may be rotated 270°, and every fourth die (e.g., counting from a fourth die) may be unrotated (or, equivalently, rotated 360°).

Some Advantages

Any of the example layouts described herein (e.g., a layout that allows for alignment of data pads and dummy data pads and/or the alignment of categories of common data pads) may allow inter-die connections to be straight (e.g., vertical) through multiple dies of the stack. Additionally, example layouts described herein may allow for the inter-die connections to be straight through an entire stack e.g., without lateral-connection portions to couple inter-die connections to other inter-die connections. Straight inter-die connections (e.g., straight through the entire stack), without lateral-connection portions, may decrease parasitic capacitance compared with other stacks of dies including lateral-connection portions. Further, a layout decreasing the number of, or not including, lateral-connection portions, may have other advantages when compared with layouts including lateral-connection portions including decreased complexity and/or decreased manufacturing time and/or cost.

Further, such layouts (e.g., a layout that allows for alignment of data pads and dummy data pads and/or the alignment of categories of common data pads) may allow multiple instances of identical, or mirror symmetric, dies to be stacked. This may allow for producing a stack of dies more simply and/or economically than producing a stack of non-identical dies.

Further, ordering of dies in the stack such that similar dies are adjacent to one another in the stack may improve timing of communications with dies in the stack and/or heat-dissipation distribution within the stack.

Further, stacking mirrored-symmetric dies may allow dies that exhibit similar bowing to be stacked adjacent to one another such that the dies may be stacked more tightly, one to one another.

Although various embodiments are described herein with reference to memory devices, the disclosure is not so limited, and the embodiments may be generally applicable to microelectronic systems and/or semiconductor devices that may or may not include memory devices. Embodiments of the disclosure will now be explained with reference to the accompanying drawings.

Turning to the Drawings

FIG. 1 is a functional block diagram illustrating an example memory device 100, in accordance with at least one embodiment of the disclosure. Memory device 100 may include, for example, a high-bandwidth memory (HBM), a DRAM (dynamic random-access memory), a SRAM (static random-access memory), a SDRAM (synchronous dynamic random-access memory), a DDR SDRAM (double-data-rate SDRAM, such as a DDR4 SDRAM and the like), a SGRAM (synchronous graphics random access memory) or a three-dimensional (3D) DRAM. Memory device 100, which may be integrated on one or more semiconductor dies, may include a memory array 102.

In the embodiment of FIG. 1, memory array 102 is illustrated as including eight memory banks BANK0-7 for descriptive purposes. More or fewer banks may be included in memory array 102 of other embodiments. Each memory bank includes a number of access lines (word lines WL), a number of data lines (bit lines BL and/BL), and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over the complementary main data lines MIOT/B, transfer gate TG, and complementary local data lines LIOT/B, and written in the memory cell MC coupled to bit line BL or/BL.

Memory device 100 may be generally configured to receive various inputs (e.g., from an external controller or host) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 160, an input/output circuit 162, and data terminals 116. Further, in response active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by row address XADD and column address YADD.

Clock signals CK and/CK may be received via clock terminals 114. A CLK Input circuit 170 may generate internal clock signals ICLK based on the clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

Figures 2A, 2B:
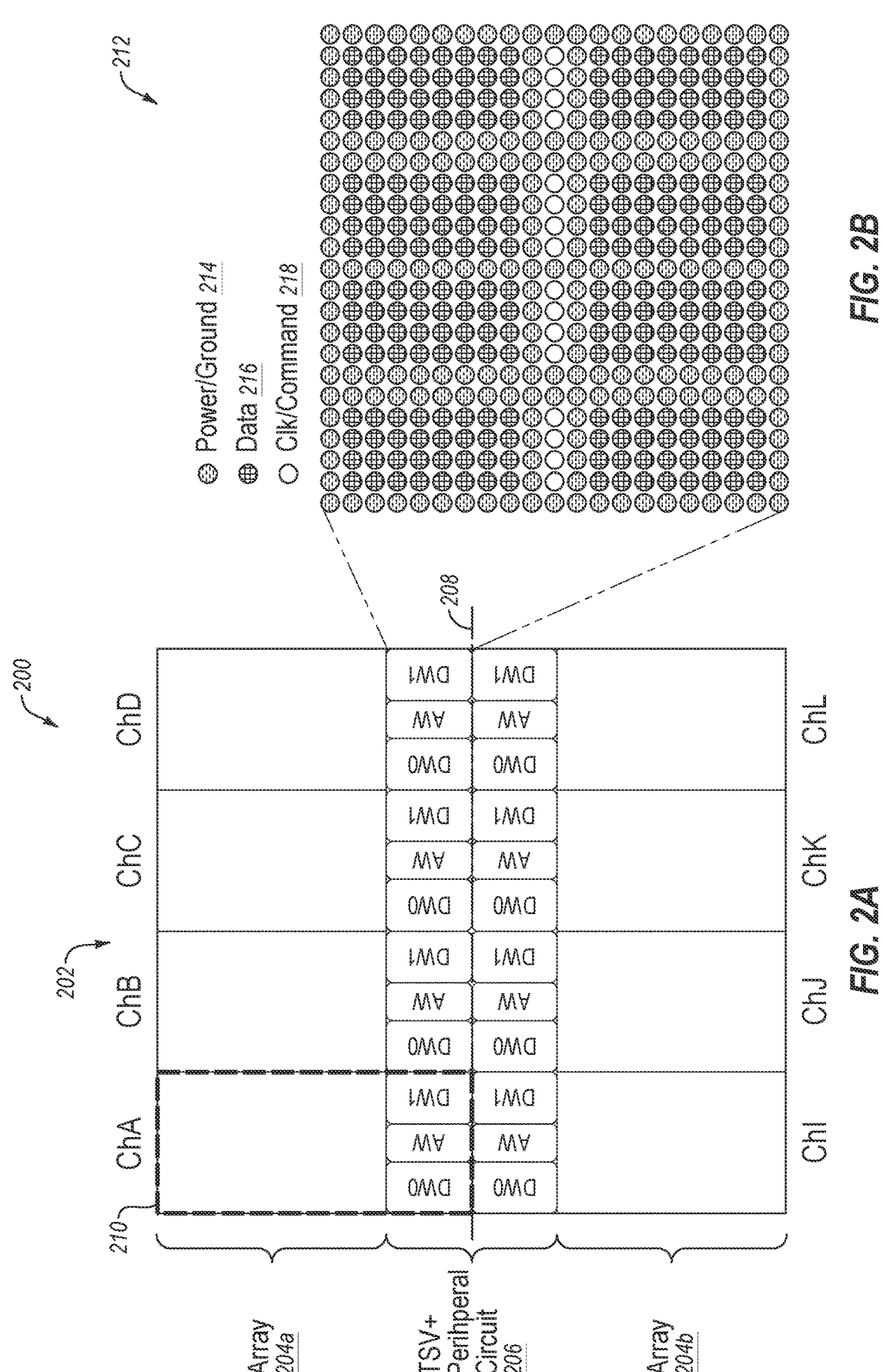
FIG. 2A is a plan-view diagram illustrating an example layout of a die in accordance with at least one embodiment of the disclosure.
FIG. 2B is a plan-view diagram illustrating an example layout of pads of an example DW area of the die of FIG. 2A in accordance with at least one embodiment of the disclosure.

FIG. 2A is a plan-view diagram illustrating an example layout 202 of a die 200 in accordance with at least one embodiment of the disclosure. Layout 202 includes an array area 204a, an array area 204b, and a through-silicon via (TSV) and peripheral circuit area 206 close to a center line 208 of die 200.

Additionally, layout 202 includes designations of areas of the die for specific channels ("channel areas"), e.g., Channel A ("ChA"), Channel B ("ChB"), Channel C ("ChC"), Channel D ("ChD"), Channel I ("ChI"), Channel J ("ChJ"), Channel K ("ChK"), and Channel L ("ChL"). Including multiple channels on a die may, among other things, increase the granularity with which memory cells can be accessed. Including multiple channels may improve random-access operations. Each of the channel areas may include a portion of array area 204a or array area 204b and a portion of TSV and peripheral circuit area 206. As an example, ChA area 210 is illustrated in FIG. 2A as outlined by a dashed-line box. The portion of TSV and peripheral circuit area 206 of a channel area may be for servicing the memory in the memory array area of the channel area. For example, each channel area may include one "AW" region (or "AWord" region) that may include data pads for receiving address/command data (The AW region may alternatively be referred to as a "command block") and two "DW" regions (or "DWord" regions) that may include data pads for providing and/or receiving data (or a "data I/O block").

FIG. 2B is a plan-view diagram illustrating an example layout 212 of pads of an example DW area of die 200 of FIG. 2A in accordance with at least one embodiment of the disclosure. In particular, layout 212 illustrates an arrangement of power/ground pads 214 (which may be used to transfer power to dies), data pads 216 (which may be used to provide data to and/or receive data signals from dies and, more specifically, from memory arrays of dies), and clock/command pads 218 (which may be used to provide clock signals and/or command signals to dies). Pads (including power/ground pads 214, data pads 216 and clock/command pads 218) of die 200 may be electrically coupled to inter-die connections that may couple the pads to other dies and/or to inputs/outputs of the dies. For example, in some embodiments, each of the pads may be, or may include, a TSV and/or an electrically conductive surface on a top and bottom of the die.

Figure 3:
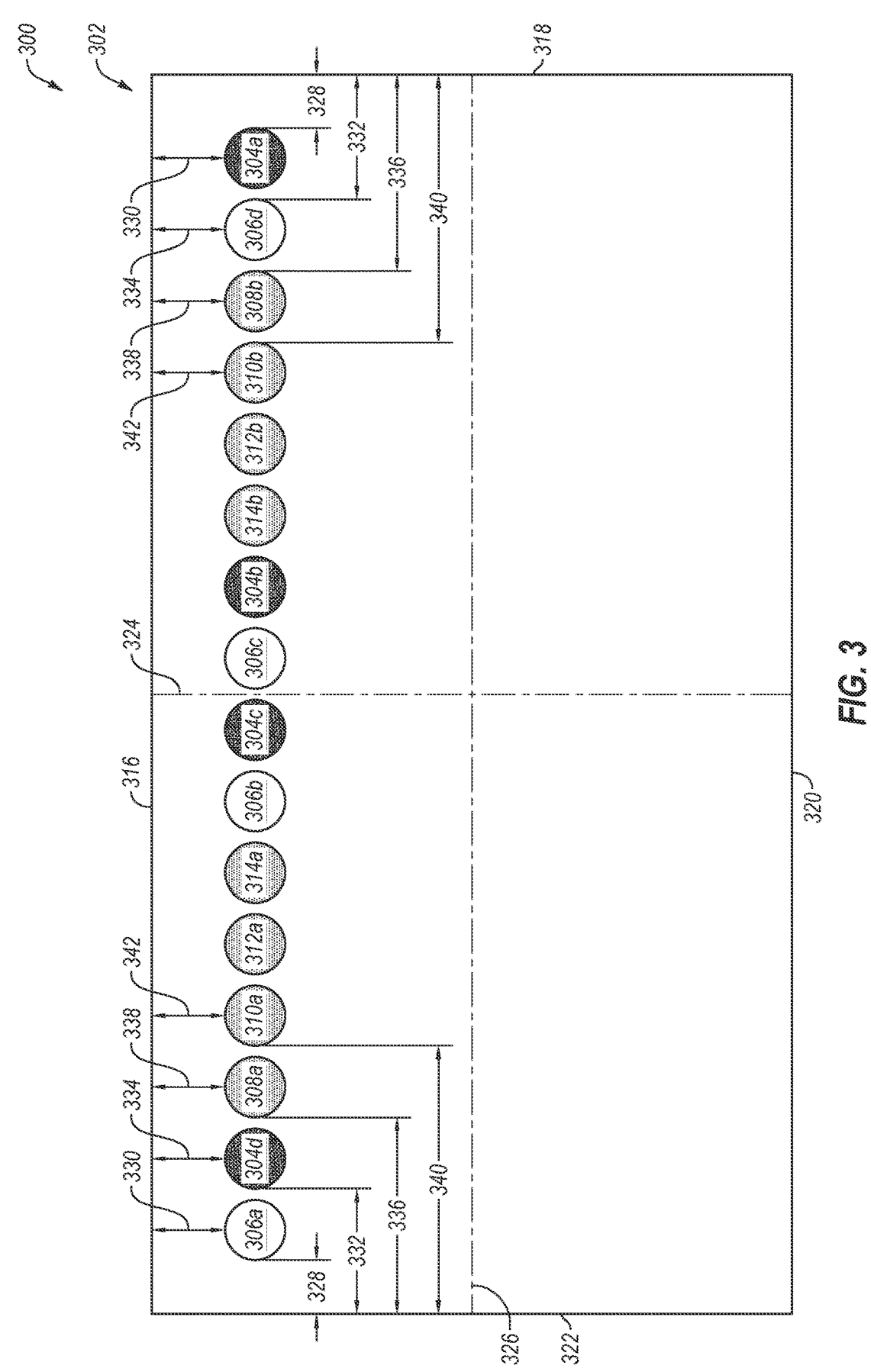
FIG. 3 is a plan-view diagram illustrating an example layout of data pads, dummy data pads, and common data pads on an example die in accordance with at least one embodiment of the disclosure.

FIG. 3 is a plan-view diagram illustrating an example layout 302 of data pads 304, dummy data pads 306, and common data pads 308-314 on an example die 300 in accordance with at least one embodiment of the disclosure. Layout 302 may allow for multiple instances of die 300 to be flipped relative to one another and to be stacked. A stack of instances of die 300 (e.g., with some dies flipped substantially 180° about their respective axes 324 relative to one another) may allow for alignment of data pads and dummy data pads and alignment of categories of common data pads which may allow for straight inter-die connections, e.g., without lateral-connection portions. Additionally, layout 302 may allow for multiple instances of die 300, some of which are mirror symmetric to one another, to be stacked. A stack of instances of die 300 (e.g., with some dies being mirror symmetric to others of the dies) may allow for alignment of data pads and dummy data pads and alignment of categories of common data pads which may allow for straight inter-die connections, e.g., without lateral-connection portions.

Die 300 may include one or more memory arrays (e.g., memory array 102 of FIG. 1; not illustrated in FIG. 3) arranged in one or more memory array areas (e.g., array area 204a of FIG. 2A and/or array area 204b of FIG. 2A; not illustrated in FIG. 3). Die 300 is illustrated in FIG. 3 without memory arrays and without circuits for descriptive purposes. Die 300 is illustrated in FIG. 3 with four dummy data pads 306, four data pads 304, and eight common data pads 308-314 for descriptive purposes. Embodiments may include any number of memory arrays, circuits, data pads, dummy data pads, and common data pads. Further, although data pads, dummy data pads and common data pads are illustrated in a single row, embodiments may include any number of rows of data pads, dummy data pad, and common data pads. Additional rows may, or may not, be the same as, or substantially similar to, the row illustrated in FIG. 3. Alternatively, in some embodiments, data pads, dummy data pads, and common data pads may not be arranged in rows. Die 300, and/or layout 302, may or may not be square. In other words, die 300 and layout 302 may, or may not, be longer in one direction than in another.

Die 300 and the description of layout 302 relative to die 300 describes principles and patterns that can be applied to data pads, dummy data pads, and common data pads of any die including any number of data pads, dummy data pads, and common data pads arranged anywhere on a die. TSV and peripheral circuit area 206 of FIG. 2A may be arranged according the principles and patterns illustrated and described with regard to layout 302 of die 300. For example, the principles and patterns described with regard to layout 302 of die 300 may apply to the overall layout of DW regions and AW regions of TSV and peripheral circuit area 206. Further, the principles and patterns described with regard to layout 302 of die 300 may apply within each DW region and/or AW region of TSV and peripheral circuit area 206.

The data pads 304, dummy data pads 306, and common data pads 308-314 of layout 302 may be arranged close to a center line 326 of die 300, e.g., close to, or on, center line 208 of FIG. 2A with array areas on either side as illustrated in FIG. 2A or, the data pads 304, dummy data pads 306, and common data pads 308-314 of layout 302 may be arranged close to edges of die 300 with one or more memory array areas between them.

The data pads (including data pads 304 and common data pads 308-314) of die 300 may provide for data channels for the memory arrays. For example, the various data pads of die 300 may be variously electrically coupled to various circuits (e.g., input/output circuits) of die 300. For example, data pads may be for electrical coupling to circuits such as, for example, address input circuit 132, command input circuit 152, input/output circuit 162, and/or CLK Input circuit 170 all as illustrated and described with regard to FIG. 1. Additionally or alternatively, the data pads may be for electrical coupling to terminals such as address terminals 110, command terminals 112, clock terminals 114, data terminals 116, and data mask terminals 118 e.g., as illustrated and described with regard to FIG. 1. In some embodiments, data channels including data pads may be serialized and/or de-serialized to allow for a reduction in a number of data pads per die and/or to allow for a relaxed data rate.

Die 300 includes a first edge 316, a second edge 318, a third edge 320, and a fourth edge 322. A center line 326 and an axis 324 are illustrated on die 300 for descriptive purpose. Center line 326 may be between first edge 316 and third edge 320, e.g., center line 326 may be substantially the same distance from first edge 316 and third edge 320. Axis 324 may be between second edge 318 and fourth edge 322, e.g., axis 324 may be substantially the same distance from second edge 318 and fourth edge 322. Further axis 324 may be parallel to one or both of second edge 318 and fourth edge 322.

Die 300 includes data pad 304d, data pad 304c, data pad 304b, and data pad 304a (collectively referred to as "data pads 304"). For descriptive purposes, data pads 304 are illustrated and described as being proximate to first edge 316. In the present disclosure, the term "proximate" may mean that a thing (e.g., a data pad, a dummy data pad, or a common data pad) is closer to one location than to the opposite of the location. For example, data pads 304 being proximate to first edge 316 means that data pads 304 are closer to first edge 316 than to third edge 320. In other words, data pads 304 being proximate to first edge 316 may mean that data pads 304 are on the first edge 316 side of center line 326. Data pads 304 may be variously electrically coupled to one or more respective circuits of die 200. For example, each of data pads 304 may be electrically coupled to a respective circuit to allow an accessing device to electrical couple (e.g., through an inter-die connection) to the one or more respective circuits of a memory array.

Die 300 includes dummy data pad 306a, dummy data pad 306b, dummy data pad 306c, and dummy data pad 306d (collectively referred to as "dummy data pads 306"). For descriptive purposes dummy data pads 306 are illustrated and described as being proximate to first edge 316. Dummy data pads 306 may be not electrically coupled to one or more circuits of die 300. In some embodiments, dummy data pads 306 may be electrically isolated from all circuits of die 300.

The arrangement of data pads 304 may be symmetric to the arrangement of dummy data pads 306 about axis 324. For example, each of data pads 304 may be substantially the same distance from first edge 316 as a corresponding one of dummy data pads 306 is from first edge 316. Further, each of data pads 304 may be substantially the same distance from second edge 318 as a corresponding one of dummy data pads 306 is from fourth edge 322.

As an example, data pad 304a may be distance 330 from first edge 316 and distance 328 from second edge 318 and dummy data pad 306a may be distance 330 from first edge 316 and distance 328 from fourth edge 322. Dummy data pad 306a may correspond to data pad 304a by virtue of their similar respective distances from first edge 316 and from second edge 318 and fourth edge 322 respectively. As another example, dummy data pad 306d may be distance 334 from first edge 316 and distance 332 from second edge 318 and data pad 304*d* may be distance 334 from first edge 316 and distance 332 from fourth edge 322. Data pad 304*d* may correspond to dummy data pad 306*d* by virtue of their similar respective distances from first edge 316 and from fourth edge 322 and second edge 318 respectively. As another example, data pad 304*b* may be a first distance (unlabeled in FIG. 3) from first edge 316 and a second distance (unlabeled in FIG. 3) from second edge 318 and dummy data pad 306*b* may the first distance from first edge 316 and the second distance from fourth edge 322. Dummy data pad 306*b* may correspond to data pad 304*b* by virtue of their similar respective distances from first edge 316 and from second edge 318 and fourth edge 322 respectively. As another example, dummy data pad 306*c* may be a third distance (unlabeled in FIG. 3) from first edge 316 and a fourth distance (unlabeled in FIG. 3) from second edge 318 and data pad 304*c* may be the third distance from first edge 316 and the second distance from fourth edge 322. Data pad 304*c* may correspond to dummy data pad 306*c* by virtue of their similar respective distances from first edge 316 and from fourth edge 322 and second edge 318 respectively.

Described another way, the arrangement of data pads 304 relative to a top right corner (e.g., where first edge 316 meets second edge 318) may be the left-to-right reverse of the arrangement of dummy data pads 306 relative to a top left corner (e.g., where first edge 316 meets fourth edge 322).

In some embodiments, all of data pads 304 and all of dummy data pads 306 may be substantially the same distance from first edge 316. In other embodiments, corresponding pairs (e.g., as described with relation to data pad 304*a* and dummy data pad 306*a*) of data pads 304 and dummy data pads 306 may be the same distance from first edge 316.

Such an arrangement of data pads 304 and dummy data pads 306 may allow for data pads 304 of a first die to be aligned with dummy data pads 306 of a second die when the second die is a substantially identical copy of die 300 and the second die is flipped (e.g., about axis 324) and stacked above (or below) die 300. For example, data pads 304 and dummy data pads 306 may be arranged such that if die 300 were flipped substantially 180° about axis 324, data pads 304 would be in positions formerly occupied by the dummy data pads 306, and dummy data pads 306 would be in positions formerly occupied by the data pads 304.

Additionally, such an arrangement of data pads 304 and dummy data pads 306 may allow for data pads 304 of a first die to be aligned with dummy data pads 306 of a second die when the second die exhibits mirror symmetry relative to die 300 and the second die is stacked above (or below) die 300. For example, data pads 304 and dummy data pads 306 may be arranged such that if a mirror-symmetric die were stacked above die 300, data pads 304 of the mirrored-symmetric instance of die 300 would be above dummy data pads 306 of die 300 and dummy data pads 306 of the mirrored-symmetric instance of die 300 would be above data pads 304 of die 300.

Die 300 includes common data pad 308*a*, common data pad 308*b*, common data pad 310*a*, common data pad 310*b*, common data pad 310*a*, common data pad 310*b*, common data pad 312*a*, common data pad 312*b*, common data pad 314*a*, and common data pad 314*b*, which may be collectively referred to herein as "common data pads 308-314."

Common data pad 308*a* and common data pad 308*b* may be common data pads of a first category; common data pad 308*a*, and common data pad 308*b* may alternatively be referred to herein as "first-category data pads." Common data pad 310*a* and common data pad 310*b* may be common data pads of a second category; common data pad 310*a* and common data pad 310*b* may alternatively be referred to herein as "second-category data pads." Common data pad 312*a* and common data pad 312*b* may be common data pads of a third category; common data pad 312*a* and common data pad 312*b* may alternatively be referred to herein as "third-category data pads." Common data pad 314*a* and common data pad 314*b* may be common data pads of a fourth category; common data pad 314*a* and common data pad 314*b* may alternatively be referred to herein as "fourth-category data pads." Die 300 includes eight common data pads 308-314 including four categories of common data pads for descriptive purposes. Any number of common data pads and any number of categories of common data pads may be included in embodiments. In contrast to data pads 304, common data pads 308-314 may be for common data channels e.g., for data channels common to all dies of the stack and not allocated for arrays of some of the dies but not others.

The arrangement of common data pad 308*a*, common data pad 310*a*, common data pad 312*a*, and common data pad 314*a* may be symmetric about axis 324 to the arrangement of common data pad 308*b*, common data pad 310*b*, common data pad 312*b*, and common data pad 314*b*. For example, each of common data pad 308*a*, common data pad 310*a*, common data pad 312*a*, and common data pad 314*a* may be substantially the same distance from first edge 316 as a corresponding one of common data pad 308*b*, common data pad 310*b*, common data pad 312*b*, and common data pad 314*b* is from first edge 316. Further, each of common data pad 308*a*, common data pad 310*a*, common data pad 312*a*, and common data pad 314*a* may be substantially the same distance from fourth edge 322 as a corresponding one of common data pad 308*b*, common data pad 310*b*, common data pad 312*b*, and common data pad 314*b* is from second edge 318.

As an example, common data pad 308*b* may be distance 338 from first edge 316 and distance 336 from second edge 318 and common data pad 308*a* may be distance 338 from first edge 316 and distance 336 from fourth edge 322. Common data pad 308*a* may correspond to common data pad 308*b* by virtue of their similar respective distances from first edge 316 and from second edge 318 and fourth edge 322 respectively. Common data pad 308*a* and common data pad 308*b* may be of the same category (e.g., the first category). As another example, common data pad 310*b* may be distance 342 from first edge 316 and distance 340 from second edge 318 and common data pad 310*a* may be distance 342 from first edge 316 and distance 340 from fourth edge 322. Common data pad 310*a* may correspond to common data pad 310*b* by virtue of their similar respective distances from first edge 316 and from second edge 318 and fourth edge 322 respectively. Common data pad 310*a* and common data pad 310*b* may be of the same category (e.g., the second category). As another example, common data pad 312*b* may be a first distance (unlabeled in FIG. 3) from first edge 316 and a second distance (unlabeled in FIG. 3) from second edge 318 and common data pad 312*a* may the first distance from first edge 316 and the second distance from fourth edge 322. Common data pad 312*a* may correspond to common data pad 312*b* by virtue of their similar respective distances from first edge 316 and from second edge 318 and fourth edge 322 respectively. Common data pad 312*a* and common data pad 312*b* may be of the same category (e.g., the third category). As another example, common data pad 314*b* may be a third distance (unlabeled in FIG. 3) from first edge 316 and a fourth distance (unlabeled in FIG. 3) from second edge 318 and common data pad 314*a* may be the third distance from first edge 316 and the second distance from fourth edge 322. Common data pad 314*a* may correspond to common data pad 314*b* by virtue of their similar respective distances from first edge 316 and from second edge 318 and fourth edge 322 respectively. Common data pad 314*a* and common data pad 314*b* may be of the same category (e.g., the fourth category).

In some embodiments, all of common data pad 308*a*, common data pad 308*b*, common data pad 310*a*, common data pad 310*b*, common data pad 312*a*, common data pad 312*b*, common data pad 314*a*, and common data pad 314*b* may be substantially the same distance from first edge 316. In other embodiments, corresponding pairs, e.g., common data pad 308*a* and common data pad 308*b*, common data pad 310*a* and common data pad 310*b*, common data pad 312*a* and common data pad 312*b*, and common data pad 314*a* and common data pad 314*b* may be the same distance from first edge 316.

Such an arrangement of common data pads 308-314 may allow for common data pads 308-314 of the same category to be aligned when substantially identical copies of die 300 are flipped and stacked. Additionally, such an arrangement of common data pads 308-314 may allow for common data pads 308-314 of the same category to be aligned when a mirror-symmetric die is stacked above (or below) die 300.

As mentioned above, TSV and peripheral circuit area 206 of FIG. 2A may be arranged according to the principles and patterns illustrated and described with regard to layout 302 of die 300. For example, according to the principles and patterns of layout 302, the layout of data pads and dummy data pads of a region (e.g., a DW region or AW region) may correspond to the layout of data pads and dummy data pads of other regions. For example, the layout of data pads of a DW0 region of ChA of FIG. 2A relative to a top-left corner of die 200 of FIG. 2A may be the left-to-right reverse of the layout of dummy data pads of a DW1 region of ChD relative to a top-right corner of die 200. The result of this layout of data pads and dummy data pads is that when a copy of die 200 is flipped and stacked above die 200, the data pads of the DW0 region of ChA of die 200 align with the dummy data pads of the DW1 region of ChD of the copy of die 200. Additionally, this layout of data pads and dummy data pads may allow a mirror-symmetric die (relative to die 200) to be stacked above die 200, the data pads of the DW0 region of ChA of die 200 aligning with the dummy data pads of the DW1 region of ChD of the mirror-symmetric die. Further, according to the principles and patterns of layout 302, the dummy data pads of the DW0 region of ChA of die 200 will align with the data pads of the DW1 region of ChD of the copy of die 200 (or the mirror-symmetric die). The same holds true for a DW1 region of ChA and a DW0 region of ChD, a DW0 region of ChB and a DW1 region of ChC, for example. In some embodiments, the layout of data pads and dummy data pads of each DW0 region may correspond to the layout of dummy data pads of each DW1 region and the layout of dummy data pads of each DW0 region may correspond to the layout of data pads of each DW1 region.

Similarly, according to the principles and patterns of layout 302, the layout of categories of common data pads of regions (e.g., DW regions and AW regions) may correspond to the layout of categories of common data pads of other regions. For example, the layout of common data pads of a DW0 region of ChA of FIG. 2A relative to a top left corner of die 200 of FIG. 2A may be the left-to-right reverse of the layout of categories of common data pads of a DW1 region of ChD relative to a top right corner of die 200. The result of this layout of categories of common data pads is that when a copy of die 200 is flipped and stacked above die 200, the categories of common data pads of DW0 of ChA of die 200 align with the same categories of common data pads of DW1 of ChD of the copy of die 200. Additionally, this layout of common data pads may allow a mirror-symmetric die (relative to die 200) to be stacked above die 200, the categories of common data pads of DW0 of ChA of die 200 aligning with the same categories of common data pads of DW1 of ChD of the mirror-symmetric die. The same holds true for DW1 of ChA and DW0 of ChD, DW0 of ChB and DW1 of ChC, for example. In some embodiments, the layout of categories of common data pads of each DW0 region may be the left-to-right reverse to of layout of categories of common data pads of each DW1 region.

Further, the layout of data pads, dummy data pads, and common data pads within each DW region (or AW region) may follow the principles and patterns of layout 302 relative to the DW region (or AW region respectively). Thus, each DW region (or AW region) may be viewed as a die 300 and may follow the principles and patterns of layout 302.

Figure 4:
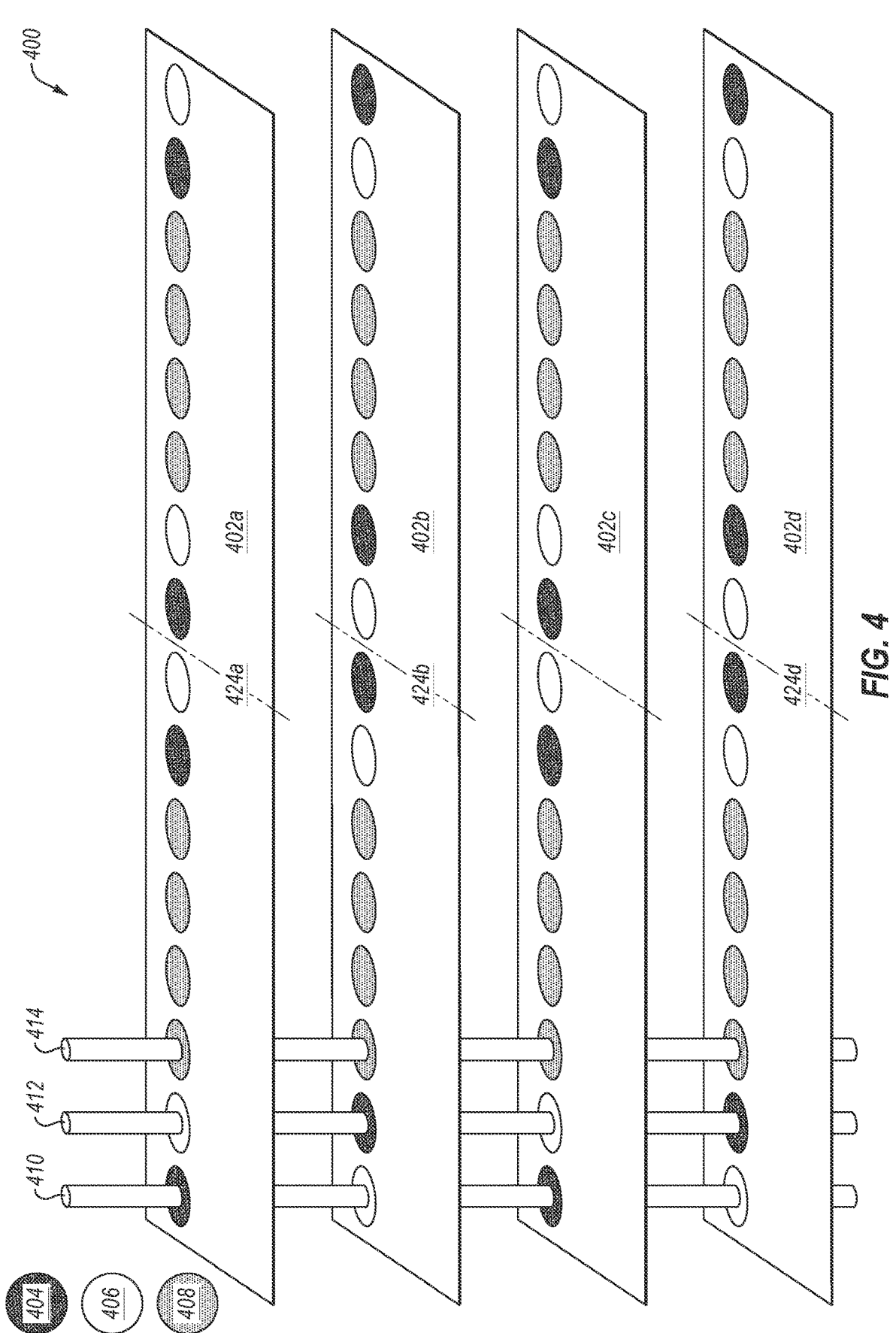
FIG. 4 is a perspective-view diagram illustrating an example stack of dies in accordance with at least one embodiment of the disclosure.

FIG. 4 is a perspective-view diagram illustrating an example stack 400 of dies 402 in accordance with at least one embodiment of the disclosure. The layout of dummy data pads 406, data pads 404, and common data pads 408 of all of dies 402 may be the same, or substantially similar. The layout of dummy data pads 406, data pads 404, and common data pads 408 may allow for multiple instances of die 402 to be flipped relative to one another and to be stacked. Additionally or alternatively, the layout of dummy data pads 406, data pads 404, and common data pads 408 may allow for multiple instances of die 402 and multiple instances of dies that are mirror symmetric to die 402 to be stacked. Stack 400 of dies 402 (e.g., with some dies (e.g., die 402*b* and die 402*d*) flipped substantially 180° about their respective axes 424 relative to others (e.g., die 402*a* and die 402*c*) or with some dies (e.g., die 402*b* and die 402*d*) being mirror symmetric relative to others (e.g., die 402*a* and die 402*c*)) may allow for alignment of data pads 404 with dummy data pads 406 and alignment of common categories of common data pads 408 which may allow for straight inter-die connections (e.g., inter-die connection 410, inter-die connection 412, and inter-die connection 414), e.g., without lateral-connection portions.

Dies 402 of FIG. 4 may follow the principles and patterns of layout 302 of FIG. 3. For example, the arrangement of data pads 404 of die 402*a* may be mirror symmetric to the arrangement dummy data pads 406 of die 402*a* about axis 424*a*. Additionally or alternatively, the arrangement of categories of common data pads 408 of die 402*a* may be mirror symmetric about axis 424*a*. For example, the common data pads 408 closest to each of the left and right edges of die 402*a* may be of the same category. For example, each of dies 402 may be an example of die 300 of FIG. 3.

In stack 400 of FIG. 4, alternating dies 402, e.g., die 402*b* and die 402*d* are in different orientations e.g., flipped or unflipped. For example, die 402*a* and die 402*c* are in a first orientation, e.g., unflipped and die 402*b* and die 402*d* are in a second orientation, e.g., flipped. For example, die 402*b* (e.g., a second dies in stack 400 (counting from the top down)) is flipped about axis 424*b* and die 402*d* (e.g., a fourth dies in stack 400) is flipped about 424*d*. In other embodiments, the ordering of the flipped dies may vary.

Alternatively, in stack 400, alternating dies 402, e.g., die 402*b* and die 402*d* may be mirror-symmetric to the other dies, e.g., die 402*a* and die 402*c*. In embodiments in which some of dies 402 of the stack are mirror-symmetric to others of dies 402, none of the dies 402 may be flipped relative to the others. Alternatively, in some embodiments, stack 400 may include some dies 402 that are mirror symmetric to other dies 402 (and not flipped) and some dies 402 that are flipped (and identical) to other dies 402.

Stack 400 is illustrated in FIG. 4 including four dies 402 for descriptive purposes. Any number of dies may be included in embodiments. In FIG. 4, only three inter-die connections 410, 412, and 414 are illustrated for descriptive purposes. Any number of inter-die connections may be included in embodiments, e.g., one inter-die connection for all the data pads and all the common data pads of all the dies 402.

Figure 5:
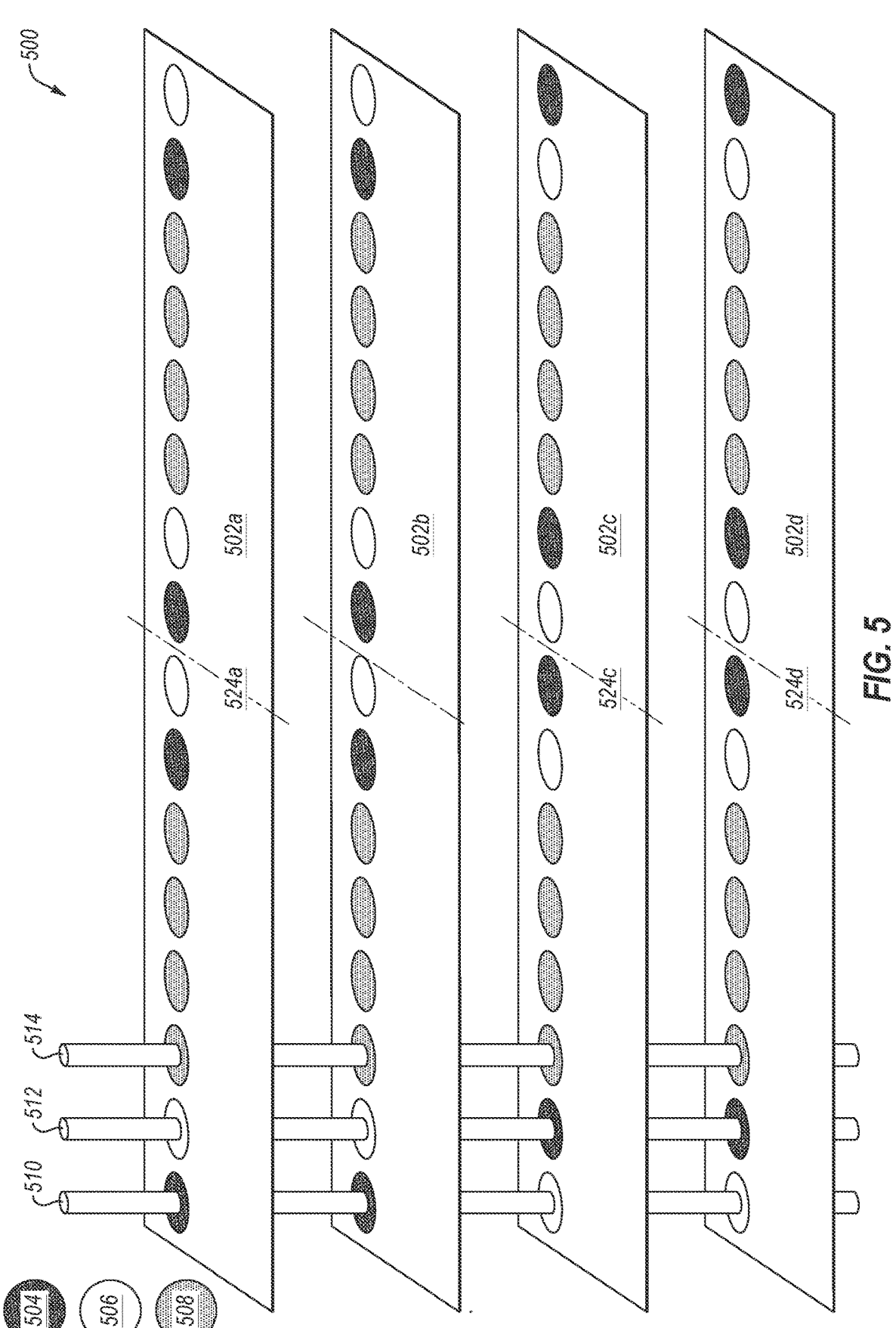
FIG. 5 is a perspective-view diagram illustrating another example stack of dies in accordance with at least one embodiment of the disclosure.

FIG. 5 is a perspective-view diagram illustrating another example stack 500 of dies 502 in accordance with at least one embodiment of the disclosure. The layout of dummy data pads 506, data pads 504, and common data pads 508 of all of dies 502 may be the same, or substantially similar. The layout of dummy data pads 506, data pads 504, and common data pads 508 may allow for multiple instances of die 502 to be flipped relative to one another and to be stacked. Additionally or alternatively, the layout of dummy data pads 506, data pads 504, and common data pads 508 may allow for multiple instances of die 502 and multiple instances of dies that are mirror symmetric to die 502 to be stacked. Stack 500 of dies 502 (e.g., with some dies (e.g., die 502c and die 502d) flipped substantially 180° about their respective axes 524 relative to others (e.g., die 502a and die 502b) or with some dies (e.g., die 502b and die 502d) being mirror symmetric relative to others (e.g., die 502a and die 502c)) may allow for alignment of data pads 504 with dummy data pads 506 and alignment of common categories of common data pads 508 which may allow for straight inter-die connections (e.g., inter-die connection 510, inter-die connection 512, and inter-die connection 514), e.g., without lateral-connection portions.

Dies 502 may follow the principles and patterns of layout 302 of FIG. 3. For example, the arrangement of data pads 504 of die 502a may be symmetric to the arrangement dummy data pads 506 of die 502a about axis 524a. Additionally or alternatively, the arrangement of categories of common data pads 508 of die 502a may be symmetric about axis 524a. For example, the common data pads 508 closest to each of the left and right edges of die 502a may be of the same category. For example, each of dies 502 may be an example of die 300 of FIG. 3.

In stack 500, dies 502 of separate halves of stack 500 are in different orientations e.g., flipped or unflipped. For example, die 502a and die 502b are in a first orientation, e.g., unflipped and die 502c and die 502d are in a second orientation, e.g., flipped. For example, die 502c (e.g., a third die in stack 500 (counting from the top down)) is flipped about axis 524c and die 502d (e.g., a fourth die in stack 500) is flipped about axis 524d.

Alternatively, dies of the top half of a stack 500, e.g., die 502a and die 502b may be mirror-symmetric to dies 502 of the bottom half of the stack 500, e.g., die 502c and die 502d. In embodiments in which some of dies 502 of the stack are mirror-symmetric to others of dies 502, none of the dies 502 may be flipped relative to the others. Alternatively, in some embodiments, stack 500 may include some dies 502 that are mirror symmetric to other dies 502 (and not flipped) and some dies 502 that are flipped (and identical) to other dies 502.

Arranging dies 502 having a common orientation (e.g., flipped vs. unflipped) adjacent to one another in stack 500, or arranging dies having common symmetry adjacent to one other in stack 500, may be advantageous for at least two reasons.

First, a path length of related data pads may be similar. For example, a top-left data pad of die 502a may correspond to a particular data channel, e.g., Channel A by virtue of being above a Channel A portion of an accessing device. A top-left data pad of die 502b may also correspond to Channel A by virtue of being above the Channel A portion of the accessing device. A first path length, e.g., from the logic die to the top-left data pad of die 502a (e.g., through inter-die connection 510) may be similar to a second path length (e.g., from the accessing device to the top-left data pad of die 502b (e.g., through inter-die connection 510)). In particular, a first path length from the accessing device to a data pad of die 502a may be more similar to a second path length from the accessing device to a corresponding data pad of die 502b than a third path length from an accessing device to a data pad of die 402a of FIG. 4 is to a fourth path length from the accessing device to a corresponding data pad of die 402c of FIG. 4. The similarity between the first path length and the second path length may improve the timing of signals to and from die 502a and die 502b e.g., by causing the timing of signals to and from die 502a to be similar to the timing of signals to and from die 502b.

Second, based on how circuits (e.g., including memory arrays) of dies 502 of stack 500 are accessed (e.g., addressed and/or accessed in time (e.g., time-division multiplexed)) circuits of dies 502 that are vertically in line may not be accessed at the same time. For example, a circuit of die 502a, coupled to a top-left data pad of die 502a, may not be accessed at the same time as a circuit of die 502b, coupled to a top-left data pad of die 502b. As another example, the circuit of die 502a, coupled the top-left data pad of die 502a, may not be accessed at the same time as the circuit of die 502b, coupled the top left data pad of die 502b, based on addressing. For example, based on an address of the signal, only one of the circuit of die 502a and die 502b may process a signal that may arrive at the top-left data pads of both die 502a and die 502b. Limiting access of data pads 504 that are vertically aligned, may distribute (in space or time) access to data pads, which distribution may correlate to a distribution of heat.

Stack 500 is illustrated in FIG. 5 including four dies 502 for descriptive purposes. Any number of dies may be included in embodiments. In FIG. 5, only three inter-die connections 510, 512, and 514 are illustrated for descriptive purposes. Any number of inter-die connections may be included in embodiments, e.g., one inter-die connection for all the data pads and all the common data pads of all the dies 502.

Figure 6:
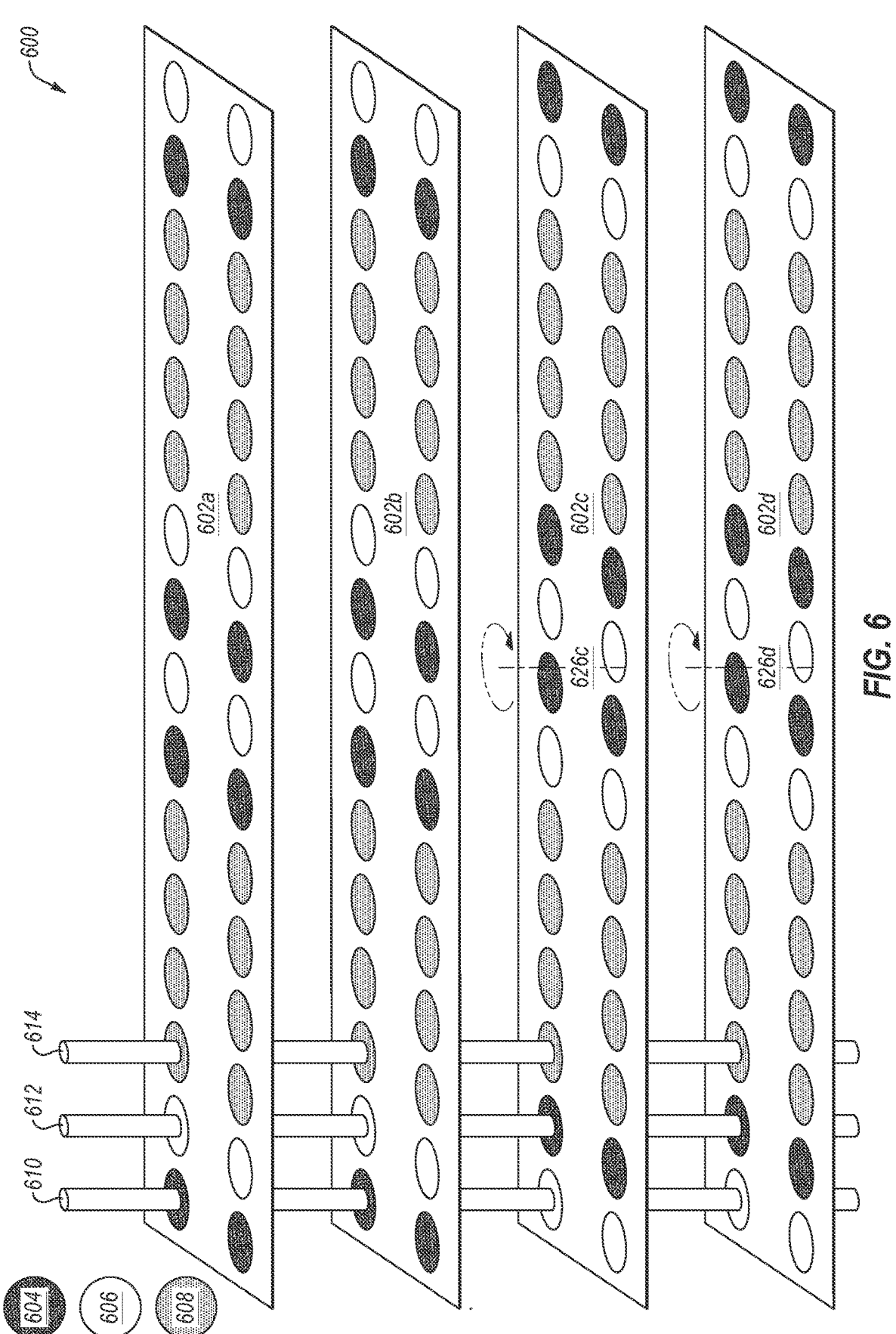
FIG. 6 is a perspective-view diagram illustrating yet another example stack of dies in accordance with at least one embodiment of the disclosure.

FIG. 6 is a perspective-view diagram illustrating yet another example stack 600 of dies 602 in accordance with at least one embodiment of the disclosure. The layout of dummy data pads dummy data pads 606, data pads 604, and common data pads 608 of all of dies 602 may be the same, or substantially similar. The layout of dummy data pads 606, data pads 604, and common data pads 608 may allow for multiple instances of die 602 to be rotated relative to one another and to be stacked. Stack 600 of dies 602 (e.g., with some dies (e.g., die 602c and die 602d) rotated substantially 180° about respective axes normal to planes of the respective dies relative to others (e.g., die 602a and die 602b)) may allow for alignment of data pads 604 with dummy data pads 606 and alignment of common categories of common data pads 608 which may allow for straight inter-die connections (e.g., inter-die connection 610, inter-die connection 612, and inter-die connection 614), e.g., without lateral-connection portions.

Dies 602 may follow the patterns and principles of layout 202c of FIG. 2C of U.S. Utility patent application Ser. No. 17/646,565. For example, the arrangement of data pads 604 of die 602a relative to a top-left corner of die 602a may be the reverse of the arrangement dummy data pads 606 of die 602a relative to a bottom-right corner of die 602a. Additionally or alternatively, the arrangement of categories of common data pads 608 of die 602a relative to a top-left corner of die 602a may be the reverse of the arrangement of the categories of common data pads 608 relative to a bottom-right corner of die 602a. For example, the common data pads 608 closest to the top-left corner of die 602a may be of the same category as the common data pads 608 closes to the bottom-right corner of die 602a.

In stack 600, dies 602 of a separate halves of stack 600 are in different orientations e.g., rotated or unrotated. For example, die 602a and die 602b are in a first orientation, e.g., unrotated and die 602c and die 602d are in a second orientation, e.g., rotated. For example, die 602c (e.g., a third die in stack 600 (counting from the top down)) is rotated about an axis 626c normal to die 602c and die 602d (e.g., a fourth die in stack 600) is rotated about axis 626d normal to die 602d.

Arranging dies 602 having a common orientation (e.g., rotated vs. unrotated) adjacent to one another in stack 600 may be advantageous for at least the reasoned described above with regard to FIG. 5.

Stack 600 is illustrated in FIG. 6 including four dies 602 for descriptive purposes. Any number of dies may be included in embodiments. In FIG. 6, only three inter-die connections 610, 612, and 614 are illustrated for descriptive purposes. Any number of inter-die connections may be included in embodiments, e.g., one inter-die connection for all the data pads and all the common data pads of all the dies 602.

Figure 7:
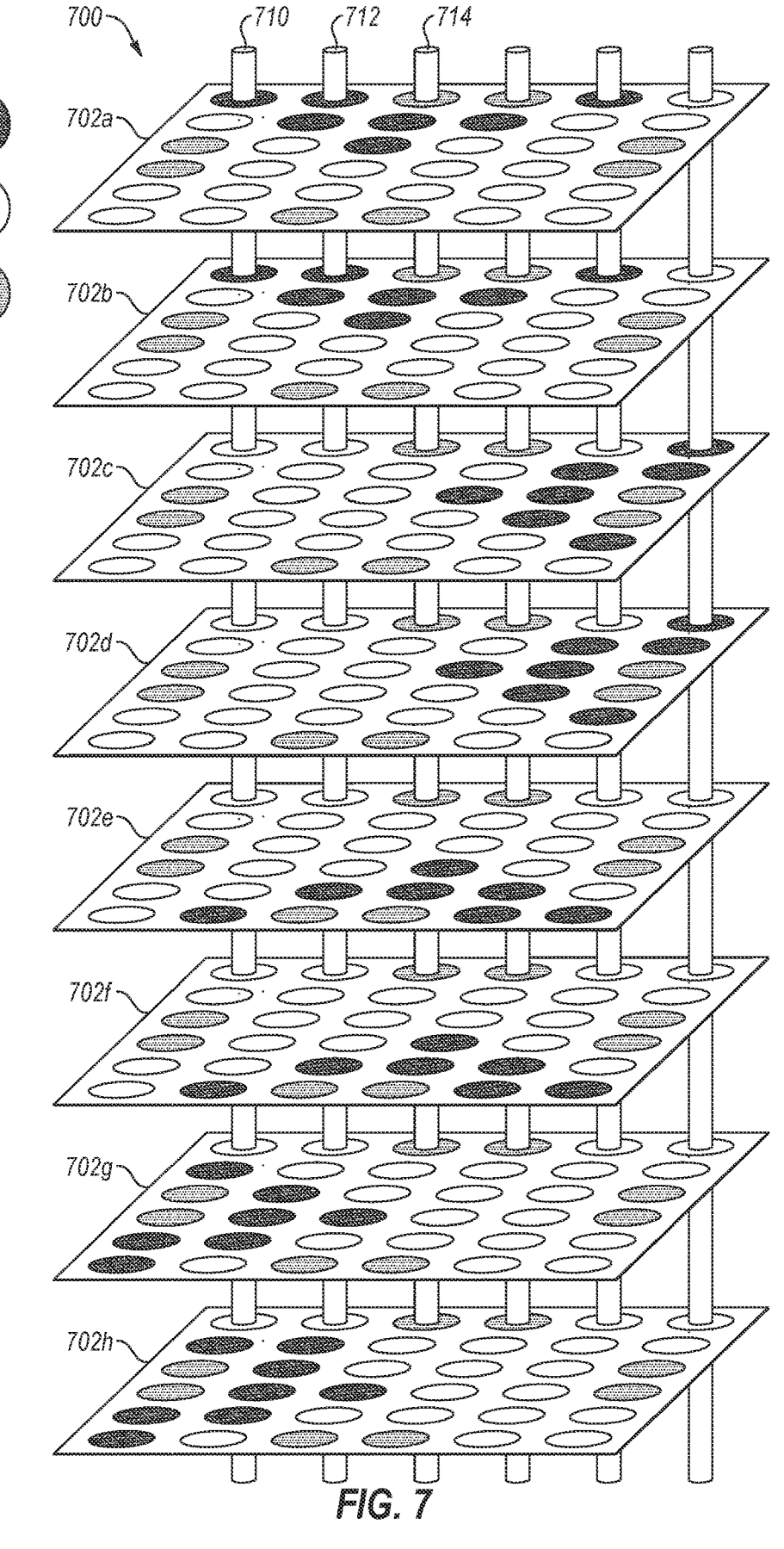
FIG. 7 is a perspective-view diagram illustrating yet another example stack of dies in accordance with at least one embodiment of the disclosure.

FIG. 7 is a perspective-view diagram illustrating yet another example stack 700 of dies 702 in accordance with at least one embodiment of the disclosure. The layout of dummy data pads dummy data pads 706, data pads 704, and common data pads 708 of all of dies 702 may be the same, or substantially similar. The layout of dummy data pads 706, data pads 704, and common data pads 708 may allow for multiple instances of die 702 to be rotated relative to one another and to be stacked. Stack 700 of dies 702 (e.g., with some dies rotated substantially 90° about respective axes normal to planes of the respective dies relative to others) may allow for alignment of data pads 704 with dummy data pads 706 and alignment of common categories of common data pads 708 which may allow for straight inter-die connections (e.g., inter-die connection 710, inter-die connection 712, and inter-die connection 714), e.g., without lateral-connection portions.

Dies 702 may follow the patterns and principles of stack 400 of FIG. 4 of U.S. Utility patent application Ser. No. 17/646,565. For example, the arrangement of data pads 704 of die 702a relative to a top-left corner of die 702a may be the same as the arrangement dummy data pads 706 of die 702a relative to a top-right corner of die 702a and the same as the arrangement dummy data pads 706 of die 702a relative to a bottom-right corner of die 702a and the same as the arrangement dummy data pads 706 of die 702a relative to a bottom-left corner of die 702a.

Additionally or alternatively, the arrangement of categories of common data pads 708 of die 702a relative to a top-left corner of die 702a may be the same as the arrangement of the categories of common data pads 608 relative to a top-right corner of die 702a and the same as the arrangement of the categories of common data pads 608 relative to a bottom-right corner of die 702a and the same as the arrangement of the categories of common data pads 608 relative to a bottom-left corner of die 702a. For example, the common data pads 708 closest to the top-left corner of die 702a may be of the same category as the common data pads 708 closes to the top-right corner of die 702a and the same category as the common data pads 708 closes to the bottom-right corner of die 702a the same category as the common data pads 708 closes to the bottom-left corner of die 702a.

In stack 700, dies 702 of a separate quarters of stack 700 are in different orientations e.g., unrotated, rotated 90°, rotated 180°, or rotated 270°. For example, in stack 700, dies 702 of a top quarter of stack 700, e.g., die 702a and die 702b, are in a first orientation (e.g., unrotated). Dies 702 of a top-middle quarter of stack 700, e.g., die 702c and die 702d, are in a second orientation (e.g., rotated 90° about an axis normal to the respective dies relative to die 702a). Dies 702 of a bottom-middle quarter of stack 700, e.g., die 702e and die 702f, are in a third orientation (e.g., rotated 180° about an axis normal to the respective dies relative to die 702a). Dies 702 of a bottom quarter of stack 700, e.g., die 702g and die 702h, are in a fourth orientation (e.g., rotated 270° about an axis normal to the respective dies relative to die 702a).

Arranging dies 702 having a common orientation (e.g., unrotated, rotated 90°, rotated 180°, vs. rotated 270°) adjacent to one another in stack 700 may be advantageous for at least the reasoned described above with regard to FIG. 5.

Stack 700 is illustrated in FIG. 7 including eight dies 702 for descriptive purposes. Any number of dies may be included in embodiments. In FIG. 7, only six inter-die connections are illustrated and only three of the inter-die connections 710, 712, and 714 are labeled with reference numbers for descriptive purposes. Any number of inter-die connections may be included in embodiments, e.g., one inter-die connection for all the data pads and all the common data pads of all the dies 702.

Figure 8A:
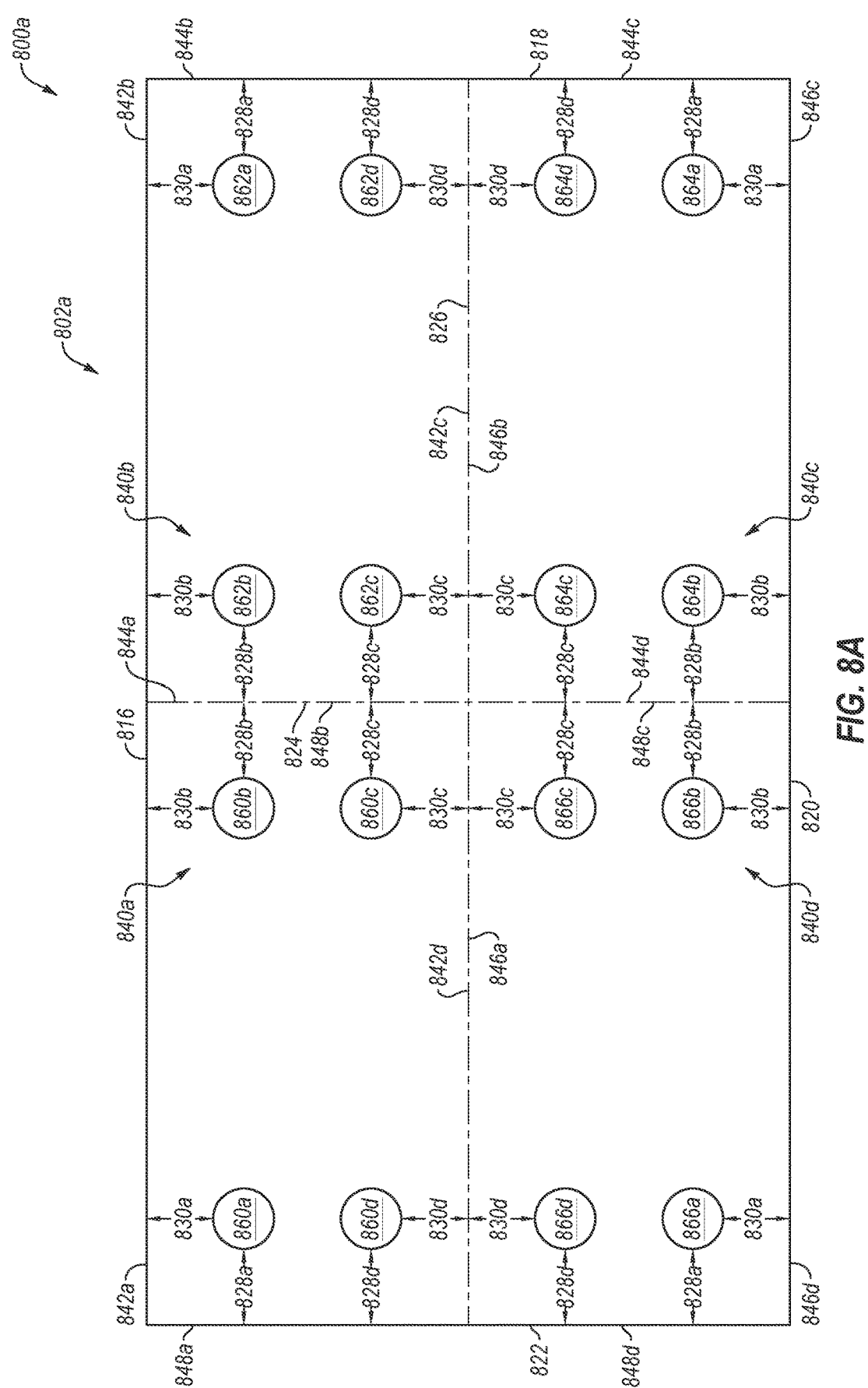
FIG. 8A is a plan-view diagram illustrating another example layout 802a of positions for data pads, dummy data pads and/or common data pads on an example die 800a in accordance with at least one embodiment of the disclosure.

FIG. 8A is a plan-view diagram illustrating another example layout 802a of positions for data pads, dummy data pads and/or common data pads on an example die 800a in accordance with at least one embodiment of the disclosure.

Die 800a includes a first edge 816, a second edge 818, a third edge 820, and a fourth edge 822. An axis 826 and an axis 824 are illustrated on die 800a for descriptive purpose. Axis 826 may be between first edge 816 and third edge 820, e.g., axis 826 may be substantially the same distance from first edge 816 and third edge 820. Axis 824 may be between second edge 818 and fourth edge 822, e.g., axis 824 may be substantially the same distance from second edge 818 and fourth edge 822. Further axis 824 may be parallel to one or both of second edge 818 and fourth edge 822.

Die 800a, may include four quadrants 840, e.g., quadrant 840a, quadrant 840b, quadrant 840c, and quadrant 840d (which four quadrants may be referred to herein as "quadrant 840"). Each of quadrant 840 may be defined by four respective boundaries (e.g., a top boundary 842, a right boundary 844, a bottom boundary 846, and a left boundary 848). For example, quadrant 840a may be defined by boundary 842a, boundary 844a, boundary 846a, and boundary 848a. As another example, quadrant 840b may be defined by boundary 842b, boundary 844b, boundary 846b, and boundary 848b. As another example, quadrant 840c may be defined by boundary 842c, boundary 844c, boundary 846c, and boundary 848c. As another example, quadrant 840*d* may be defined by boundary 842*d*, boundary 844*d*, boundary 846*d*, and boundary 848*d*. The boundaries may align with edges, axis 824, or axis 826. For example, boundary 842*a* may align with first edge 816, boundary 844*a* may align with axis 824, boundary 846*a* may align with axis 826, and boundary 848*a* may align with fourth edge 822. Further, boundaries of one of the quadrants may align with boundaries of other quadrants. For example, boundary 844*a* of quadrant 840*a* may align with boundary 848*b* of quadrant 840*b* and boundary 846*a* of quadrant 840*a* may align with boundary 842*d* of quadrant 840*d*.

Layout 802*a* includes sixteen positions 860*a*-866*d*. Positions 860*a*-866*d* include position 860*a*, position 862*a*, position 864*a*, and position 866*a*, each of which are respectively a distance 828*a* from a respective edge (edge 818 or edge 822) and a distance 830*a* from another respective edge (edge 816 or edge 820). Additionally, positions 860*a*-866*d* include position 860*b*, position 862*b*, position 864*b*, and position 866*b*, each of which are respectively a distance 828*b* from axis 824 and a distance 830*b* from another respective edge (edge 816 or edge 820). Additionally, positions 860*a*-866*d* include position 860*c*, position 862*c*, position 864*c*, and position 866*c*, each of which are respectively a distance 828*c* from axis 824 and a distance 830*c* from axis 826. Additionally, positions 860*a*-866*d* include position 860*d*, position 862*d*, position 864*d*, and position 866*d*, each of which are respectively a distance 828*d* from a respective edge (edge 818 or edge 822) and a distance 830*b* from axis 826.

Distance 828*a*, distance 828*b*, distance 828*c*, and distance 828*d* may or may not have the same length. Similarly, distance 830*a*, distance 830*b*, distance 830*c*, and distance 830*d* may or may not have the same length.

Layout 802*a* may allow for multiple instances of die 800*a*, including data pads, dummy data pads, and/or common data pads at certain ones of positions 860*a*-866*d*, to be flipped, rotated, and/or flipped and rotated relative to one another and to be stacked. A stack of instances of die 800*a* (e.g., with some dies flipped substantially 180° about their respective axes 824, with some of the dies rotated substantially 180° about a vertical axis normal to the respective dies (or alternatively flipped about axis 824 and axis 826), and with some of the dies flipped and rotated (or alternatively flipped about axis 826)) may allow for alignment of data pads and dummy data pads and alignment of categories of common data pads which may allow for straight inter-die connections, e.g., without lateral-connection portions.

Die 800*a* may include one or more memory arrays (e.g., memory array 102 of FIG. 1; not illustrated in FIG. 8A) arranged in one or more memory array areas (e.g., array area 204*a* of FIG. 2A and/or array area 204*b* of FIG. 2A; not illustrated in FIG. 8A). Die 800*a* is illustrated in FIG. 8A without memory arrays and without circuits for descriptive purposes. Die 800*a* is illustrated in FIG. 8A with sixteen positions 860*a*-866*d* for data pads or dummy data pads for descriptive purposes. Embodiments may include any number of memory arrays, circuits, data pads, dummy data pads, and common data pads. Further, although data pads, dummy data pads and common data pads are illustrated in four rows, embodiments may include any number of rows of data pads, dummy data pad, and common data pads. Additional rows may, or may not, be the same as, or substantially similar to, the row illustrated in FIG. 8A. Alternatively, in some embodiments, data pads, dummy data pads, and common data pads may not be arranged in rows.

Die 800*a* and the description of layout 802*a* relative to die 800*a* describes principles and patterns that can be applied to data pads, dummy data pads, and common data pads of any die including any number of data pads, dummy data pads, and common data pads arranged anywhere on a die. TSV and peripheral circuit area 206 of FIG. 2A as a whole may be arranged according to the principles and patterns illustrated and described with regard to layout 802*a* of die 800*a*. For example, the principles and patterns described with regard to layout 802*a* of die 800*a* may apply to the overall layout of DW regions and AW regions of TSV and peripheral circuit area 206. Further, the principles and patterns described with regard to layout 802*a* of die 800*a* may apply within each DW region and/or AW region of TSV and peripheral circuit area 206. The sixteen positions 860*a*-866*d* may be arranged close to an axis 826 of die 800*a*, e.g., close to, or on, center line 208 of FIG. 2A with array areas on either side as illustrated in FIG. 2A. Additionally or alternatively, the sixteen positions 860*a*-866*d* may be arranged close to edges of die 800*a* with one or more memory array areas between them.

Data pads that may be placed at one or more of positions 860*a*-866*d* may be the same as, or substantially similar to, data pads 304 of FIG. 3, except that the arrangement of positions 860*a*-866*d* of layout 802*a* may vary from the arrangement of data pads 304 of layout 302 of FIG. 3. Similarly, dummy data pads that may be placed at one or more of positions 860*a*-866*d* may be the same as, or substantially similar to, dummy data pads 306 of FIG. 3, except that the arrangement of positions 860*a*-866*d* of layout 802*a* may vary from the arrangement of dummy data pads 306 of layout 302 of FIG. 3. Additionally, common data pads may be placed at one or more of positions 860*a*-866*d*. Common data pads that may be placed at one or more of positions 860*a*-866*d* may be the same as, or substantially similar to, common data pads 308-314 of FIG. 3, except that the arrangement of positions 860*a*-866*d* of layout 802*a* may vary from the arrangement of common data pads 308-314 in layout 302 of FIG. 3.

According to layout 802*a* of FIG. 8A, a data pad may be placed at one of position 860*a*, position 862*a*, position 864*a*, and position 866*a* and dummy data pads may be placed at the others of position 860*a*, position 862*a*, position 864*a*, and position 866*a*. If four identical copies of die 800*a* are formed with a data pad placed at one of position 860*a*, position 862*a*, position 864*a*, and position 866*a* and dummy data pads placed at the others of position 860*a*, position 862*a*, position 864*a*, and position 866*a*, when the identical copies of die 800*a* are flipped, rotated, and rotated and flipped, and stacked, one above another, the data pads will align with dummy data pads of other dies. For example, if a data pad were placed at position 860*a*, and dummy data pads at position 862*a*, position 864*a*, and position 866*a*, and an identical copy of die 800*a* were flipped and placed above die 800*a*, the data pad at position 860*a* would align with the dummy data pad at position 862*a* of the flipped identical copy and the data pad at position 860*a* of the identical copy would align with the dummy data pad at position 862*a* of die 800*a*. If an identical copy of die 800*a* were rotated and placed above die 800*a*, the data pad at position 860*a* would align with the dummy data pad at position 864*a* of the flipped identical copy and the data pad at position 860*a* of the identical copy would align with dummy the data pad at position 864*a* of die 800*a*. If an identical copy of die 800*a* were flipped and rotated and placed above die 800*a*, the data pad at position 860*a* would align with the dummy data pad at position 866*a* of the flipped identical copy and the data pad at position 860*a* of the identical copy would align with the dummy data pad at position 866*a* of die 800*a*.

Similarly, according to layout 802a of FIG. 8A, a data pad may be placed at one of position 860b, position 862b, position 864b, and position 866b and dummy data pads may be placed at the others of position 860b, position 862b, position 864b, and position 866b. If four identical copies of die 800a are formed with a data pad placed at one of position 860b, position 862b, position 864b, and position 866b and dummy data pads placed at the others of position 860b, position 862b, position 864b, and position 866b, when the identical copies of die 800a are flipped, rotated, and rotated and flipped, and stacked, one above another, the data pads will align with dummy data pads of other dies. Similarly, according to layout 802a of FIG. 8A, a data pad may be placed at one of position 860c, position 862c, position 864c, and position 866c and dummy data pads may be placed at the others of position 860c, position 862c, position 864c, and position 866c. If four identical copies of die 800a are formed with a data pad placed at one of position 860c, position 862c, position 864c, and position 866c and dummy data pads placed at the others of position 860c, position 862c, position 864c, and position 866c, when the identical copies of die 800a are flipped, rotated, and rotated and flipped, and stacked, one above another, the data pads will align with dummy data pads of other dies. Similarly, according to layout 802a of FIG. 8A, a data pad may be placed at one of position 860d, position 862d, position 864d, and position 866d and dummy data pads may be placed at the others of position 860d, position 862d, position 864d, and position 866d. If four identical copies of die 800a are formed with a data pad placed at one of position 860d, position 862d, position 864d, and position 866d and dummy data pads placed at the others of position 860d, position 862d, position 864d, and position 866d, when the identical copies of die 800a are flipped, rotated, and rotated and flipped, and stacked, one above another, the data pads will align with dummy data pads of other dies.

Similarly, according to layout 802a of FIG. 8A, the same category of common data pad may be placed at all of position 860a, position 862a, position 864a, and position 866a. If four identical copies of die 800a are formed with the same category of common data pad placed at all of position 860a, position 862a, position 864a, and position 866a, when the identical copies of die 800a are flipped, rotated, and rotated and flipped, and stacked, the same category of common data pads would align. Similarly, according to layout 802a of FIG. 8A, the same category of common data pad (e.g., a different category than is at other common data pads) may be placed at all of position 860b, position 862b, position 864b, and position 866b. If four identical copies of die 800a are formed with the same category of common data pad placed at all of position 860b, position 862b, position 864b, and position 866b, when the identical copies of die 800a are flipped, rotated, and rotated and flipped, and stacked, the same category of common data pads would align. Similarly, according to layout 802a of FIG. 8A, the same category of common data pad (e.g., a different category than is at other common data pads) may be placed at all of position 860c, position 862c, position 864c, and position 866c. If four identical copies of die 800a are formed with the same category of common data pad placed at all of position 860c, position 862c, position 864c, and position 866c, when the identical copies of die 800a are flipped, rotated, and rotated and flipped, and stacked, the same category of common data pads would align. Similarly, according to layout 802a of FIG. 8A, the same category of common data pad (e.g., a different category than is at other common data pads) may be placed at all of position 860d, position 862d, position 864d, and position 866d. If four identical copies of die 800a are formed with the same category of common data pad placed at all of position 860d, position 862d, position 864d, and position 866d, when the identical copies of die 800a are flipped, rotated, and rotated and flipped, and stacked, the same category of common data pads would align.

Figure 8B:
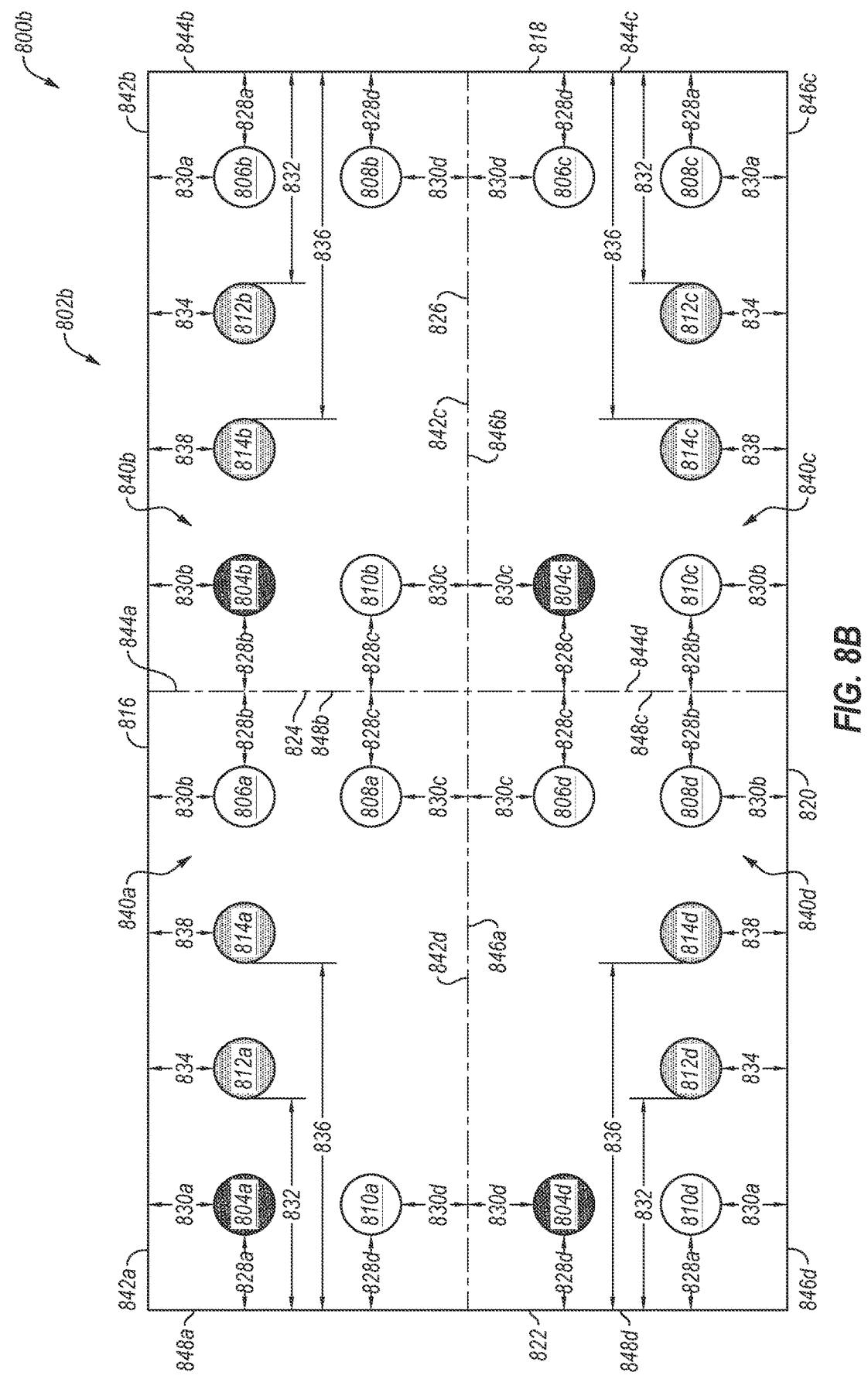
FIG. 8B is a plan-view diagram illustrating yet another example layout of data pads, dummy data pads and common data pads on an example die in accordance with at least one embodiment of the disclosure.
Figure 8C:
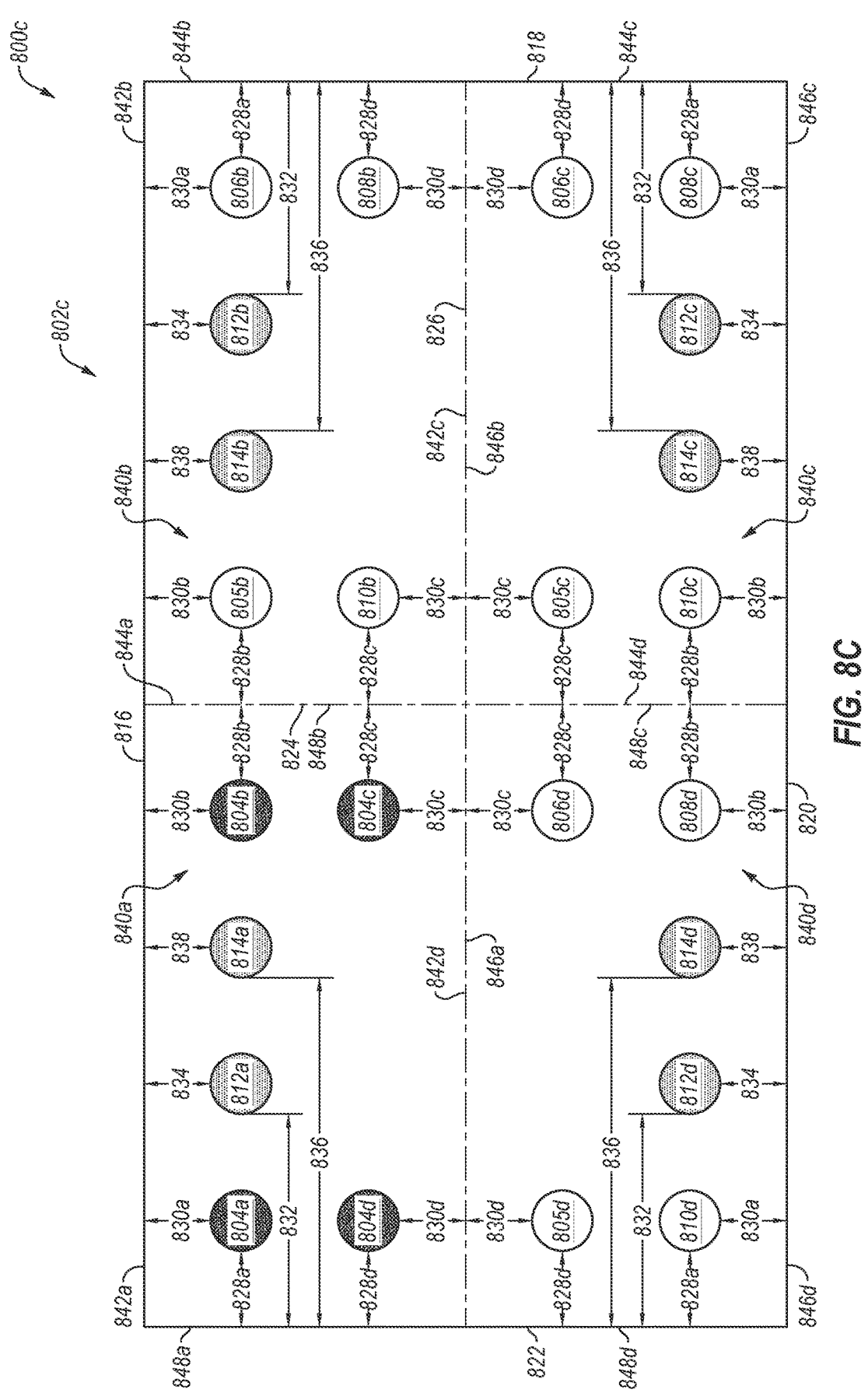
FIG. 8C is a plan-view diagram illustrating yet another example layout of data pads, dummy data pads and common data pads on an example die in accordance with at least one embodiment of the disclosure.
Figure 8D:
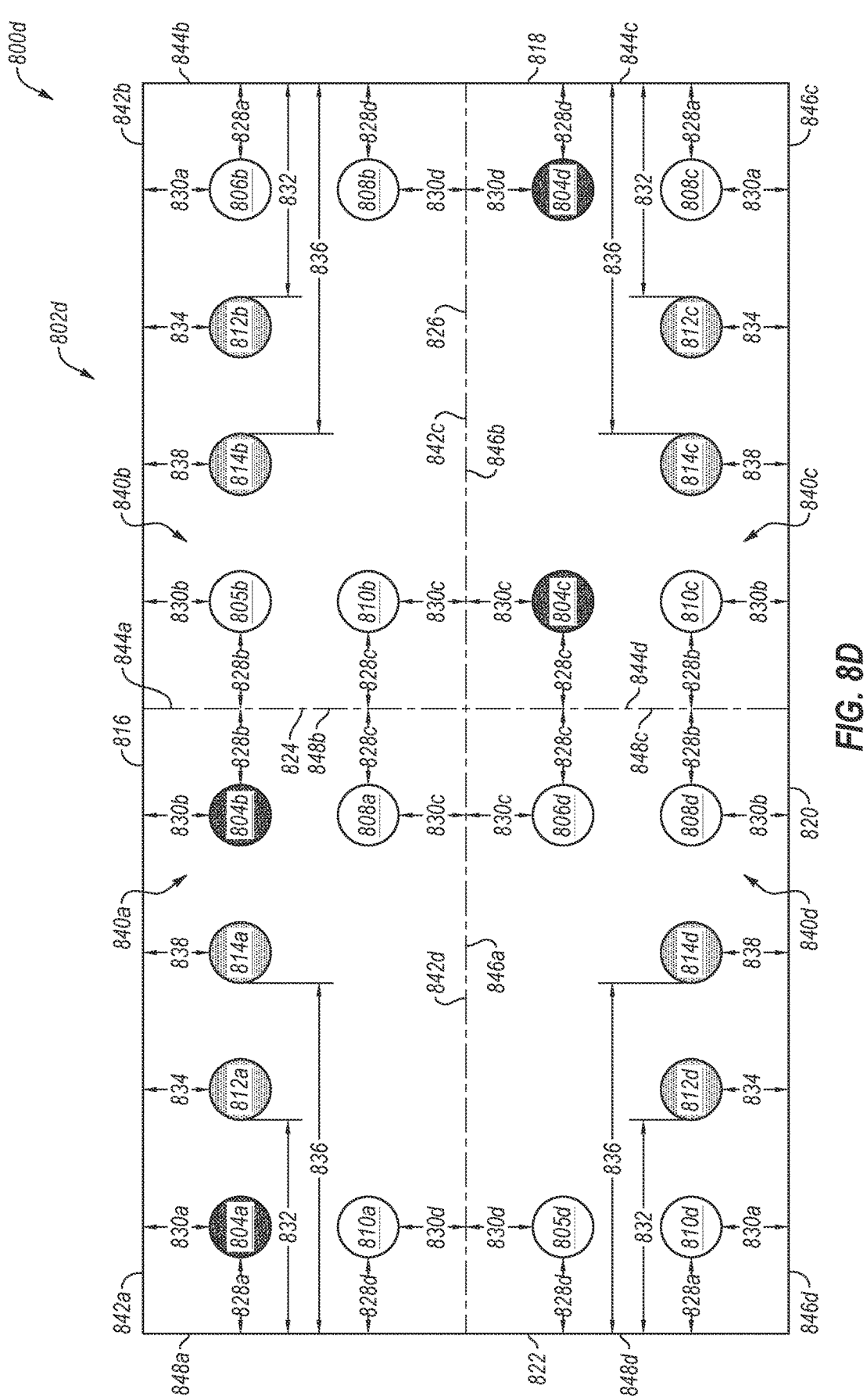
FIG. 8D is a plan-view diagram illustrating yet another example layout of data pads, dummy data pads and common data pads on an example die in accordance with at least one embodiment of the disclosure.

Layout 802b of die 800b of FIG. 8B, layout 802c of die 800c of FIG. 8C, and layout 802d of FIG. 8D are each examples according to the principles and patters of layout 802a of die 800a of FIG. 8A. Each of layout 802b, layout 802c, and layout 802d include respective data pads 804, respective dummy data pads 806, respective common data pads 812 of a first category, and respective common data pads 814 of a second category according to the principles and patters of layout 802a.

Turning to FIG. 8B, FIG. 8B is a plan-view diagram illustrating yet another example layout 802b of data pads, dummy data pads and common data pads on an example die 800b in accordance with at least one embodiment of the disclosure.

Layout 802b includes a data pad 804a in a position corresponding to position 860a of FIG. 8A, a dummy data pad 806b in a position corresponding to position 862a, a dummy data pad 808c in a position corresponding to position 864a, and a dummy data pad 810d in a position corresponding to position 866a. Additionally or alternatively, layout 802b includes a dummy data pad 806a in a position corresponding to position 860b of FIG. 8A, a data pad 804b in a position corresponding to position 862b of FIG. 8A, a dummy data pad 810c in a position corresponding to position 864b of FIG. 8A and a dummy data pad 808d in a position corresponding to position 866b of FIG. 8A. Additionally or alternatively, layout 802b includes a dummy data pad 808a in a position corresponding to position 860c of FIG. 8A, a dummy data pad 810b in a position corresponding to position 862c of FIG. 8A, a data pad 804c in a position corresponding to position 864c of FIG. 8A, and a dummy data pad 806d in a position corresponding to position 866c of FIG. 8A. Additionally or alternatively, layout 802b includes a dummy data pad 810a in a position corresponding to position 860d of FIG. 8A, a dummy data pad 808b in a position corresponding to position 862d of FIG. 8A, a dummy data pad 806c in a position corresponding to position 864d of FIG. 8A, and a data pad 804d in a position corresponding to position 866d of FIG. 8A.

Turning to FIG. 8C, FIG. 8C is a plan-view diagram illustrating yet another example layout 802c of data pads, dummy data pads and common data pads on an example die 800c in accordance with at least one embodiment of the disclosure.

Layout 802c includes a data pad 804a in a position corresponding to position 860a of FIG. 8A, a dummy data pad 806b in a position corresponding to position 862a, a dummy data pad 808c in a position corresponding to position 864a, and a dummy data pad 810d in a position corresponding to position 866a. Additionally or alternatively, layout 802c includes a data pad 804b in a position corresponding to position 860b of FIG. 8A, a dummy data pad 805b in a position corresponding to position 862b of FIG. 8A, a dummy data pad 810c in a position corresponding to position 864b of FIG. 8A and a dummy data pad 808d in a position corresponding to position 866b of FIG. 8A. Additionally or alternatively, layout 802c includes a data pad 804c in a position corresponding to position 860c of FIG. 8A, a dummy data pad 810b in a position corresponding to position 862c of FIG. 8A, a dummy data pad 805c in a position corresponding to position 864c of FIG. 8A, and a dummy data pad 806d in a position corresponding to position 866c of FIG. 8A. Additionally or alternatively, layout 802c includes a data pad 804d in a position corresponding to position 860d of FIG. 8A, a dummy data pad 808b in a position corresponding to position 862d of FIG. 8A, a dummy data pad 806c in a position corresponding to position 864d of FIG. 8A, and a dummy data pad 805d in a position corresponding to position 866d of FIG. 8A.

Turning to FIG. 8D, FIG. 8D is a plan-view diagram illustrating yet another example layout 802d of data pads, dummy data pads and common data pads on an example die 800d in accordance with at least one embodiment of the disclosure.

Layout 802d includes a data pad 804a in a position corresponding to position 860a of FIG. 8A, a dummy data pad 806b in a position corresponding to position 862a, a dummy data pad 808c in a position corresponding to position 864a, and a dummy data pad 810d in a position corresponding to position 866a. Additionally or alternatively, layout 802c includes a data pad 804b in a position corresponding to position 860b of FIG. 8A, a dummy data pad 805b in a position corresponding to position 862b of FIG. 8A, a dummy data pad 810c in a position corresponding to position 864b of FIG. 8A and a dummy data pad 808d in a position corresponding to position 866b of FIG. 8A. Additionally or alternatively, layout 802c includes a dummy data pad 808a in a position corresponding to position 860c of FIG. 8A, a dummy data pad 810b in a position corresponding to position 862c of FIG. 8A, a data pad 804c in a position corresponding to position 864c of FIG. 8A, and a dummy data pad 806d in a position corresponding to position 866c of FIG. 8A. Additionally or alternatively, layout 802c includes a dummy data pad 810a in a position corresponding to position 860d of FIG. 8A, a dummy data pad 808b in a position corresponding to position 862d of FIG. 8A, a data pad 804d in a position corresponding to position 864d of FIG. 8A, and a dummy data pad 805d in a position corresponding to position 866d of FIG. 8A.

A stack of substantially identical copies of any of die 800b, die 800c, or die 800d may be formed including some dies in a first orientation (e.g., unflipped and unrotated), some dies in a second orientation (e.g., flipped about axis 824), some dies in a third orientation (e.g., rotated (or flipped about axis 824 and axis 826)), and some dies in a fourth orientation (e.g., flipped and rotated (or flipped about axis 826)). Such a stack of dies may include straight inter-die connections between data pads and dummy data pads of the dies of the stack.

Additionally or alternatively, according to layout 802b of die 800b of FIG. 8B, layout 802c of die 800c of FIG. 8C, or layout 802d of die 800d of FIG. 8D, each of the quadrants 840 may include a common data pad 812 positioned a third distance 834 from boundary of the respective quadrant 840 and a fourth distance 832 from another boundary of the respective quadrant 840. For example, quadrant 840a may include common data pad 812a positioned distance 834 from boundary 842a and distance 832 from boundary 848a. Quadrant 840b may include common data pad 812b positioned distance 834 from boundary 842b and distance 832 from boundary 844b. Quadrant 840c may include common data pad 812c positioned distance 834 from boundary 846c and distance 832 from boundary 844c. Quadrant 840d may include common data pad 812d positioned distance 834 from boundary 846d and distance 832 from boundary 848d.

Each of common data pads 812 may be of the same category. For example, each of common data pads 812 may be first-category data pads.

Additionally or alternatively, according to layout 802b of die 800b of FIG. 8B, layout 802c of die 800c of FIG. 8C, or layout 802d of die 800d of FIG. 8D, each of the quadrants 840 may include a common data pad 814 positioned a fifth distance 838 from a boundary of the respective quadrant 840 and a sixth distance 836 from another boundary of the respective quadrant 840. For example, quadrant 840a may include common data pad 814a positioned distance 838 from boundary 842a and distance 836 from boundary 848a. Quadrant 840b may include common data pad 814b positioned distance 838 from boundary 842b and distance 836 from boundary 844b. Quadrant 840c may include common data pad 814c positioned distance 838 from boundary 846c and distance 836 from boundary 844c. Quadrant 840d may include common data pad 814d positioned distance 838 from boundary 846d and distance 836 from boundary 848d. Each of common data pads 814 may be of the same category. For example, each of common data pads 814 may be second-category data pads.

Such an arrangement of common data pads 812 and/or common data pads 814, layout 802b of die 800b of FIG. 8B, layout 802c of die 800c of FIG. 8C, or layout 802d of die 800d of FIG. 8D, may allow for common categories of common data pads of a first die to be aligned when substantially identical copies of die 800b, die 800c, die or die 800d are flipped, rotated, and/or flipped and rotated, and stacked. For example, common data pads 812 and/or common data pads 814 may be arranged such that if die 800b, die 800c, die or die 800d (or substantially identical copies of die 800b, die 800c, die or die 800d) were flipped substantially 180° about axis 824, common data pads 812 would be in positions formerly occupied by others of common data pads 812 and common data pad 814 would be in positions formerly occupied by others of common data pads 814. Further, common data pads 812 and/or common data pads 814 may be arranged such that if die 800b, die 800c, die or die 800d (or substantially identical copies of die 800b, die 800c, die or die 800d) were rotated substantially 180° about a vertical axis normal to a plane of die 800b, die 800c, die or die 800d, common data pads 812 would be in positions formerly occupied by others of common data pads 812 and common data pad 814 would be in positions formerly occupied by others of common data pads 814. Further, common data pads 812 and/or common data pads 814 may be arranged such that if die 800b, die 800c, die or die 800d (or substantially identical copies of die 800b, die 800c, die or die 800d) were flipped substantially 180° about axis 824 and rotated substantially 180° about a vertical axis normal to a plane of die 800b, die 800c, die or die 800d, common data pads 812 would be in positions formerly occupied by others of common data pads 812 and common data pad 814 would be in positions formerly occupied by others of common data pads 814. Thus, a stack of substantially identical copies of die 800b, die 800c, die or die 800d may be formed including some dies in a first orientation (e.g., unflipped and unrotated), some dies in a second orientation (e.g., flipped), some dies in a third orientation (e.g., rotated), and some dies in a fourth orientation (e.g., flipped and rotated). Such a stack of dies may include straight inter-die connections between common categories of common data pads.

Additionally or alternatively, common data pads 812 and/or common data pads 814 may be semi-common data pads to conduct signals common to half of the dies of a stack of dies. For example, half of common data pads 812 may be common data pads and half of common data pads 812 may be dummy common data pads. For example, common data pad 812a and common data pad 812b may be common data pads coupled to circuits of die 800a and common data pad 812c and common data pad 812d may be dummy common data pads not coupled to a circuit of die 800a. According to such an example, dies in the first orientation (e.g., unrotated and unflipped) and dies in a second orientation (e.g., flipped) may receive a signal from an inter-layer connection at common data pad 812a and common data pad 812b respectively, and may route the signals to respective circuits of the respective dies 800a. Yet, dies in the third orientation (e.g., rotated) and dies in a fourth orientation (e.g., flipped and rotated) may receive the signals from the inter-layer connection at dummy common data pad 812c and dummy common data pad 812d respectively, and may not route the receive signal to any circuit. As another example, common data pad 812a and common data pad 812c may be common data pads coupled to circuits of die 800a and common data pad 812b and common data pad 812d may be dummy common data pads not coupled to a circuit of die 800a. According to such an example, dies in the first orientation (e.g., unrotated and unflipped) and dies in a third orientation (e.g., rotated) may receive a signal from an inter-layer connection at common data pad 812a and common data pad 812c respectively, and may route the signals to respective circuits of the respective dies 800a. Yet, dies in the second orientation (e.g., flipped) and dies in a fourth orientation (e.g., flipped and rotated) may receive the signals from the inter-layer connection at dummy common data pad 812b and dummy common data pad 812d respectively, and may not route the receive signal to any circuit.

As mentioned above, TSV and peripheral circuit area 206 of FIG. 2A may be arranged according to the principles and patterns illustrated and described with regard to layout 802a, of die 800a. For example, according to the principles and patterns of layout 802a, the layout of data pads and dummy data pads of a region (e.g., a DW or AW region) may correspond to the layout of data pads and dummy data pads of other regions. For example, a layout of data pads and dummy data pads of DW0 region of ChA of FIG. 2A relative to a top-left corner of the DW0 region may be the same as the layout of data pads and dummy data pads of a DW1 region of ChD, a DW1 region of ChL, and a DW0 region of ChI relative to their respective top-left corners of their respective DW regions. The result of this layout of data pads and dummy data pads is that when copies of die 200 are flipped, rotated, or flipped and rotated and stacked above die 200, the data pads of DW0 region of ChA of die 200 align with the dummy data pads of the DW1 region of ChD (when flipped), the dummy data pads of the DW1 region of ChL (when rotated), or the dummy data pads of the DW0 region of ChI (when flipped and rotated) of the respective copies of die 200. The same holds true for a DW1 region of ChA and a DW0 region of ChD, a DW0 of ChL, and a DW1 region of ChI, for example.

Similarly, according to the principles and patterns of layout 802a, the layout of categories of common data pads of regions (e.g., DW regions and AW regions) may correspond to the layout of categories of common data pads of other regions. For example, a DW0 region of ChA of FIG. 2A relative to a top left corner of the DW0 region of ChA of FIG. 2A may be the same of the layout of the categories of common data pads of a DW1 region of ChD relative to a top right corner of the DW1 region of ChD, the layout of the categories of common data pads of a DW1 region of ChL relative to a bottom-right corner of the DW1 region of ChL, and the layout of the categories of common data pads of a DW0 region of ChI relative to a bottom-left corner of the DW0 region of ChI. The result of this layout of categories of common data pads is that when a copy of die 200 is rotated, flipped, or flipped and rotated, and stacked above die 200, the categories of common data pads of the DW0 of ChA of die 200 align with the same categories of common data pads of the DW1 region of ChD (when flipped), of the DW1 region of ChL (when rotated), and the DW0 region of ChI (when rotated and flipped) of the respective copies of die 200. The same holds true for a DW1 region of ChA, a DW0 region of ChD, a DW0 region of ChL, and a DW1 region of ChL, for example.

Further, the layout of data pads, dummy data pads, and common data pads within each DW region (or AW region) may follow the principles and patterns of layout 802a, relative to the DW region (or AW region respectively). Thus, each DW region (or AW region) may be viewed as a die 800a and may follow the principles and patterns of layout 802a.

Figure 9A:
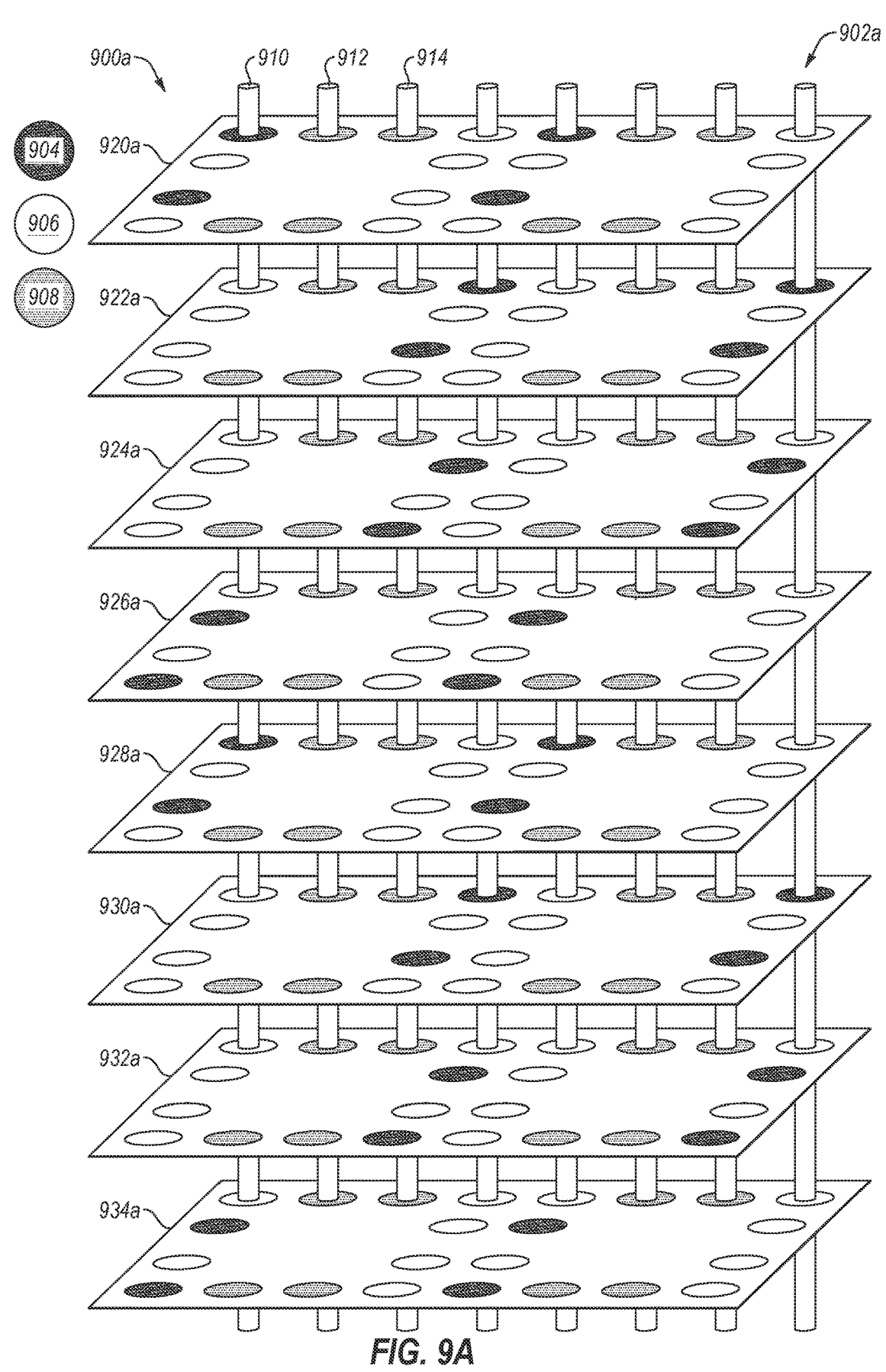
FIG. 9A is a perspective-view diagram illustrating yet another example stack of dies in accordance with at least one embodiment of the disclosure.

FIG. 9A is a perspective-view diagram illustrating yet another example stack 900a of dies 902a in accordance with at least one embodiment of the disclosure. The layout of data pads 904, dummy data pads 906, and common data pads 908 of each of dies 902a may be the same, or substantially similar. The layout of data pads 904, dummy data pads 906, and common data pads 908 may allow for multiple instances of the same die to be flipped relative to one another, rotated relative to one another, and/or flipped and rotated relative to one another and to be stacked.

Stack 900a includes some dies (e.g., die 920a and die 928a) that are unflipped and unrotated, some dies (e.g., die 922a and die 930a) that are flipped substantially 180° about respective axes in a plane of the respective dies, some dies (e.g., die 924a and die 932a) that are rotated about a vertical axis normal to the respective dies, and some dies (e.g., die 926a and die 934a) that are flipped substantially 180° about respective axes in a plane of the respective dies and rotated about a vertical axis normal to the respective dies. Stack 900a (including dies that are unflipped and unrotated, dies that are flipped, dies that are rotated, and dies that are flipped and rotated) may allow for alignment of data pads 904 with dummy data pads 906 and alignment of common categories of common data pads 908 which may allow for straight inter-die connections (e.g., inter-die connection 910, inter-die connection 912, and inter-die connection 914), e.g., without lateral-connection portions.

Each of dies 902a may follow the principles and patterns of layout 802a of FIG. 8A. In particular, each of dies 902a may be an example of die 800b of FIG. 8B. For example, the position of data pads 904 in each quadrant of die 920a relative to a given corner of the quadrant die 920a may be the same. Additionally, the position of three corresponding dummy data pads 906 in each quadrant of die 920a relative the three other corners of the quadrant may be reflective of (e.g., the left-to-right reverse, the top-to-bottom-reverse, or the left-to-right and top-to-bottom reverse (where "top" refers to the top when viewed from a plan view e.g., as illustrated by FIG. 8A)) the position of the data pad 904 relative to the given corner. Additionally or alternatively, the arrangement of categories of common data pads 908 of die 920a may be symmetric about an axis and/or symmetric about a center line.

In stack 900a, every four adjacent dies 902a, e.g., 920a, die 922a, die 924a, and die 926a may be in different orientations e.g., unrotated and unflipped, flipped, rotated, or rotated and flipped. Further, in some embodiments, every fourth die may be in the same orientation (e.g., the first die and the fifth die of a stack may be in the same orientation). For example, die 920a and die 928a are in a first orientation, e.g., unflipped and unrotated. Die 922a and die 930a are in a second orientation, e.g., flipped. Die 924a and die 932a are in a third orientation, e.g., rotated. Die 926a and die 934a are in a fourth orientation, e.g., flipped and rotated.

Stack 900a is illustrated in FIG. 9A including eight dies 902a for descriptive purposes. Any number of dies may be included in embodiments. In FIG. 9A, only eight inter-die connections are illustrated and only three inter-die connections 910, 912, and 914 are labeled with reference numbers for descriptive purposes. Any number of inter-die connections may be included in embodiments, e.g., one inter-die connection for all the data pads and all the common data pads of all the dies 902.

Figure 9B:
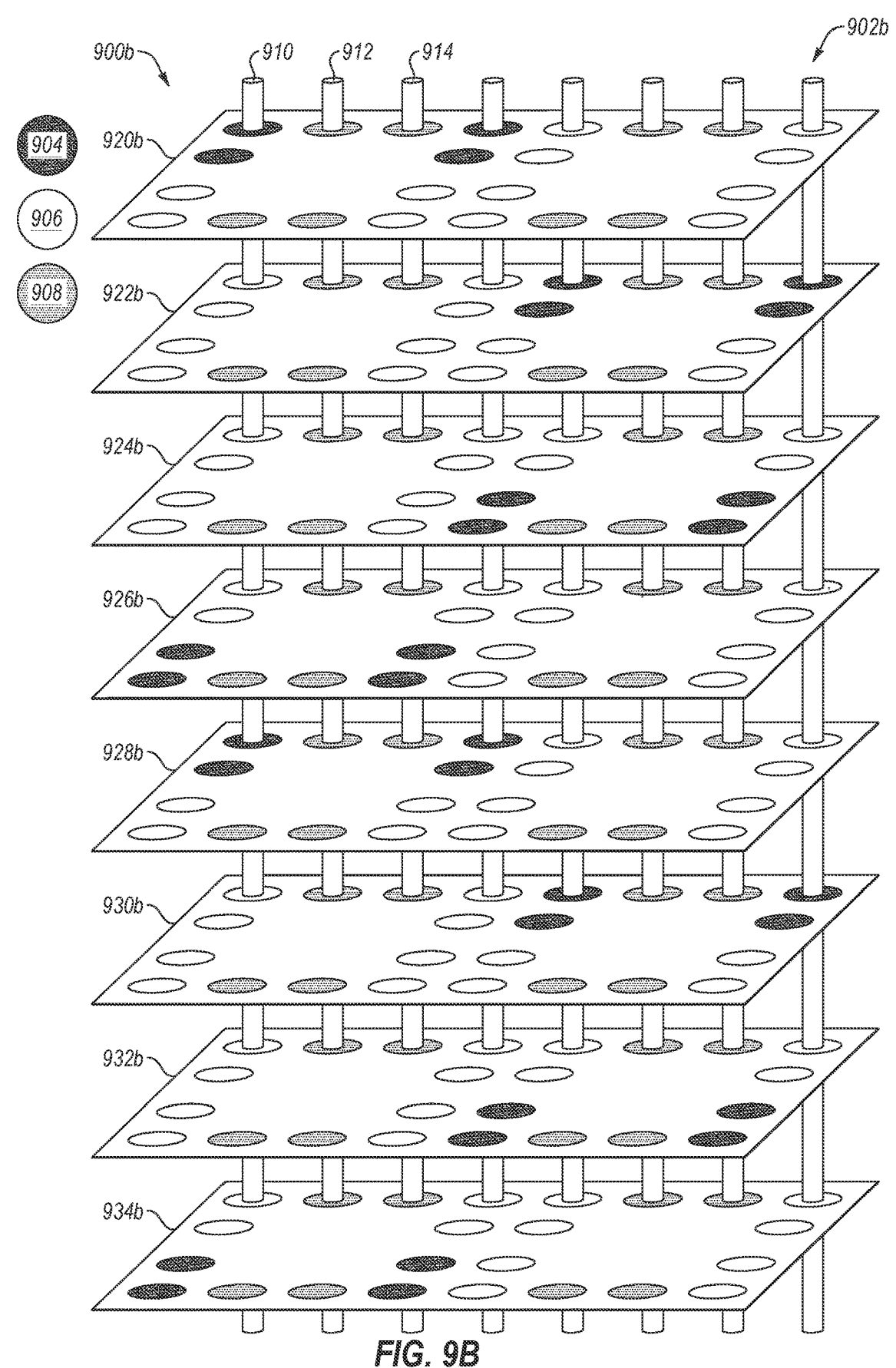
FIG. 9B is a perspective-view diagram illustrating yet another example stack of dies in accordance with at least one embodiment of the disclosure.

FIG. 9B is a perspective-view diagram illustrating yet another example stack 900b of dies 902b in accordance with at least one embodiment of the disclosure. Each of dies 902b (including die 920b, die 922b, die 924b, die 926b, die 928b, die 930b, die 932b, and die 934b) may follow the principles and patterns of layout 802a of FIG. 8A. In particular, each of dies 902b may be an example of die 800c of FIG. 8C.

Figure 9C:
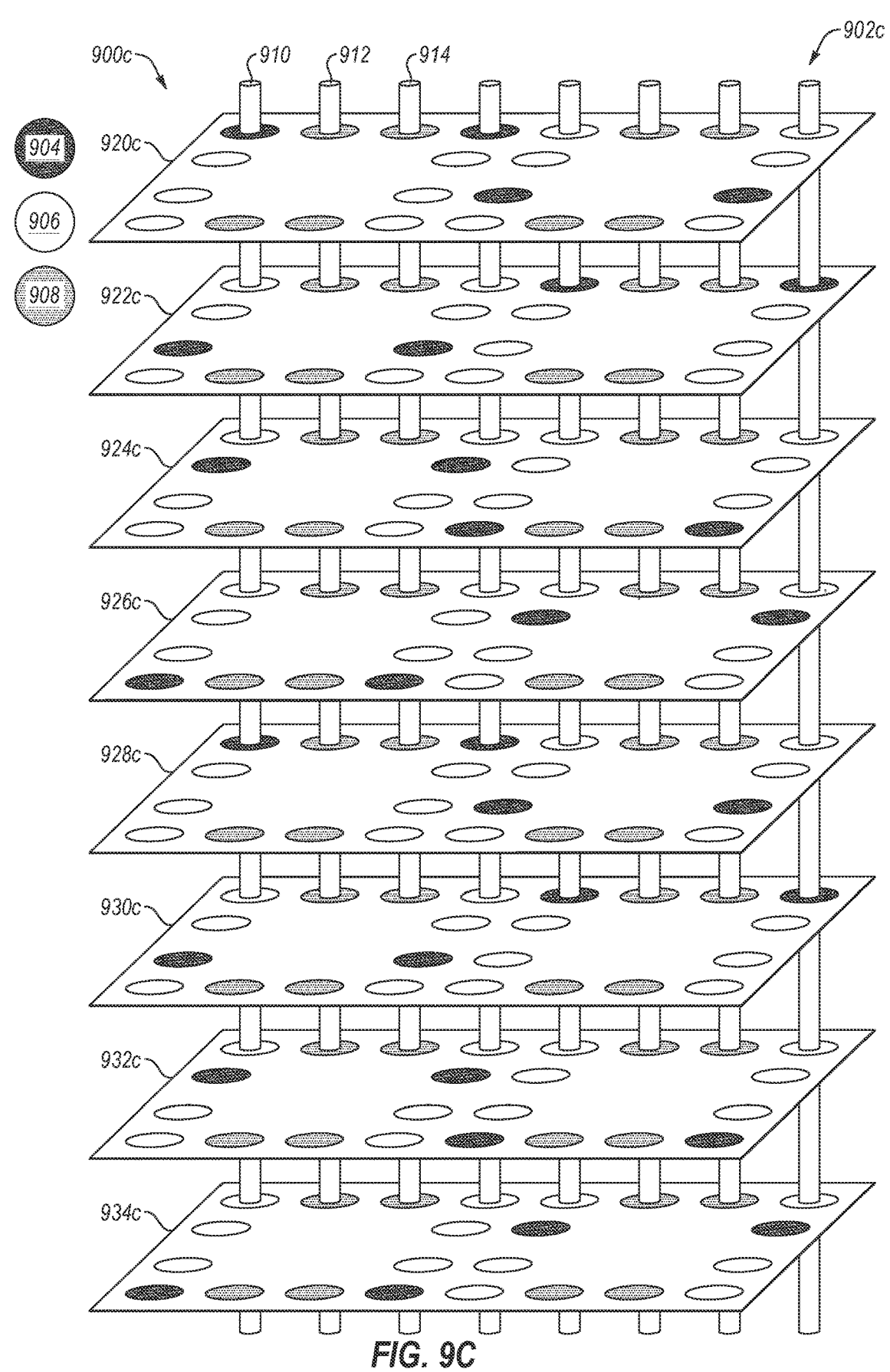
FIG. 9C is a perspective-view diagram illustrating yet another example stack of dies in accordance with at least one embodiment of the disclosure.

FIG. 9C is a perspective-view diagram illustrating yet another example stack 900c of dies 902c in accordance with at least one embodiment of the disclosure. Each of dies 902c (including die 920c, die 922c, die 924c, die 926c, die 928c, die 930c, die 932c, and die 934c) may follow the principles and patterns of layout 802a of FIG. 8A. In particular, each of dies 902c may be an example of die 800d of FIG. 8D.

Figure 10:
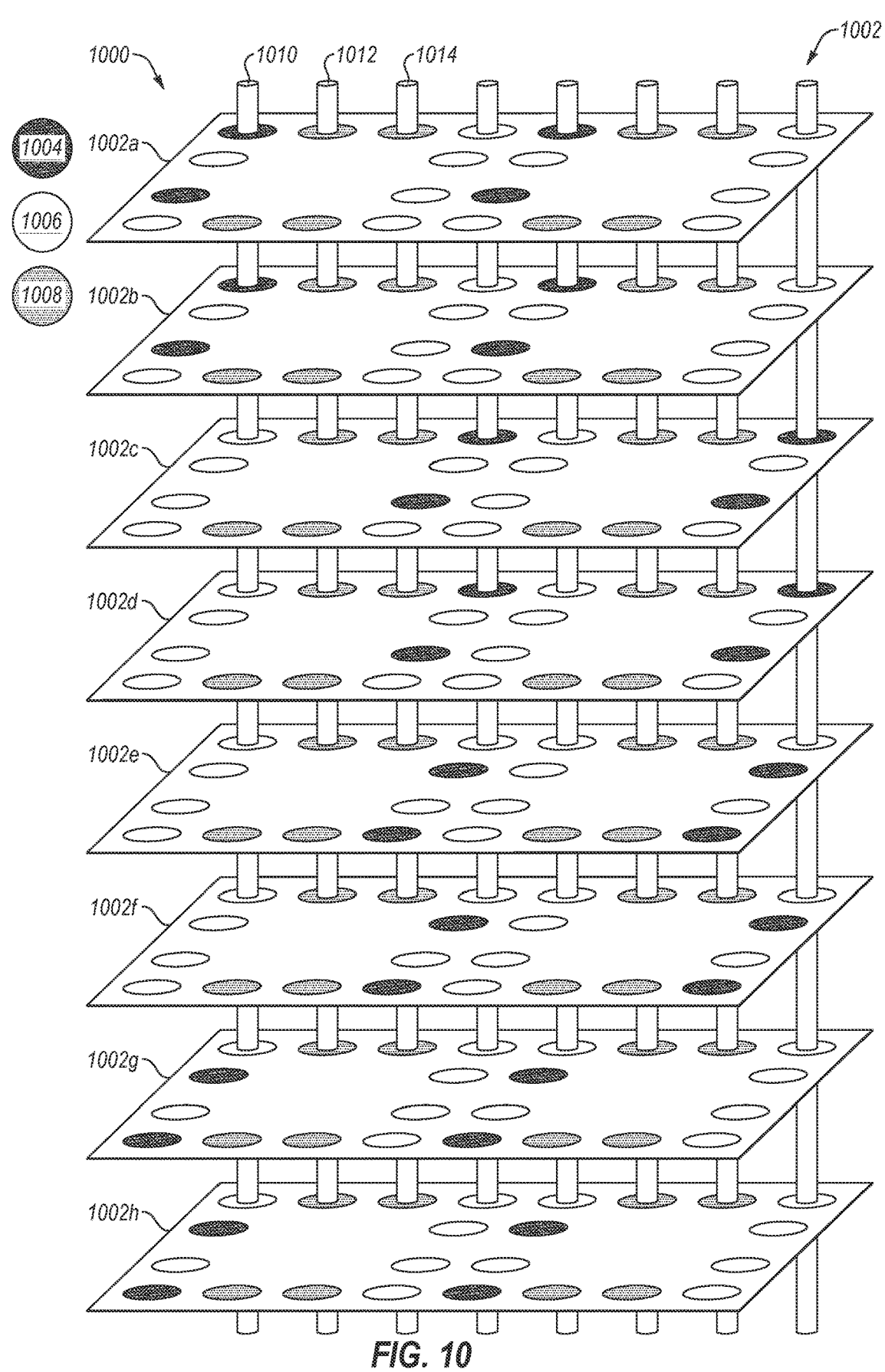
FIG. 10 is a perspective-view diagram illustrating yet another example stack of dies in accordance with at least one embodiment of the disclosure.

FIG. 10 is a perspective-view diagram illustrating yet another example stack 1000 of dies 1002 in accordance with at least one embodiment of the disclosure. The layout of data pads 1004, dummy data pads 1006, and common data pads 1008 of all of dies 1002 may be the same, or substantially similar. The layout of data pads 1004, dummy data pads 1006, and common data pads 1008 may allow for multiple instances of die 1002 to be flipped relative to one another, rotated relative to one another, and/or flipped and rotated relative to one another and to be stacked.

Stack 1000 includes some dies (e.g., die 1002a and die 1002b) that are unflipped and unrotated, some dies (e.g., die 1002c and die 1002d) that are flipped substantially 180° about respective axes in a plane of the respective dies, some dies (e.g., die 1002e and die 10020) that are rotated about a vertical axis normal to the respective dies, and some dies (e.g., die 1002g and die 1002h) that are flipped substantially 180° about respective axes in a plane of the respective dies and rotated about a vertical axis normal to the respective dies. Stack 1000 (including dies that are unflipped and unrotated, dies that are flipped, dies that are rotated, and dies that are flipped and rotated) may allow for alignment of data pads 1004 with dummy data pads 1006 and alignment of common categories of common data pads 1008 which may allow for straight inter-die connections (e.g., inter-die connection 1010, inter-die connection 1012, and inter-die connection 1014), e.g., without lateral-connection portions.

Dies 1002 may follow the principles and patterns of layout 802a of FIG. 8A. In particular, each of dies 1002 may be an example of die 800b of FIG. 8B. For example, the position of data pads 1004 in each quadrant of die 1002a relative to a given corner of the quadrant die 1002a may be the same. Additionally, the position of three corresponding dummy data pads 1006 in each quadrant of die 1002a relative the three other corners of the quadrant may be reflective of (e.g., the left-to-right reverse, the top-to-bottom-reverse, or the left-to-right and top-to-bottom reverse (where "top" refers to the top when viewed from a plan view e.g., as illustrated by FIG. 8)) the position of the data pad 1004 relative to the given corner. Additionally or alternatively, the arrangement of categories of common data pads 1008 of die 1002a may be symmetric about an axis and/or symmetric a center line.

In stack 1000, die 1002 of a separate quarters of stack 1000 include dies that are oriented in different orientations e.g., unrotated and unflipped, flipped, rotated, and rotated and flipped. For example, in stack 1000, dies 1002 of a top quarter of stack 1000, e.g., die 1002a and die 1002b, are in a first orientation (e.g., unrotated and unflipped). Dies 1002 of a top-middle quarter of stack memory device 100, e.g., die 1002c and die 1002d, are in a second orientation (e.g., flipped about an axis in a plane of the respective dies relative to die 1002a). Dies 1002 of a bottom-middle quarter of stack 1000, e.g., die 1002e and die 1002f, are in a third orientation, (e.g., rotated 180° about an axis normal to the respective dies relative to die 1002a). Dies 1002 of a bottom quarter of stack 1000, e.g., die 1002g and die 1002h, are in a fourth orientation, e.g., rotated and flipped relative to die 702a.

Arranging dies 1002 having a common orientation (e.g., unrotated and unflipped, flipped, rotated, and rotated and flipped) adjacent to one another in stack 1000 (e.g., in the same quarters of stack 1000) may be advantageous for at least the reasoned described above with regard to FIG. 5.

Stack 1000 is illustrated in FIG. 10 including four dies 1002 for descriptive purposes. Any number of dies may be included in embodiments. In FIG. 10, only eight inter-die connections are illustrated and only three inter-die connections 1010, 1012, and 1014 are labeled with reference numbers for descriptive purposes. Any number of inter-die connections may be included in embodiments, e.g., one inter-die connection for all the data pads and all the common data pads of all the dies 1002.

Stack 900b of FIG. 9B, and/or stack 900c of FIG. 9C may be stacked, or ordered in a stack, according to the principles of FIG. 10. In particular, dies having a common orientation, (e.g., unrotated and unflipped, flipped, rotated, and rotated and flipped) may be arranged adjacent to one another in a stack (e.g., in the same quarters of stack). For example, die 920a (of stack 900b or stack 900c) may be arranged adjacent to die 928a (of stack 900b or stack 900c), die 922a (of stack 900b or stack 900c) may be arranged adjacent to die 930a (of stack 900b or stack 900c), die 924a (of stack 900b or stack 900c) may be arranged adjacent to die 932a (of stack 900b or stack 900c), and die 926a (of stack 900b or stack 900c) may be arranged adjacent to die 934a (of stack 900b or stack 900c).

With regard to die 800a and layout 802a of FIG. 8A, die 800b and layout 802b of FIG. 8B, die 800c and layout 802c of FIG. 8C, die 800d and layout 802d of FIG. 8D, stack 900a and dies 902a of FIG. 9A, stack 900b and dies 902b of FIG. 9B, stack 900c and dies 902c of FIG. 9C, and stack 1000 and dies 1002 of FIG. 10, all references to "flipping" and "flipped dies" may refer instead to using mirrored identical dies. For example, rather than flipping a substantially identical copy of die 800a to stack above die 800a, a mirrored-identical copy of die 800a may be stacked above die 800a, e.g., in stack 902a, or in stack 1000. As another example, rather than flipping and rotating a substantially identical copy of die 800a to stack above die 800a, a mirrored-identical copy of die 800a may be rotated and stacked above die 800a, e.g., in stack 902a, or in stack 1000. As another example, die 922a, rather than being flipped, may be a mirror-identical copy of die 920*a*. Further, die 926*a*, rather than being rotated and flipped, may be a mirror-identical copy of die 920*a*, rotated.

FIG. 11 is a flowchart illustrating an example method 1100 in accordance with at least one embodiment of the disclosure. Method 1100 may be arranged in accordance with at least one embodiment described in the disclosure. Method 1100 may be a part of making memory device 100 of FIG. 1, stack 400 of FIG. 4, stack 500, of FIG. 5, stack 900*a* of FIG. 9A, stack 900*b* of FIG. 9B, stack 900*c* of FIG. 9C, stack 1000 of FIG. 10, system 1700 of FIG. 17, electronic system 1800 of FIG. 18, or another device or system. Although illustrated as discrete blocks, various blocks may be divided into additional blocks, combined into fewer blocks, or eliminated, depending on the desired implementation.

At block 1102, dies may be oriented and stacked such that a first substantially half of the dies are oriented in a first orientation and a second substantially half of the dies are oriented in a second orientation. Each of the second substantially half of the dies oriented in the second orientation may be flipped relative to the first substantially half of the dies oriented in the first orientation about a respective axis in a respective plane of respective die. The orientation and stacking may be such that data pads of the first substantially half of the dies align with dummy data pads of the second substantially half of the dies and dummy data pads of the first substantially half of the dies align with data pads of the second substantially half of the dies. Each of the dies may be substantially identical to each of the other dies. As an example, stack 400 of FIG. 4 or stack 500 of FIG. 5 may be examples of dies oriented and stacked at block 1102.

At block 1104, data pads of at least one of the first substantially half of the dies may be electrically coupled with dummy data pads of at least one of the second substantially half of the dies. Inter-die connection 410 of FIG. 4, inter-die connection 412 of FIG. 4, inter-die connection 510 of FIG. 5, inter-die connection 512 of FIG. 5, inter-die connection 610 of FIG. 6, and inter-die connection 612 of FIG. 6 may be examples of inter-die connections providing for the electrical couplings formed at block 1104.

At block 1106, dummy data pads of the at least one of the first substantially half of the dies may be electrically coupled with data pads of the at least one of the second substantially half of the dies. Inter-die connection 410 of FIG. 4, inter-die connection 412 of FIG. 4, inter-die connection 510 of FIG. 5, inter-die connection 512 of FIG. 5, inter-die connection 610 of FIG. 6, and inter-die connection 612 of FIG. 6 may be examples of inter-die connections providing for the electrical couplings formed at block 1106.

In some embodiments, block 1102 may include orienting and stacking the dies into a stack such that every other die in the stack is oriented in the first orientation e.g., as illustrated by and described with regard to stack 400 of FIG. 4. In other embodiments, block 1102 may include orienting and stacking the dies into a stack such that a top or bottom substantially half or the stack is oriented in the first orientation e.g., as illustrated by and described with regard to stack 500 of FIG. 5.

In some embodiments, according to 1102, the first substantially half of the dies oriented in the first orientation may include a first substantially quarter of the dies oriented in a third orientation and a second substantially quarter of the dies oriented in a fourth orientation, each of the second substantially quarter of the dies oriented in the fourth orientation being rotated relative to the first substantially quarter of the dies oriented in the third orientation about a vertical axis normal to a plane of respective die. In other words, the first substantially half of the dies may be in the first orientation. Of the first substantially half of the dies, substantially half (i.e., the first substantial quarter of all of the dies) may be in the third orientation (that may be the same as the first orientation) and substantially half (i.e., the second substantial quarter of all of the dies) may be in a fourth orientation that is rotated 180° around an axis normal to the respective dies relative to the third orientation. Further, the second substantially half of the dies oriented in the second orientation comprises a third substantially quarter of the dies oriented in a fifth orientation and a fourth substantially quarter of the dies oriented in a sixth orientation, each of the fourth substantially quarter of the dies oriented in the sixth orientation being rotated relative to the third substantially quarter of the dies oriented in the fifth orientation about a vertical axis normal to a plane of respective die. In other words, the second substantially half of the dies may be in the second orientation, i.e., flipped relative to the first orientation. Of the second substantially half of the dies, substantially half (i.e., the third substantial quarter of all of the dies) may be in the fifth orientation (that may be the same as the second orientation) and substantially half (i.e., the fourth substantial quarter of all of the dies) may be in a sixth orientation that is rotated 180° around an axis normal to the respective dies relative to the fifth orientation. Such embodiments may be as illustrated by and described with regard to stack 900*a* of FIG. 9A, stack 900*b* of FIG. 9B, stack 900*c* of FIG. 9C, and/or stack 1000 of FIG. 10.

In such embodiments, block 1102 may include orienting and stacking the dies into a stack such a first of every four dies adjacent in the stack is oriented in the third orientation, a second of every four dies adjacent in the stack is oriented in the fifth orientation, a third of every four dies adjacent in the stack is oriented in the fourth orientation, and a fourth of every four dies adjacent in the stack is oriented in the sixth orientation, e.g., as illustrated by and described with regard to stack 900*a* of FIG. 9A, stack 900*b* of FIG. 9B, stack 900*c* of FIG. 9C. In other such embodiments, block 1102 may include orienting and stacking the dies into a stack such that one of a top quarter, a top-middle quarter, a bottom-middle quarter, or a bottom quarter of the stack comprises dies oriented in the third orientation, another one of the top quarter, the top-middle quarter, the bottom-middle quarter, or the bottom quarter of the stack comprises dies oriented in the fourth orientation, yet another one of the top quarter, the top-middle quarter, the bottom-middle quarter, or the bottom quarter of the stack comprises dies oriented in the fifth orientation, and yet another one of the top quarter, the top-middle quarter, the bottom-middle quarter, or the bottom quarter of the stack comprises dies oriented in the sixth orientation e.g., as illustrated by and described with regard to stack 1000 of FIG. 10.

FIG. 12 is a flowchart illustrating another example method 1200 in accordance with at least one embodiment of the disclosure. Method 1200 may be arranged in accordance with at least one embodiment described in the disclosure. Method 1200 may be a part of making memory device 100 of FIG. 1, stack 600 of FIG. 6, stack 700 of FIG. 7, stack 900*a* of FIG. 9A, stack 900*b* of FIG. 9B, stack 900*c* of FIG. 9C, stack 1000 of FIG. 10, system 1700 of FIG. 17, electronic system 1800 of FIG. 18, or another device or system. Although illustrated as discrete blocks, various blocks may be divided into additional blocks, combined into fewer blocks, or eliminated, depending on the desired implementation.

At block 1202, dies may be oriented and stacked such that a first substantially half of the dies are oriented in a first orientation and a second substantially half of the dies are oriented in a second orientation. Each of the second substantially half of the dies oriented in the second orientation may be rotated 180° relative to the first substantially half of the dies oriented in the first orientation about a respective axis normal to a plane of respective die. The orientation and stacking may be such that data pads of the first substantially half of the dies align with dummy data pads of the second substantially half of the dies and dummy data pads of the first substantially half of the dies align with data pads of the second substantially half of the dies. Each of the dies may be substantially identical to each of the other dies. As an example, stack 600 of FIG. 6 may be an example of dies oriented and stacked at block 1202.

At block 1204, data pads of at least one of the first substantially half of the dies may be electrically coupled with dummy data pads of at least one of the second substantially half of the dies. Inter-die connection 610 of FIG. 6 and inter-die connection 612 of FIG. 6 may be examples of inter-die connections providing for the electrical couplings formed at block 1204.

At block 1206, dummy data pads of the at least one of the first substantially half of the dies may be electrically coupled with data pads of the at least one of the second substantially half of the dies. Inter-die connection 610 of FIG. 6 and inter-die connection 612 of FIG. 6 may be examples of inter-die connections providing for the electrical couplings formed at block 1206.

In some embodiments, block 1202 may include orienting and stacking the dies into a stack such that every other die in the stack is oriented in the first orientation, e.g., as illustrated by FIG. 3 of U.S. Utility patent application Ser. No. 17/646,565. In other embodiments, block 1202 may include orienting and stacking the dies into a stack such that a top or bottom substantially half or the stack is oriented in the first orientation, e.g., as illustrated by and described with regard to stack 600 of FIG. 6.

FIG. 13 is a flowchart illustrating yet another example method 1300 in accordance with at least one embodiment of the disclosure. Method 1300 may be arranged in accordance with at least one embodiment described in the disclosure. Method 1200 may be a part of making memory device 100 of FIG. 1, stack 700 of FIG. 7, system 1700 of FIG. 17, electronic system 1800 of FIG. 18, or another device or system. Although illustrated as discrete blocks, various blocks may be divided into additional blocks, combined into fewer blocks, or eliminated, depending on the desired implementation.

At block 1302, dies may be oriented and stacked such that a first substantially quarter of the dies are oriented in a first orientation, a second substantially quarter of the dies are oriented in a second orientation, a third substantially quarter of the dies are oriented in a third orientation, and a fourth substantially quarter of the dies are oriented in a fourth orientation. Each of the second substantially quarter of the dies oriented in the second orientation may be rotated 90° relative to the first substantially quarter of the dies oriented in the first orientation about a respective axis normal to a plane of respective die. Each of the third substantially quarter of the dies oriented in the third orientation may be rotated 180° relative to the first substantially quarter of the dies oriented in the first orientation about a respective axis normal to a plane of respective die. Each of the fourth substantially quarter of the dies oriented in the fourth orientation may be rotated 270° relative to the first substantially quarter of the dies oriented in the first orientation about a respective axis normal to a plane of respective die. The orientation and stacking such that data pads of the first substantially quarter of the dies align with dummy data pads of the second substantially quarter of the dies, with dummy data pads of the third substantially quarter of the dies, and with dummy data pads of the fourth substantially quarter of the dies. Each of the dies may be substantially identical to each of the other dies. As an example, stack 700 of FIG. 7 may be an example of dies oriented and stacked at block 1302.

At block 1304, data pads of the first substantially quarter of the dies may be electrically coupled with dummy data pads of the second substantially quarter of the dies, with dummy data pads of the third substantially quarter of the dies, and with dummy data pads of the fourth substantially quarter of the dies. Inter-die connection 710 of FIG. 7 and inter-die connection 712 of FIG. 7 may be examples of inter-die connections providing for the electrical couplings formed at block 1304.

In some embodiments, block 1302 may include orienting and stacking the dies into a stack such a first of every four dies adjacent in the stack is oriented in the first orientation, a second of every four dies adjacent in the stack is oriented in the second orientation, a third of every four dies adjacent in the stack is oriented in the third orientation, and a fourth of every four dies adjacent in the stack is oriented in the fourth orientation, e.g., as illustrated by FIG. 5 of U.S. Utility patent application Ser. No. 17/646,565. In other embodiments, block 1302 may include orienting and stacking the dies into a stack such that one of a top quarter, a top-middle quarter, a bottom-middle quarter, or a bottom quarter of the stack comprises dies oriented in the first orientation, another one of the top quarter, the top-middle quarter, the bottom-middle quarter, or the bottom quarter of the stack comprises dies oriented in the second orientation, yet another one of the top quarter, the top-middle quarter, the bottom-middle quarter, or the bottom quarter of the stack comprises dies oriented in the third orientation, and yet another one of the top quarter, the top-middle quarter, the bottom-middle quarter, or the bottom quarter of the stack comprises dies oriented in the fourth orientation, e.g., as illustrated by and described with regard to stack 700 of FIG. 7.

FIG. 14 is a flowchart illustrating another example method 1400 in accordance with at least one embodiment of the disclosure. Method 1400 may be arranged in accordance with at least one embodiment described in the disclosure. Method 1400 may be a part of making memory device 100 of FIG. 1, stack 600 of FIG. 6, stack 700 of FIG. 7, stack 900a of FIG. 9A, stack 900b of FIG. 9B, stack 900c of FIG. 9C, stack 1000 of FIG. 10, system 1700 of FIG. 17, electronic system 1800 of FIG. 18, or another device or system. Although illustrated as discrete blocks, various blocks may be divided into additional blocks, combined into fewer blocks, or eliminated, depending on the desired implementation.

At block 1402, dies may be stacked. Each of a first subset of the dies may exhibit mirror symmetry with respect to each of a second subset of the dies. The stacking may be such that data pads of the first subset of the dies align with dummy data pads of the second subset of the dies and dummy data pads of the first subset of the dies align with data pads of the second subset of the dies. As an example, stack 400 of FIG. 4 or stack 500 of FIG. 5 may be examples of dies oriented and stacked at block 1402.

At block 1404, data pads of at least one of the first subset of the dies may be electrically coupled with dummy data pads of at least one of the second subset of the dies. Inter-die connection 410 of FIG. 4, inter-die connection 412 of FIG. 4, inter-die connection 510 of FIG. 5, inter-die connection 512 of FIG. 5, inter-die connection 610 of FIG. 6, and inter-die connection 612 of FIG. 6 may be examples of inter-die connections providing for the electrical couplings formed at block 1404.

At block 1406, dummy data pads of at least one of the first substantially half of the dies may be electrically coupled with data pads of the at least one of the second substantially half of the dies. Inter-die connection 410 of FIG. 4, inter-die connection 412 of FIG. 4, inter-die connection 510 of FIG. 5, inter-die connection 512 of FIG. 5, inter-die connection 610 of FIG. 6, and inter-die connection 612 of FIG. 6 may be examples of inter-die connections providing for the electrical couplings formed at block 1406.

In some embodiments, block 1402 may include orienting and stacking the dies into a stack such that every other die in the stack is oriented in the first orientation, e.g., as illustrated by stack 400 of FIG. 4. In other embodiments, block 1402 may include orienting and stacking the dies into a stack such that a top or bottom substantially half or the stack is oriented in the first orientation, e.g., as illustrated by and described with regard to stack 500 of FIG. 5.

Figure 15:
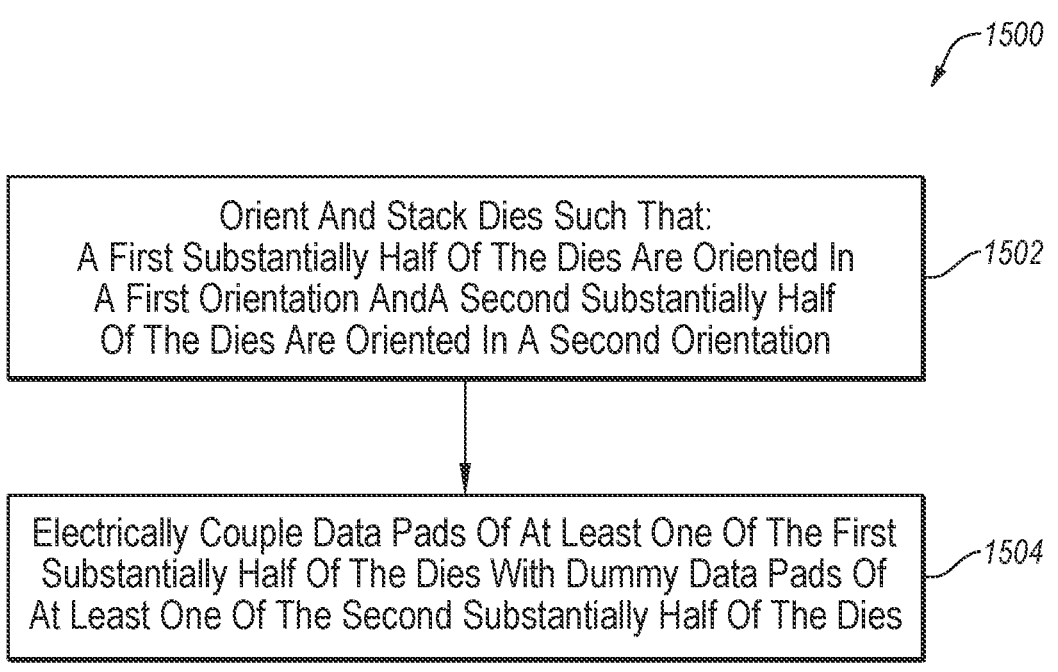
FIG. 15 is a flowchart illustrating yet another example method in accordance with at least one embodiment of the disclosure.

FIG. 15 is a flowchart illustrating another example method 1500 in accordance with at least one embodiment of the disclosure. Method 1500 may be arranged in accordance with at least one embodiment described in the disclosure. Method 1500 may be a part of making memory device 100 of FIG. 1, stack 600 of FIG. 6, stack 700 of FIG. 7, stack 900a of FIG. 9A, stack 900b of FIG. 9B, stack 900c of FIG. 9C, stack 1000 of FIG. 10, system 1700 of FIG. 17, electronic system 1800 of FIG. 18, or another device or system. Although illustrated as discrete blocks, various blocks may be divided into additional blocks, combined into fewer blocks, or eliminated, depending on the desired implementation.

At block 1502, dies may be oriented and stacked such that a first substantially half of the dies are oriented in a first orientation and a second substantially half of the dies are oriented in a second orientation. As an example the second orientation may be flipped relative to the first orientation, e.g., as illustrated and described with regard to stack 400 of FIG. 4. As another example, the second orientation may be the same as the first orientation, but, dies in the second orientation may be mirrored relative to the first orientation, e.g., as illustrated and described with regard to stack 400 of FIG. 4. As another example the second orientation may be rotated relative to the first orientation, e.g., as illustrated and described with regard to stack 600 of FIG. 6.

At block 1504, data pads of at least one of the first substantially half of the dies may be electrically coupled with dummy data pads of at least one of the second substantially half of the dies. Inter-die connection 410 of FIG. 4, inter-die connection 412 of FIG. 4, inter-die connection 510 of FIG. 5, inter-die connection 512 of FIG. 5, inter-die connection 610 of FIG. 6, and inter-die connection 612 of FIG. 6 may be examples of inter-die connections providing for the electrical couplings formed at block 1504.

In some embodiments, orienting and stacking the dies (e.g., at block 1502) may include orienting and stacking the dies into the stack such that a top or bottom substantially half of the stack is oriented in the first orientation, e.g., as illustrated and described with regard to stack 600 of FIG. 6.

FIG. 16 is a flowchart illustrating another example method 1600 in accordance with at least one embodiment of the disclosure. Method 1600 may be arranged in accordance with at least one embodiment described in the disclosure. Method 1600 may be a part of making memory device 100 of FIG. 1, stack 600 of FIG. 6, stack 700 of FIG. 7, stack 900a of FIG. 9A, stack 900b of FIG. 9B, stack 900c of FIG. 9C, stack 1000 of FIG. 10, system 1700 of FIG. 17, electronic system 1800 of FIG. 18, or another device or system. Although illustrated as discrete blocks, various blocks may be divided into additional blocks, combined into fewer blocks, or eliminated, depending on the desired implementation.

At block 1602, dies may be oriented and stacked such that: a first substantially quarter of the dies are oriented in a first orientation, a second substantially quarter of the dies are oriented in a second orientation, a third substantially quarter of the dies are oriented in a third orientation, and a fourth substantially quarter of the dies are oriented in a fourth orientation. As an example, the second orientation may be flipped relative to the first orientation, the third rotation may be rotated relative to the first orientation, and the fourth orientation may be flipped and rotated relative to the first orientation, e.g., as illustrated and described with regard to stack 900a of FIG. 9A. As another example, the second orientation may be the same as the first orientation, but, dies in the second orientation may be mirrored relative to dies in the first orientation, the third rotation may be rotated relative to the first orientation, and the fourth orientation may be the same as the third orientation, but, dies in the fourth orientation may be mirrored relative to dies in the first orientation e.g., as illustrated and described with regard to stack 900a of FIG. 9A. As another example, the second orientation may be rotated 90° relative to the first orientation, the third rotation may be rotated 180° the first orientation, and the fourth orientation may be rotated 270° relative to the first orientation e.g., as illustrated and described with regard to stack 700 of FIG. 7.

At block 1604, data pads of at least one of the first substantially quarter of the dies may be electrically coupled with: dummy data pads of at least one of the second substantially quarter of the dies; dummy data pads of at least one of the third substantially quarter of the dies; and dummy data pads of at least one of the fourth substantially quarter of the dies. Inter-die connection 710 of FIG. 7, inter-die connection 712 of FIG. 7, inter-die connection 910 of FIG. 9A, FIG. 9B, and FIG. 9C, and inter-die connection 1010 of FIG. 10, may be examples of inter-die connections providing for the electrical couplings formed at block 1504.

In some embodiments, orienting and stacking the dies (e.g., at block 1602) may include orienting and stacking the dies into a stack such that: one of a top quarter, a top-middle quarter, a bottom-middle quarter, or a bottom quarter of the stack includes dies oriented in the first orientation, another one of the top quarter, the top-middle quarter, the bottom-middle quarter, or the bottom quarter of the stack includes dies oriented in the second orientation, yet another one of the top quarter, the top-middle quarter, the bottom-middle quarter, or the bottom quarter of the stack includes dies oriented in the third orientation, and still another one of the top quarter, the top-middle quarter, the bottom-middle quarter, or the bottom quarter of the stack includes dies oriented in the fourth orientation, e.g., as illustrated and described with regard to stack 1000 of FIG. 10.

Modifications, additions, or omissions may be made to any of method 1100 of FIG. 11, method 1200 of FIG. 12, method 1300 of FIG. 13, method 1400 of FIG. 14, method 1500 of FIG. 15, and/or method 1600 of FIG. 16 without departing from the scope of the disclosure. For example, the operations of any of method 1100 of FIG. 11, method 1200 of FIG. 12, method 1300 of FIG. 13, method 1400 of FIG. 14, method 1500 of FIG. 15, and/or method 1600 of FIG. 16 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figures 17, 18:
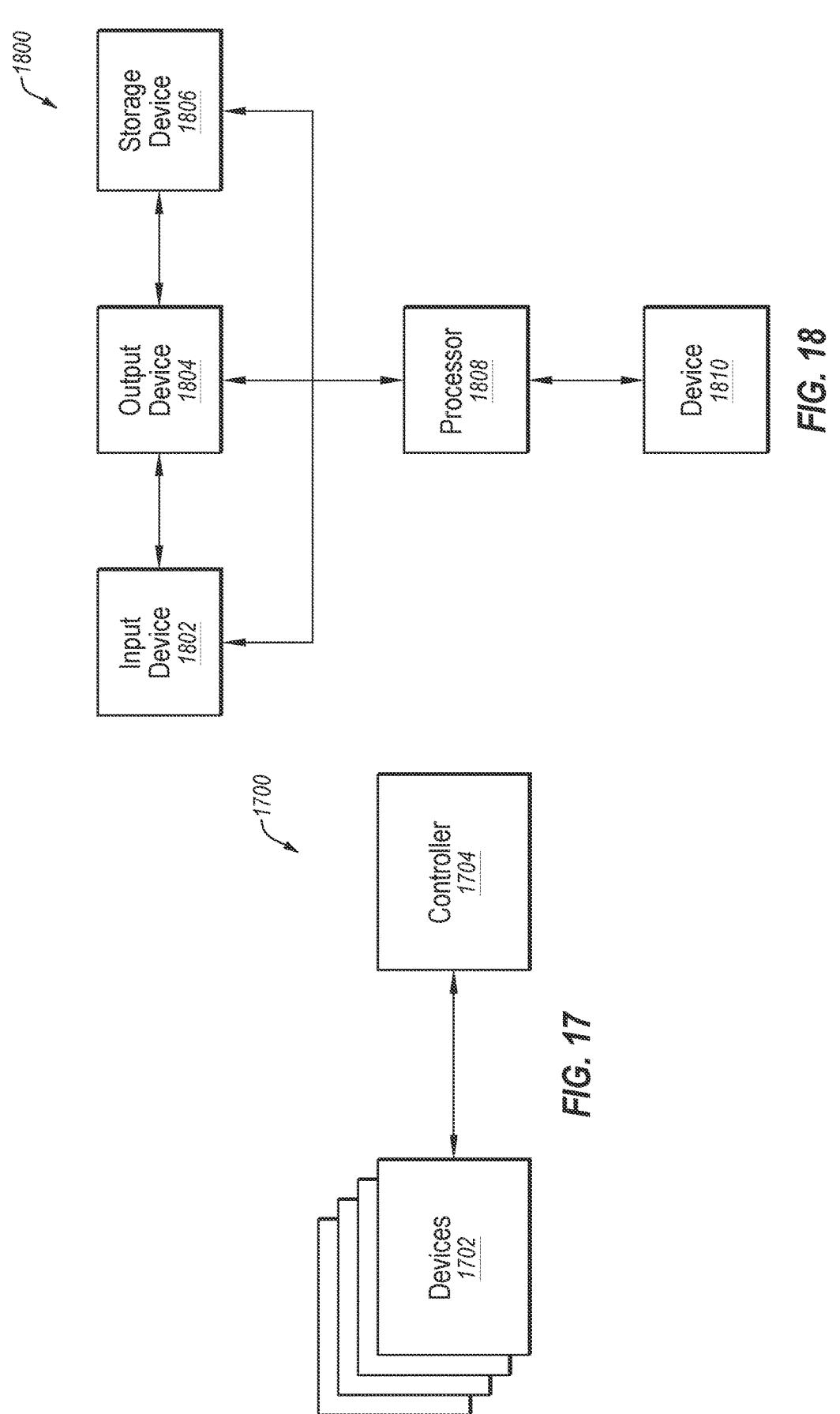
FIG. 17 is a simplified block diagram illustrating an example memory system, in accordance with at least one embodiment of the disclosure.
FIG. 18 is a simplified block diagram illustrating an example electronic system, in accordance with at least one embodiment of the disclosure.

FIG. 17 is a simplified block diagram illustrating an example system 1700 implemented in accordance with at least one embodiment of the disclosure. System 1700, which may include, for example, a semiconductor device, includes a number of devices 1702 and a controller 1704. Devices 1702 may be, or may include, for example, memory devices, e.g., memory device 100 of FIG. 1. Controller 1704 may be operatively coupled with devices 1702 so as to convey command/address signals to devices 1702. For example, in cases in which devices 1702 includes a memory device 100 of FIG. 1, controller 1704 may convey command/address signals (e.g., command/address signals received by command terminals 112 and/or address terminals 110 of FIG. 1) to devices 1702.

At least one of devices 1702 and/or controller 1704 of system 1700 may include one or more die with data pads, dummy data pads, and/or common data pads arranged according to layout 302 of FIG. 3 and/or layout 802a of FIG. 8A. Additionally or alternatively, at least one of devices 1702 and/or controller 1704 of system 1700 may include one or more die stacked and oriented as described with regard to stack 400 of FIG. 4, stack 500 of FIG. 5, stack 600 of FIG. 6, stack 700 of FIG. 7, stack 900a of FIG. 9A, stack 1000 of FIG. 10, method 1100 of FIG. 11, method 1200 of FIG. 12, method 1300 of FIG. 13, method 1400 of FIG. 14, method 1500 of FIG. 15, and/or method 1600 of FIG. 16.

FIG. 18 is a simplified block diagram illustrating an electronic system 1800 implemented in accordance with at least one embodiment of the disclosure. Electronic system 1800 includes at least one input device 1802, which may include, for example, a keyboard, a mouse, or a touch screen. Electronic system 1800 further includes at least one output device 1804, such as a monitor, a touch screen, or a speaker. Input device 1802 and output device 1804 are not necessarily separable from one another. Electronic system 1800 further includes a storage device 1806. Input device 1802, output device 1804, and storage device 1806 may be coupled to a processor 1808. Electronic system 1800 further includes a device 1810 coupled to processor 1808. Device 1810 may include at least a portion of system 1700 of FIG. 17. Electronic system 1800 may include, for example, a computing, processing, industrial, or consumer product. For example, without limitation, electronic system 1800 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments may include an apparatus including: circuits, a first edge, a second edge perpendicular to the first edge, a third edge opposite the first edge, and a fourth edge opposite the second edge. The apparatus may also include data pads variously electrically coupled to the circuits. The data pads may include a data pad positioned a first distance from the first edge and a second distance from the second edge. The apparatus may also include dummy data pads electrically isolated from the circuits. The dummy data pads may include a dummy data pad positioned substantially the first distance from the first edge and substantially the second distance from the fourth edge.

In such embodiments, the data pads include a first category of data pads and a second category of data pads. The data pads may include a first first-category data pad that is a third distance from the first edge and a fourth distance from the second edge, a second first-category data pad that is substantially the third distance from the first edge and substantially the fourth distance from the fourth edge, a first second-category data pad that is a fifth distance from the first edge and an sixth distance from the second edge, and a second second-category data pad that is substantially the fifth distance from the first edge and substantially the sixth distance from the fourth edge.

In such embodiments, the first category of data pads may communicate a first category of signals and the second category of data pads may communicate a second category of signals.

Various embodiments may include a method. The method may include orienting and stacking dies into a stack. Each of the dies may be substantially identical to each of the other dies. Alternatively, each of a first subset of the dies exhibits mirror symmetry with respect to each of a second subset of the dies. The method may also include electrically coupling data pads of one of the dies with dummy data pads of another one of the dies.

Various embodiments may include a method. The method may include orienting and stacking dies into a stack. Each of the dies may be substantially identical to each of the other dies. The method may include orienting and stacking the dies such that: a first substantially half of the dies are oriented in a first orientation, a second substantially half of the dies are oriented in a second orientation, the second orientation flipped substantially 180°, relative to the first orientation, about an axis in a respective plane of each of the respective dies, data pads of the first substantially half of the dies align with dummy data pads of the second substantially half of the dies, and dummy data pads of the first substantially half of the dies align with data pads of the second substantially half of the dies. The method may also include electrically coupling data pads of at least one of the first substantially half of the dies with dummy data pads of at least one of the second substantially half of the dies.

In such embodiments, orienting and stacking the dies include orienting and stacking the dies into the stack such that a top or bottom substantially half of the stack is oriented in the first orientation.

Various embodiments may include a method. The method may include orienting and stacking dies into a stack. Each of a first subset of the dies may exhibit mirror symmetry with respect to each of a second subset of the dies. The method may include orienting and stacking the dies such that: data pads of the first subset the dies align with dummy data pads of the second subset of the dies and dummy data pads of the first subset of the dies align with data pads of the second subset of the dies, The method may also include electrically coupling data pads of at least one of the first subset of the dies with dummy data pads of at least one of the second subset of the dies.

In such embodiments, orienting and stacking the dies may include orienting and stacking the dies into the stack such that dies of a top or bottom substantially half of the stack are of the first subset of the dies.

Various embodiments may include a method. The method may include orienting and stacking dies into a stack. Each of the dies may be substantially identical to each of the other dies. The method may include orienting and stacking the dies such that: a first substantially half of the dies are oriented in a first orientation, a second substantially half of the dies are oriented in a second orientation, the second orientation rotated substantially 180°, relative to the first orientation, about an axis normal to a plane of each of the respective dies, data pads of the first substantially half of the dies align with dummy data pads of the second substantially half of the dies, and dummy data pads of the first substantially half of the dies align with data pads of the second substantially half of the dies. The method may also include electrically coupling data pads of at least one of the first substantially half of the dies with dummy data pads of at least one of the second substantially half of the dies.

In such embodiments, orienting and stacking the dies may include orienting and stacking the dies into the stack such that a top or bottom substantially half of the stack is oriented in the first orientation.

Various embodiments may include an apparatus. The apparatus may include dies stacked into a stack, one above another. Each of the dies may be substantially identical to each of the other dies. Alternatively, each of a first subset of the dies may exhibit mirror symmetry with respect to each of a second subset of the dies. Each of the dies may include circuits, data pads variously electrically coupled to the circuits, and dummy data pads electrically isolated from the circuits, data pads of at least one of the dies electrically coupled to dummy data pads of another at least one of the dies.

Various embodiments may include an apparatus. The apparatus may include dies stacked into a stack, one above another. Each of the dies may be substantially identical to each of the other dies. Each of the dies may include circuits, data pads variously electrically coupled to the circuits, and dummy data pads electrically isolated from the circuits, data pads of at least one of the dies electrically coupled to dummy data pads of another at least one of the dies. A first substantially half of the dies may be oriented in a first orientation. A second substantially half of the dies may be oriented in a second orientation. The second orientation may be flipped substantially 180°, relative to the first orientation, about an axis in a respective plane of each of the respective dies. The dummy data pads may be arranged relative to the data pads such that respective data pads of dies oriented in the first orientation vertically align, in the stack, with respective dummy data pads of dies oriented in the second orientation.

In such embodiments, dies of a top or bottom substantially half of the stack may be oriented in the first orientation.

Various embodiments may include an apparatus. The apparatus may include dies stacked into a stack, one above another. Each of a first subset of the dies may exhibit mirror symmetry with respect to each of a second subset of the dies. Each of the dies may include circuits, data pads variously electrically coupled to the circuits, and dummy data pads electrically isolated from the circuits, data pads of at least one of the dies electrically coupled to dummy data pads of another at least one of the dies. The dummy data pads may be arranged relative to the data pads such that respective data pads of dies of the first subset vertically align, in the stack, with respective dummy data pads of dies of the second subset.

In such embodiments, dies of a top or bottom substantially half of the stack may be of the first subset.

Various embodiments may include an apparatus. The apparatus may include dies stacked into a stack, one above another. Each of the dies may be substantially identical to each of the other dies. Each of the dies may include circuits, data pads variously electrically coupled to the circuits, and dummy data pads electrically isolated from the circuits, data pads of at least one of the dies electrically coupled to dummy data pads of another at least one of the dies. A first substantially half of the dies may be oriented in a first orientation. A second substantially half of the dies may be oriented in a second orientation, the second orientation rotated substantially 180° about an axis normal to a plane of the respective die. The dummy data pads may be arranged relative to the data pads such that respective data pads of dies oriented in the first orientation vertically align, in the stack, with respective dummy data pads of dies oriented in the second orientation.

In such embodiments dies of a top or bottom substantially half of the stack may be oriented in the first orientation.

Various embodiments may include an apparatus. The apparatus may include circuits, a first edge, a second edge perpendicular to the first edge, a third edge opposite the first edge, and a fourth edge opposite the second edge. The apparatus may also include data pads variously electrically coupled to the circuits. The data pads may include a data pad positioned a first distance from the first edge and a second distance from the second edge. The apparatus may also include dummy data pads electrically isolated from the circuits. The dummy data pads may include: a first dummy data pad positioned substantially the first distance from the first edge and substantially the second distance from the fourth edge, a second dummy data pad positioned substantially the first distance from the third edge and substantially the second distance from the fourth edge, and a third dummy data pad positioned substantially the first distance from the third edge and substantially the second distance from the second edge.

In such embodiments, the data pads may include a first category of data pads and a second category of data pads. The data pads may include: a first first-category data pad that is a third distance from the first edge and a fourth distance from the second edge, a second first-category data pad that is substantially the third distance from the first edge and substantially the fourth distance from the fourth edge, a third first-category data pad that is substantially the third distance from the third edge and substantially the fourth distance from the fourth edge, a fourth first-category data pad that is substantially the third distance from the third edge and substantially the fourth distance from the second edge, a first second-category data pad that is a fifth distance from the first edge and an sixth distance from the second edge, a second second-category data pad that is substantially the fifth distance from the first edge and substantially the sixth distance from the fourth edge, a third second-category data pad that is substantially the fifth distance from the third edge and substantially the sixth distance from the fourth edge, and a fourth second-category data pad that is substantially the fifth distance from the third edge and substantially the sixth distance from the second edge. In such embodiments, the first category of data pads may communicate a first category of signals and the second category of data pads may communicate a second category of signals.

In some embodiments, the first edge and the third edge may have a first length, and the second edge and the fourth edge have a second length. The first length may be longer than the second length.

In some embodiments, all of the first edge, the second edge, the third edge, and the fourth edge may have the same length.

Various embodiments include a method, the method may include orienting and stacking dies. Each of the dies may be substantially identical to each of the other dies. Alternatively, each of a first subset of the dies may exhibit mirror symmetry with respect to each of a second subset of the dies. The method may also include electrically coupling data pads of one of the dies with dummy data pads of another one of the dies.

Various embodiments include a method. The method may include orienting and stacking dies. Each of the dies may be substantially identical to each of the other dies. The method may include orienting and stacking the dies such that: a first substantially quarter of the dies are oriented in a first orientation, a second substantially quarter of the dies are oriented in a second orientation, the second orientation flipped substantially 180°, relative to the first orientation, about an axis in a respective plane of each of the respective dies, a third substantially quarter of the dies are oriented in a third orientation, the third orientation rotated substantially 180°, relative to the first orientation, about an axis normal to a plane of each of the respective dies, and a fourth substantially quarter of the dies are oriented in a fourth orientation, the fourth orientation flipped substantially 180°, relative to the first orientation, about an axis in a respective plane of each of the respective dies and rotated substantially 180°, relative to the first orientation, about an axis normal to the plane of each of the respective dies.

In such embodiments, orienting and stacking the dies may include orienting and stacking the dies into a stack such that: one of a top quarter, a top-middle quarter, a bottom-middle quarter, or a bottom quarter of the stack includes dies oriented in the first orientation, another one of the top quarter, the top-middle quarter, the bottom-middle quarter, or the bottom quarter of the stack includes dies oriented in the second orientation, yet another one of the top quarter, the top-middle quarter, the bottom-middle quarter, or the bottom quarter of the stack includes dies oriented in the third orientation, and still another one of the top quarter, the top-middle quarter, the bottom-middle quarter, or the bottom quarter of the stack includes dies oriented in the fourth orientation.

Various embodiments include a method. The method may include orienting and stacking dies. Each of a first subset of the dies may exhibit mirror symmetry with respect to each of a second subset of the dies. The method may include orienting and stacking the dies such that: a first substantially half of the first subset of the dies are oriented in a first orientation, a second substantially half of the first subset of the dies are oriented in a second orientation, the second orientation rotated substantially 180°, relative to the first orientation, about an axis normal to a plane of each of the respective dies, a first substantially half of the second subset of the dies are oriented in the first orientation, and a second substantially half of the second subset of the dies are oriented in the second orientation.

In such embodiments, orienting and stacking the dies may include orienting and stacking the dies into a stack such that: one of a top quarter, a top-middle quarter, a bottom-middle quarter, or a bottom quarter of the stack includes dies of the first subset oriented in the first orientation, another one of the top quarter, the top-middle quarter, the bottom-middle quarter, or the bottom quarter of the stack includes dies of the first subset oriented in the second orientation, yet another one of the top quarter, the top-middle quarter, the bottom-middle quarter, or the bottom quarter of the stack includes dies of the second subset oriented in the first orientation, and still another one of the top quarter, the top-middle quarter, the bottom-middle quarter, or the bottom quarter of the stack includes dies of the second subset oriented in the second orientation.

Various embodiments include a method. The method may include orienting and stacking dies. Each of the dies may be substantially identical to each of the other dies. The method may include orienting and stacking the dies such that: a first substantially quarter of the dies are oriented in a first orientation, a second substantially quarter of the dies are oriented in a second orientation, the second orientation being rotated substantially 90°, relative to the first orientation, about an axis normal to a plane of each of the respective dies, a third substantially quarter of the dies are oriented in a third orientation, the third orientation being rotated substantially 180°, relative to the first orientation, about an axis normal to a plane of each of the respective dies, and a fourth substantially quarter of the dies are oriented in a fourth orientation, the fourth orientation being rotated substantially 270°, relative to the first orientation, about an axis normal to a plane of each of the respective dies.

In such embodiments, orienting and stacking the dies may include orienting and stacking the dies into a stack such that: one of a top quarter, a top-middle quarter, a bottom-middle quarter, or a bottom quarter of the stack includes dies oriented in the first orientation, another one of the top quarter, the top-middle quarter, the bottom-middle quarter, or the bottom quarter of the stack includes dies oriented in the second orientation, yet another one of the top quarter, the top-middle quarter, the bottom-middle quarter, or the bottom quarter of the stack includes dies oriented in the third orientation, and still another one of the top quarter, the top-middle quarter, the bottom-middle quarter, or the bottom quarter of the stack includes dies oriented in the fourth orientation.

Various embodiments include an apparatus. The apparatus may include dies stacked into a stack, one above another. Each of the dies may be substantially identical to each of the other dies. Alternatively, each of a first subset of the dies may exhibits mirror symmetry with respect to each of a second subset of the dies. Each of the dies may include circuits, data pads variously electrically coupled to the circuits, and dummy data pads electrically isolated from the circuits.

Various embodiments include an apparatus. The apparatus may include dies stacked into a stack, one above another. Each of the dies may be substantially identical to each of the other dies. Each of the dies may include circuits, data pads variously electrically coupled to the circuits, and dummy data pads electrically isolated from the circuits. A first substantially quarter of the dies may be oriented in the stack in a first orientation. A second substantially quarter of the dies may be oriented in the stack in a second orientation, the second orientation flipped substantially 180°, relative to the first orientation, about an axis in a respective plane of each of the respective dies. A third substantially quarter of the dies may be oriented in the stack in a third orientation, the third orientation rotated substantially 180°, relative to the first orientation, about an axis normal to a plane of each of the respective dies. A fourth substantially quarter of the dies may be oriented in the stack in a fourth orientation, the fourth orientation flipped substantially 180°, relative to the first orientation, about an axis in a respective plane of each of the respective dies and rotated substantially 180°, relative to the first orientation, about an axis normal to the plane of each of the respective dies.

In such embodiments, one of a top quarter, a top-middle quarter, a bottom-middle quarter, or a bottom quarter of the stack may include dies oriented in the first orientation. Another one of the top quarter, the top-middle quarter, the bottom-middle quarter, or the bottom quarter of the stack may include dies oriented in the second orientation. Yet another one of the top quarter, the top-middle quarter, the bottom-middle quarter, or the bottom quarter of the stack may include dies oriented in the third orientation. Still another one of the top quarter, the top-middle quarter, the bottom-middle quarter, or the bottom quarter of the stack may include dies oriented in the fourth orientation.

Various embodiments include an apparatus. The apparatus may include dies stacked into a stack, one above another. Each of a first subset of the dies may exhibit mirror symmetry with respect to each of a second subset of the dies. Each of the dies may include circuits, data pads variously electrically coupled to the circuits, and dummy data pads electrically isolated from the circuits. A first substantially half of the first subset of the dies may be oriented in the stack in a first orientation. A second substantially half of the first subset of the dies may be oriented in the stack in a second orientation, the second orientation rotated substantially 180°, relative to the first orientation, about an axis normal to a plane of each of the respective dies. A first substantially half of the second subset of the dies may be oriented in the stack in the first orientation. A second substantially half of the second subset of the dies may be oriented in the stack in the second orientation.

In such embodiments, one of a top quarter, a top-middle quarter, a bottom-middle quarter, or a bottom quarter of the stack may include dies of the first subset oriented in the first orientation. Another one of the top quarter, the top-middle quarter, the bottom-middle quarter, or the bottom quarter of the stack may include dies of the first subset oriented in the second orientation. Yet another one of the top quarter, the top-middle quarter, the bottom-middle quarter, or the bottom quarter of the stack may include dies of the second subset oriented in the first orientation. Still another one of the top quarter, the top-middle quarter, the bottom-middle quarter, or the bottom quarter of the stack may include dies of the second subset oriented in the second orientation.

Various embodiments include an apparatus. The apparatus may include dies stacked into a stack, one above another. Each of the dies may be substantially identical to each of the other dies. Each of the dies may include circuits, data pads variously electrically coupled to the circuits, and dummy data pads electrically isolated from the circuits. A first substantially quarter of the dies may be oriented in the stack in a first orientation. A second substantially quarter of the dies may be oriented in the stack in a second orientation, the second orientation being rotated substantially 90°, relative to the first orientation, about an axis normal to a plane of each of the respective dies. A third substantially quarter of the dies may be oriented in the stack in a third orientation, the third orientation being rotated substantially 180°, relative to the first orientation, about an axis normal to a plane of each of the respective dies. A fourth substantially quarter of the dies may be oriented in the stack in a fourth orientation, the fourth orientation being rotated substantially 270°, relative to the first orientation, about an axis normal to a plane of each of the respective dies.

In such embodiments, one of a top quarter, a top-middle quarter, a bottom-middle quarter, or a bottom quarter of the stack may include dies oriented in the first orientation. Another one of the top quarter, the top-middle quarter, the bottom-middle quarter, or the bottom quarter of the stack may include dies oriented in the second orientation. Yet another one of the top quarter, the top-middle quarter, the bottom-middle quarter, or the bottom quarter of the stack may include dies oriented in the third orientation. Still another one of the top quarter, the top-middle quarter, the bottom-middle quarter, or the bottom quarter of the stack may include dies oriented in the fourth orientation.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc.," or "one or more of A, B, and C, etc.," is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first,""second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. An apparatus comprising:
circuits;
a first edge;
a second edge perpendicular to the first edge;
a third edge opposite the first edge;
a fourth edge opposite the second edge;
data pads variously electrically coupled to the circuits, the data pads comprising:
  a data pad positioned a first distance from the first edge and a second distance from the second edge; and
dummy data pads electrically isolated from the circuits, the dummy data pads comprising:
  a first dummy data pad positioned substantially the first distance from the first edge and substantially the second distance from the fourth edge;
  a second dummy data pad positioned substantially the first distance from the third edge and substantially the second distance from the fourth edge; and
  a third dummy data pad positioned substantially the first distance from the third edge and substantially the second distance from the second edge.

2. The apparatus of claim 1, wherein the data pads further comprise a second data pad positioned a third distance from the first edge and a fourth distance from the second edge; and wherein the dummy data pads further comprise:
  a fourth dummy data pad positioned substantially the third distance from the first edge and substantially the fourth distance from the fourth edge;
  a fifth dummy data pad positioned substantially the third distance from the third edge and substantially the fourth distance from the fourth edge; and
  a sixth dummy data pad positioned substantially the third distance from the third edge and substantially the fourth distance from the second edge.

3. The apparatus of claim 1, wherein the apparatus comprises a center line between the first edge and the third edge;
wherein the data pads further comprise a second data pad positioned a third distance from the center line, on a first-edge side of the center line, and a fourth distance from the second edge; and
wherein the dummy data pads further comprise:
  a fourth dummy data pad positioned substantially the third distance from the center line, on the first-edge side of the center line, and substantially the fourth distance from the fourth edge;
  a fifth dummy data pad positioned substantially the third distance from the center line, on a third-edge side of the center line, and substantially the fourth distance from the fourth edge; and
  a sixth dummy data pad positioned substantially the third distance from the center line, on the third-edge side of the center line, and substantially the fourth distance from the second edge.

4. The apparatus of claim 1, wherein the apparatus comprises a first center line between the first edge and the third edge, and a second center line between the second edge and the fourth edge;
wherein the data pads further comprise a second data pad positioned a third distance from the first center line, on a first-edge side of the first center line, and a fourth distance from the second center line, on a second-edge side of the second center line; and
wherein the dummy data pads further comprise:
  a fourth dummy data pad positioned substantially the third distance from the first center line, on the first-edge side of the first center line, and substantially the fourth distance from the second center line, on a fourth-edge side of the second center line;
  a fifth dummy data pad positioned substantially the third distance from the first center line, on a third-edge side of the first center line, and substantially the fourth distance from the second center line, on the fourth-edge side of the second center line; and
  a sixth dummy data pad positioned substantially the third distance from the first center line, on the third-edge side of the first center line, and substantially the fourth distance from the second center line, on the second-edge side of the second center line.

5. The apparatus of claim 1, wherein the data pads comprise a first category of data pads and a second category of data pads, the data pads comprising:
  a first first-category data pad that is a third distance from the first edge and a fourth distance from the second edge;
  a second first-category data pad that is substantially the third distance from the first edge and substantially the fourth distance from the fourth edge;
  a third first-category data pad that is substantially the third distance from the third edge and substantially the fourth distance from the fourth edge;

a fourth first-category data pad that is substantially the third distance from the third edge and substantially the fourth distance from the second edge;

a first second-category data pad that is a fifth distance from the first edge and a sixth distance from the second edge;

a second second-category data pad that is substantially the fifth distance from the first edge and substantially the sixth distance from the fourth edge;

a third second-category data pad that is substantially the fifth distance from the third edge and substantially the sixth distance from the fourth edge; and a fourth second-category data pad that is substantially the fifth distance from the third edge and substantially the sixth distance from the second edge.

6. The apparatus of claim 5, wherein the first category of data pads are to communicate a first category of signals and the second category of data pads are to communicate a second category of signals.

7. The apparatus of claim 1, wherein the first edge and the third edge have a first length, wherein the second edge and the fourth edge have a second length, and wherein the first length is longer than the second length.

8. The apparatus of claim 1, wherein all of the first edge, the second edge, the third edge, and the fourth edge have the same length.

9. An apparatus comprising:

dies stacked into a stack, one above another, each of the dies substantially identical to each of the other dies, or each of a first subset of the dies exhibits mirror symmetry with respect to each of a second subset of the dies, each of the dies comprising:

circuits;

data pads variously electrically coupled to the circuits; and dummy data pads electrically isolated from the circuits;

wherein the dies are oriented in the stack such that a data pad of the data pads of a first die of the dies is vertically aligned with a dummy data pad of the dummy data pads of a second die of the dies, and wherein the data pad and the dummy data pad are connected by an inter-die connection therebetween.

10. The apparatus of claim 9, wherein each of the dies is substantially identical to each of the other dies;

wherein a first substantially quarter of the dies are oriented in the stack in a first orientation;

wherein a second substantially quarter of the dies are oriented in the stack in a second orientation, the second orientation flipped substantially 180°, relative to the first orientation, about an axis in a respective plane of each of the respective dies;

wherein a third substantially quarter of the dies are oriented in the stack in a third orientation, the third orientation rotated substantially 180°, relative to the first orientation, about an axis normal to a plane of each of the respective dies; and wherein a fourth substantially quarter of the dies are oriented in the stack in a fourth orientation, the fourth orientation flipped substantially 180°, relative to the first orientation, about an axis in a respective plane of each of the respective dies and rotated substantially 180°, relative to the first orientation, about an axis normal to the plane of each of the respective dies.

11. The apparatus of claim 10, wherein one of a top quarter, a top-middle quarter, a bottom-middle quarter, or a bottom quarter of the stack comprises dies oriented in the first orientation;

wherein another one of the top quarter, the top-middle quarter, the bottom-middle quarter, or the bottom quarter of the stack comprises dies oriented in the second orientation;

wherein yet another one of the top quarter, the top-middle quarter, the bottom-middle quarter, or the bottom quarter of the stack comprises dies oriented in the third orientation; and wherein still another one of the top quarter, the top-middle quarter, the bottom-middle quarter, or the bottom quarter of the stack comprises dies oriented in the fourth orientation.

12. The apparatus of claim 9, wherein each of a first subset of the dies exhibits mirror symmetry with respect to each of a second subset of the dies;

wherein a first substantially half of the first subset of the dies are oriented in the stack in a first orientation;

wherein a second substantially half of the first subset of the dies are oriented in the stack in a second orientation, the second orientation rotated substantially 180°, relative to the first orientation, about an axis normal to a plane of each of the respective dies;

wherein a first substantially half of the second subset of the dies are oriented in the stack in the first orientation; and wherein a second substantially half of the second subset of the dies are oriented in the stack in the second orientation.

13. The apparatus of claim 12, wherein one of a top quarter, a top-middle quarter, a bottom-middle quarter, or a bottom quarter of the stack comprises dies of the first subset oriented in the first orientation;

wherein another one of the top quarter, the top-middle quarter, the bottom-middle quarter, or the bottom quarter of the stack comprises dies of the first subset oriented in the second orientation;

wherein yet another one of the top quarter, the top-middle quarter, the bottom-middle quarter, or the bottom quarter of the stack comprises dies of the second subset oriented in the first orientation; and wherein still another one of the top quarter, the top-middle quarter, the bottom-middle quarter, or the bottom quarter of the stack comprises dies of the second subset oriented in the second orientation.

14. The apparatus of claim 9, wherein each of the dies are substantially identical to each of the other dies;

wherein a first substantially quarter of the dies are oriented in the stack in a first orientation;

wherein a second substantially quarter of the dies are oriented in the stack in a second orientation, the second orientation being rotated substantially 90°, relative to the first orientation, about an axis normal to a plane of each of the respective dies;

wherein a third substantially quarter of the dies are oriented in the stack in a third orientation, the third orientation being rotated substantially 180°, relative to the first orientation, about an axis normal to a plane of each of the respective dies; and wherein a fourth substantially quarter of the dies are oriented in the stack in a fourth orientation, the fourth orientation being rotated substantially 270°, relative to the first orientation, about an axis normal to a plane of each of the respective dies.

15. The apparatus of claim 14, wherein one of a top quarter, a top-middle quarter, a bottom-middle quarter, or a bottom quarter of the stack comprises dies oriented in the first orientation;

wherein another one of the top quarter, the top-middle
quarter, the bottom-middle quarter, or the bottom quar-
ter of the stack comprises dies oriented in the second
orientation;

wherein yet another one of the top quarter, the top-middle
quarter, the bottom-middle quarter, or the bottom quar-
ter of the stack comprises dies oriented in the third
orientation; and wherein still another one of the top quarter, the top-middle
quarter, the bottom-middle quarter, or the bottom quar-
ter of the stack comprises dies oriented in the fourth
orientation.

* * * * *